(12) United States Patent
Andringa et al.

(10) Patent No.: US 6,745,155 B1
(45) Date of Patent: Jun. 1, 2004

(54) METHODS AND APPARATUSES FOR SIGNAL ANALYSIS

(75) Inventors: Tjeerd Catharinus Andringa, Groningen (NL); Hendrikus Duifhuis, Paterswolde (NL); Pieter Willem J. van Hengel, Groningen (NL); Michael Gerardus Heemskerk, Groningen (NL); Maartje Marjolein Nillesen, Groningen (NL)

(73) Assignee: Huq Speech Technologies B.V., Groningen (NL)

( * ) Notice: Subject to any disclaimer, the term of this patent is extended or adjusted under 35 U.S.C. 154(b) by 89 days.

(21) Appl. No.: 10/129,460

(22) PCT Filed: Nov. 6, 2000

(86) PCT No.: PCT/NL00/00808

§ 371 (c)(1),
(2), (4) Date: Aug. 9, 2002

(87) PCT Pub. No.: WO01/33547

PCT Pub. Date: May 10, 2001

(30) Foreign Application Priority Data

Nov. 5, 1999 (NL) .............................................. 1013500

(51) Int. Cl.$^7$ .............................................. G10L 11/04

(52) U.S. Cl. .......................................... 702/189; 381/58

(58) Field of Search ............................. 702/189, 33, 39, 702/46, 48, 54, 56, 75, 76, 79, 103, 190, 191, 193, 194, 195; 381/58, 56, 60, 61, 71.1, 71.2, 71.12, 150; 600/25; 73/584, 589, 603, 645, 659; 704/200, 205, 211, 233, 243, 263

(56) References Cited

U.S. PATENT DOCUMENTS

| | | | | |
|---|---|---|---|---|
| 4,441,202 A | * | 4/1984 | Tong et al. ................. 381/326 |
| 4,515,158 A | * | 5/1985 | Patrick et al. ................ 607/57 |
| 5,473,759 A | * | 12/1995 | Slaney et al. ............... 704/266 |
| 5,856,722 A | * | 1/1999 | Haronian et al. ........... 310/321 |
| 5,879,283 A | * | 3/1999 | Adams et al. ................ 600/25 |
| 6,072,885 A | * | 6/2000 | Stockham et al. .......... 381/321 |
| 6,092,422 A | * | 7/2000 | Binnig et al. ................. 73/651 |
| 6,501,399 B1 | * | 12/2002 | Byrd .......................... 341/111 |
| 6,651,041 B1 | * | 11/2003 | Juric .......................... 704/228 |

* cited by examiner

Primary Examiner—John Barlow
Assistant Examiner—Edward Raymond
(74) Attorney, Agent, or Firm—Michaelson & Associates; Peter L. Michaelson

(57) ABSTRACT

A basilar membrane model is used to receive an input signal including a target signal in step I. With successive further steps the target signal is filtered from the input signal. After the filtering the target signal can be used as an input for further processing, like for example signal recognition of data compression. The target signal can also be applied to a substantially reverse method to be obtain an improved or clean signal.

48 Claims, 38 Drawing Sheets

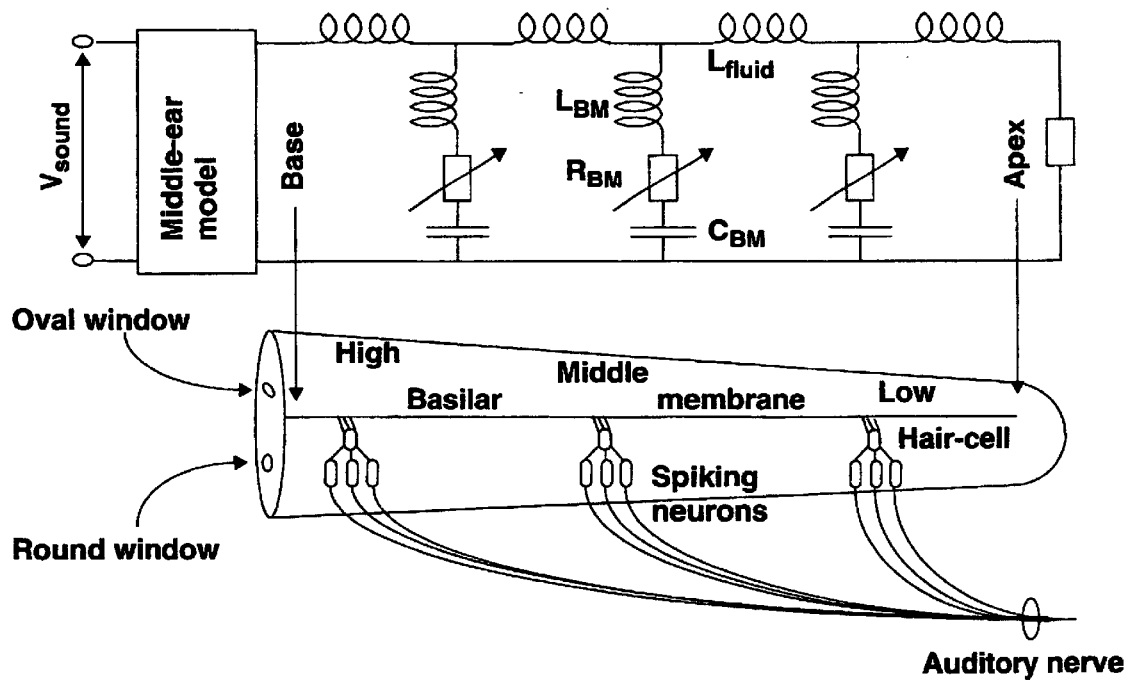
Fig. 1.1

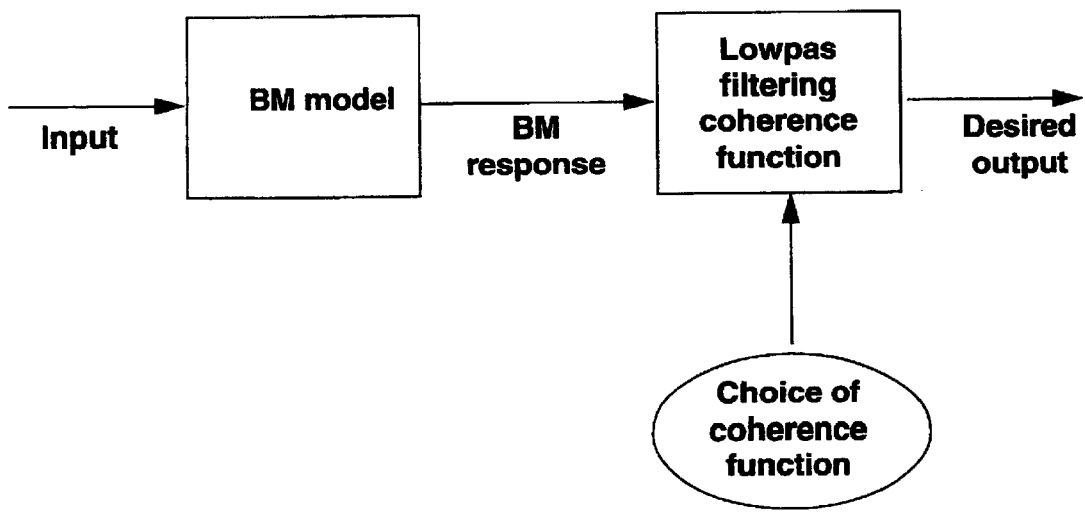
Fig. 1.2

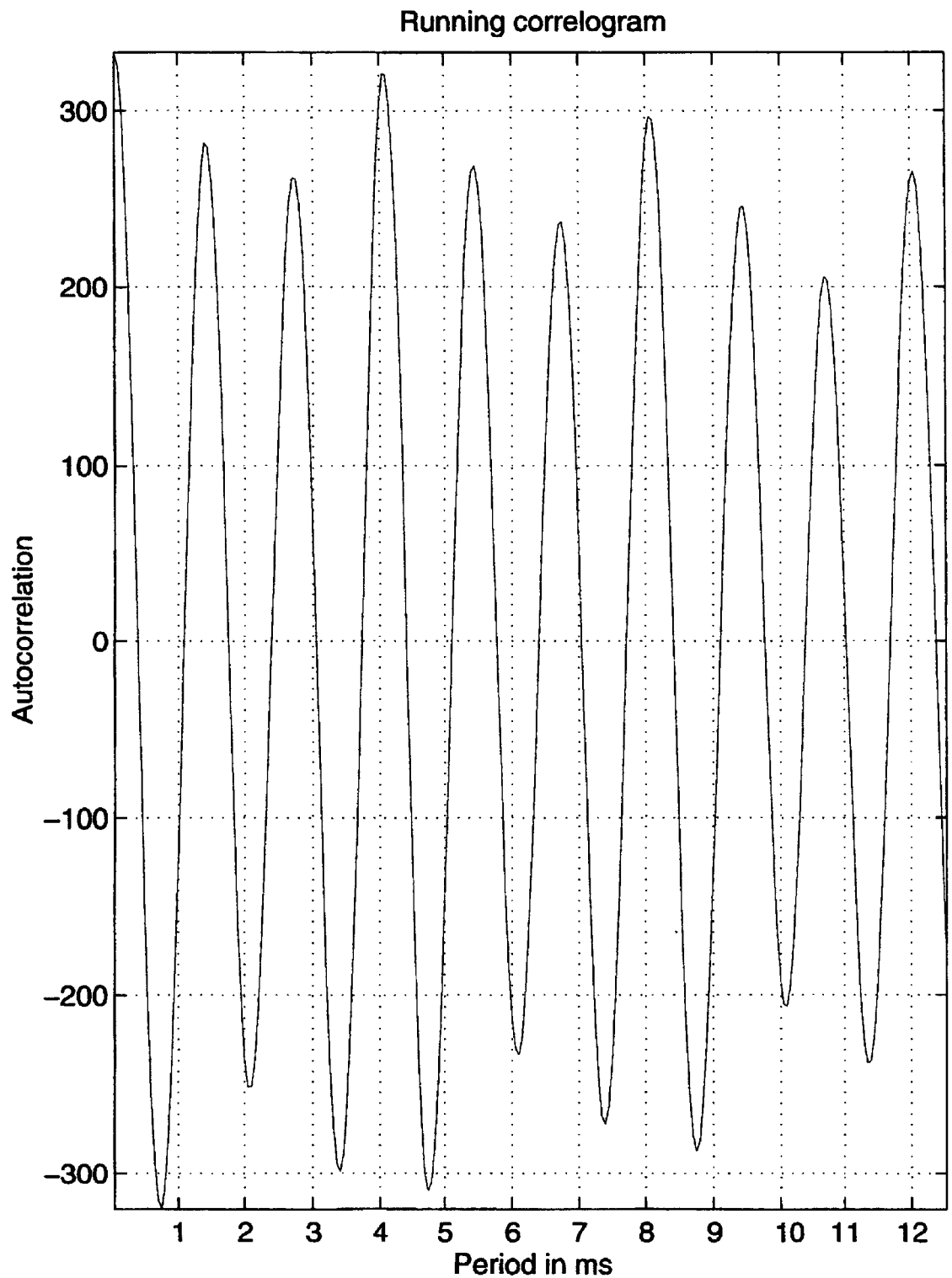
Fig. 1.3

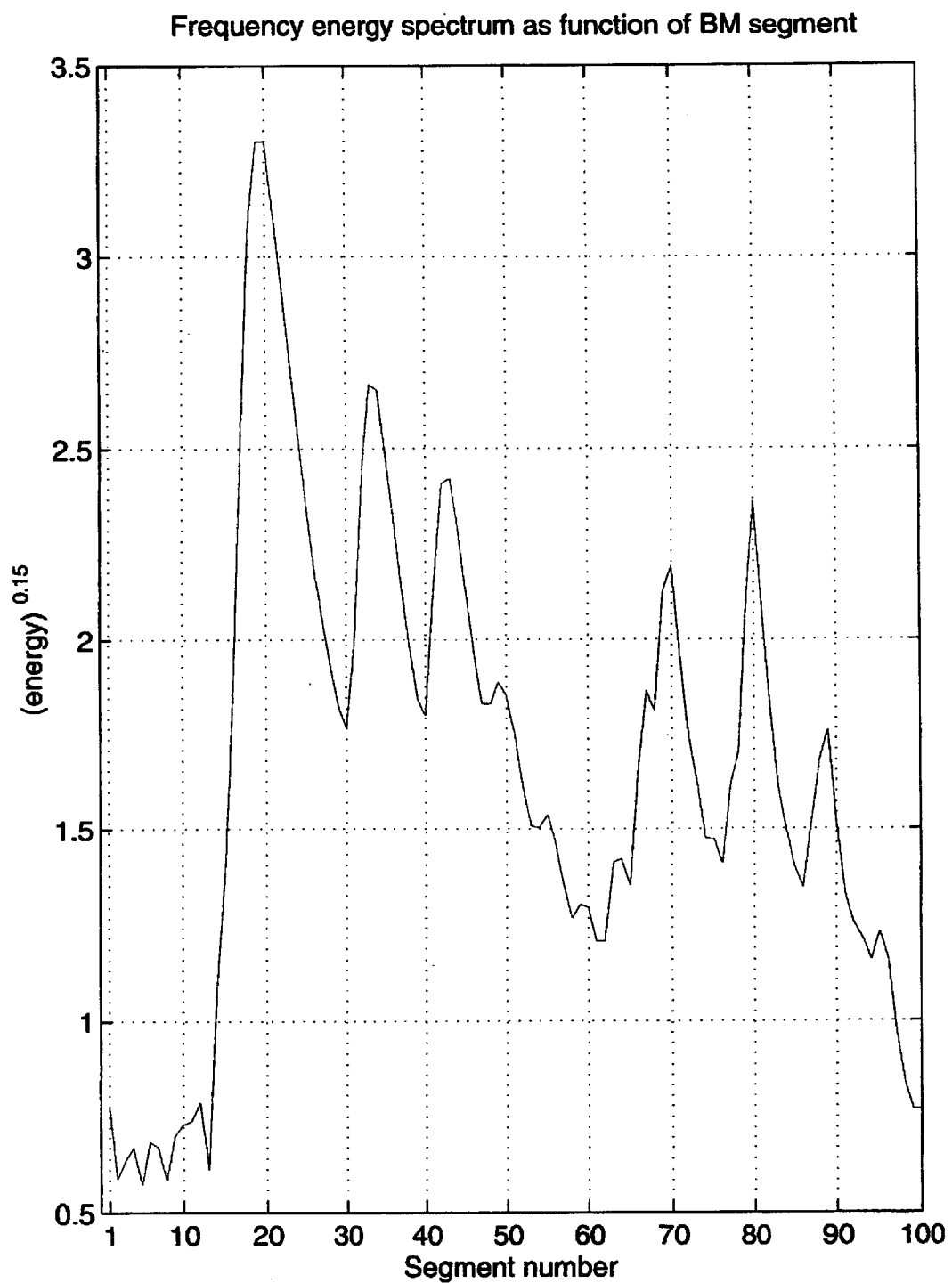
Fig. 1.4

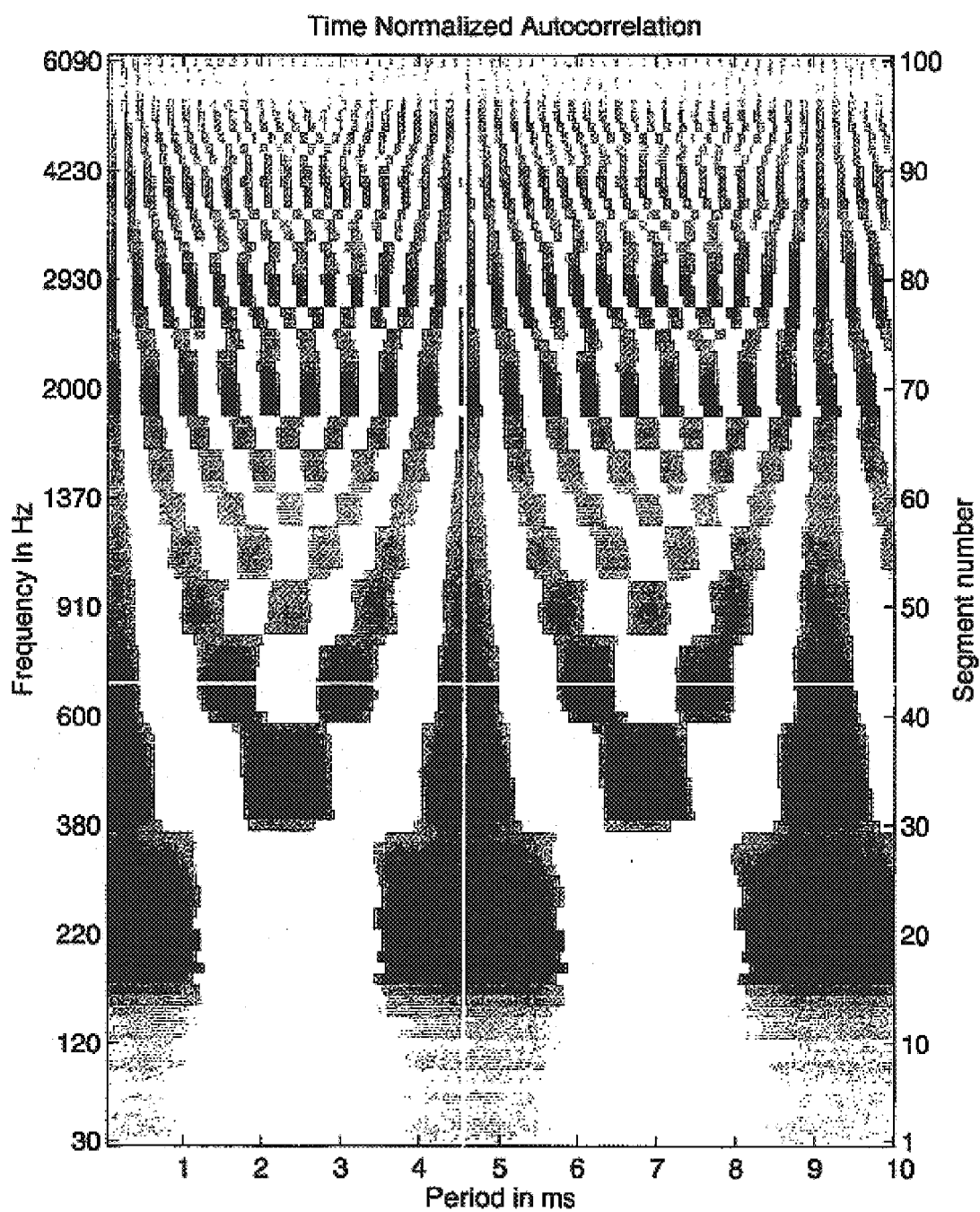
Fig. 1.5

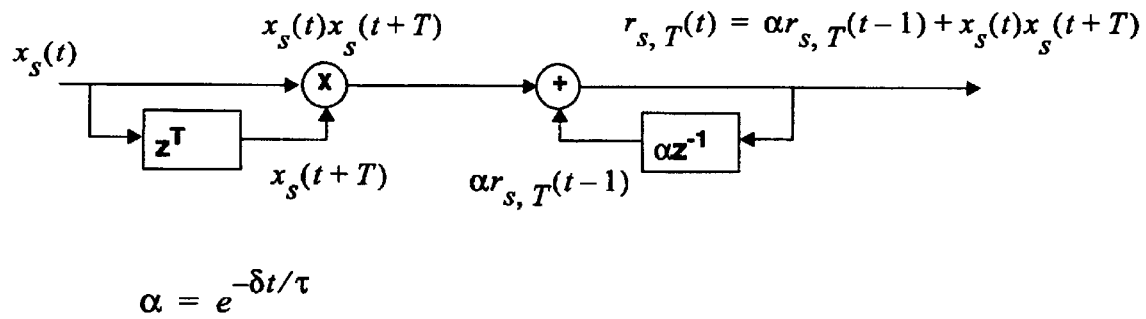
Fig. 1.6

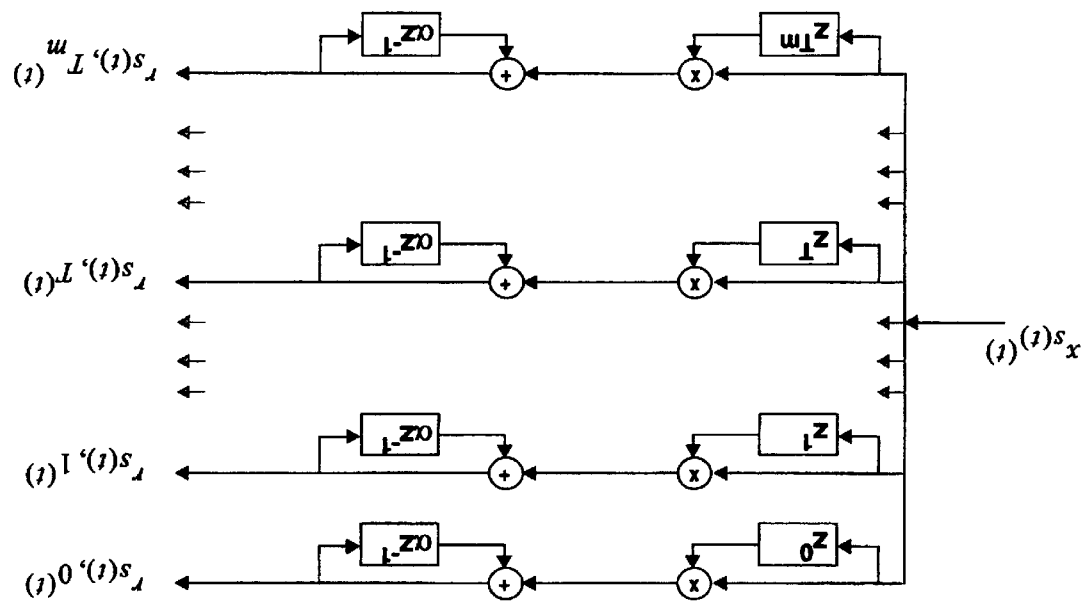
Fig. 1.7

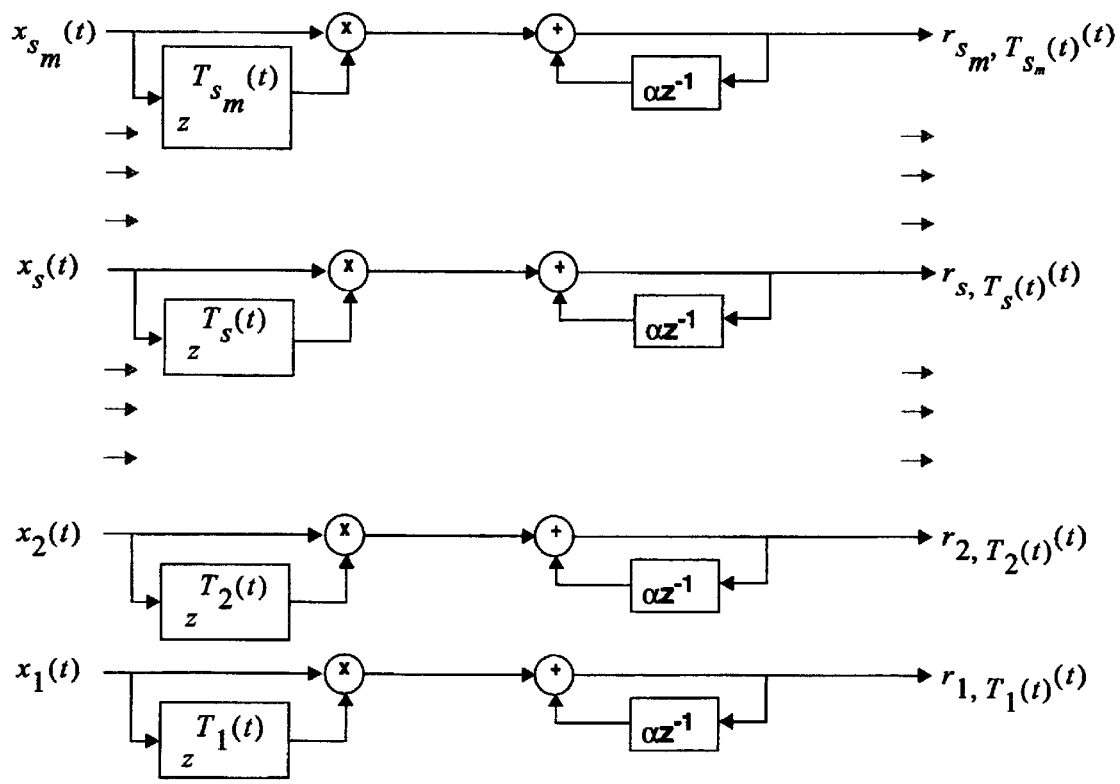
Fig. 1.8

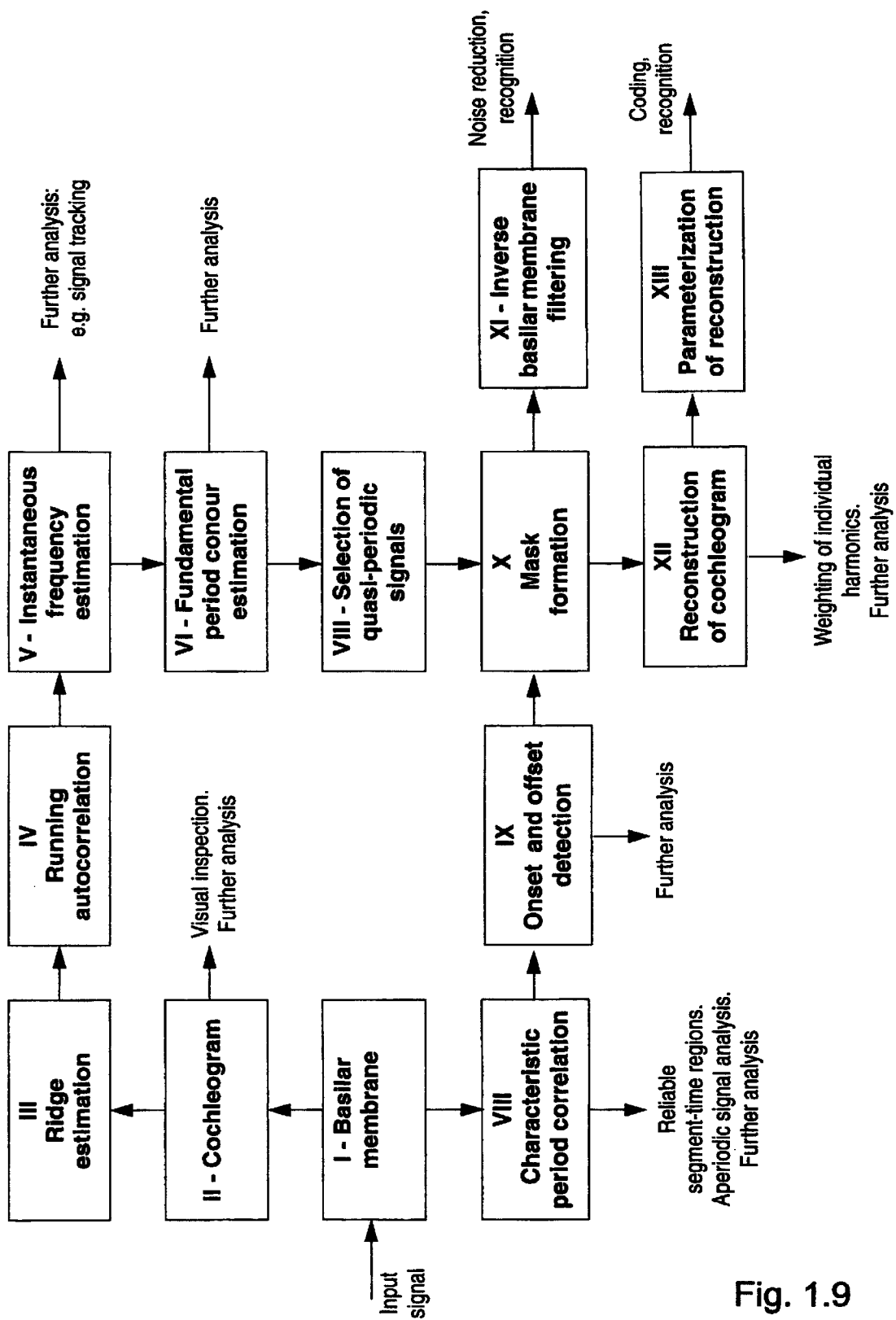
Fig. 1.9

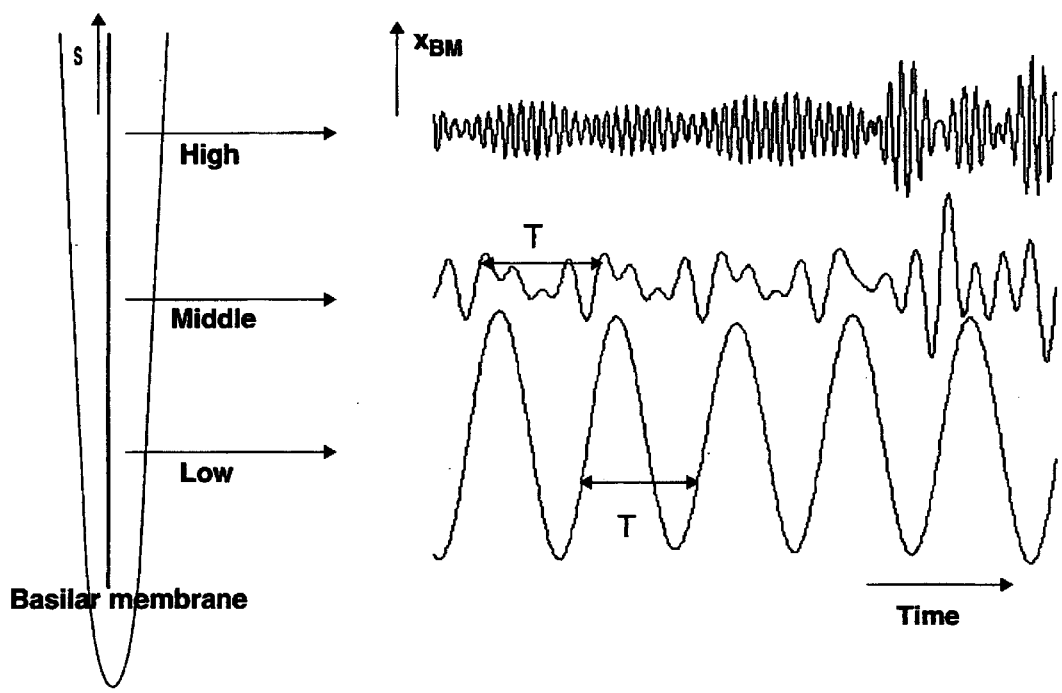
Fig. 2.1

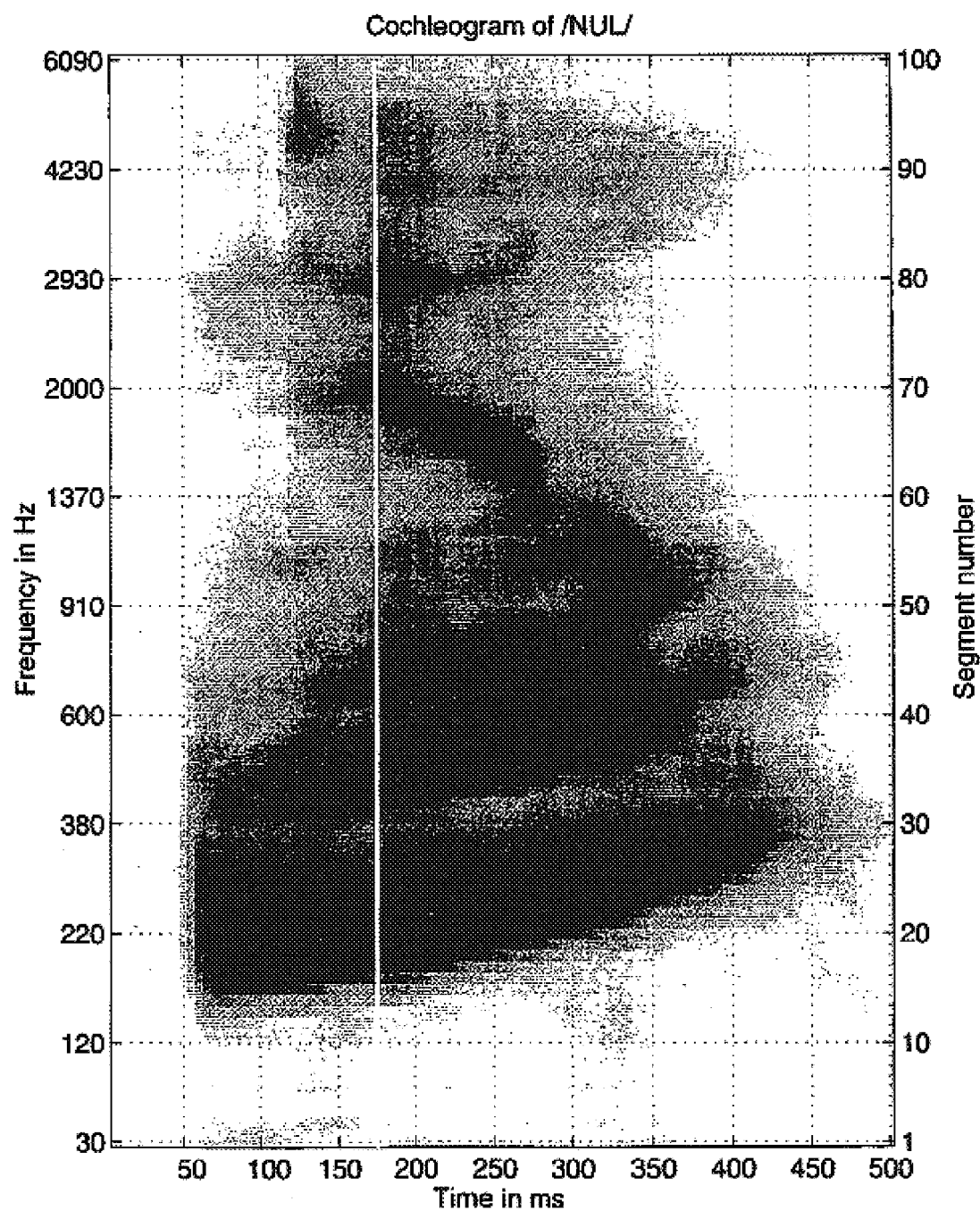
Fig. 2.2

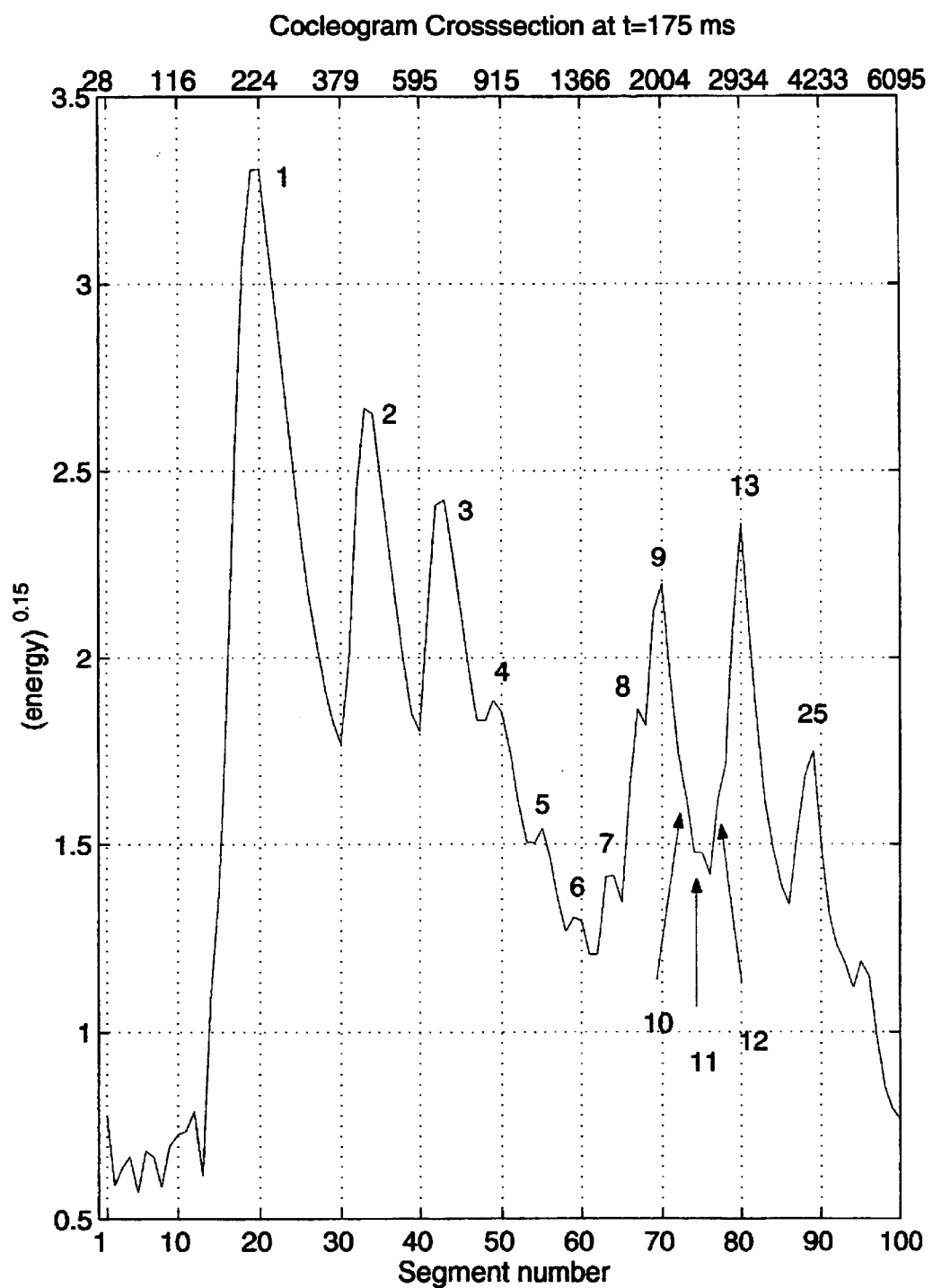
Fig. 2.3

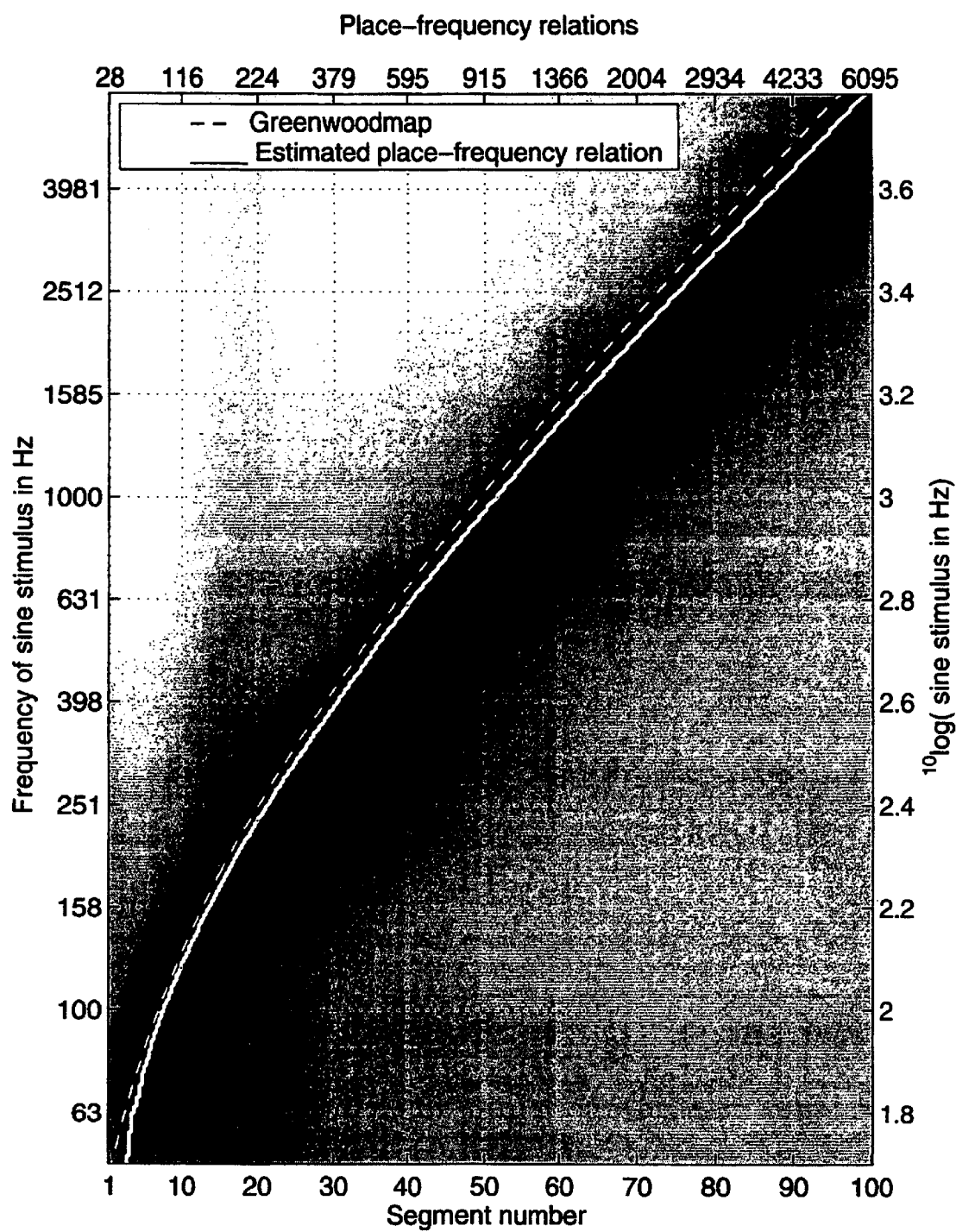
Fig. 2.4

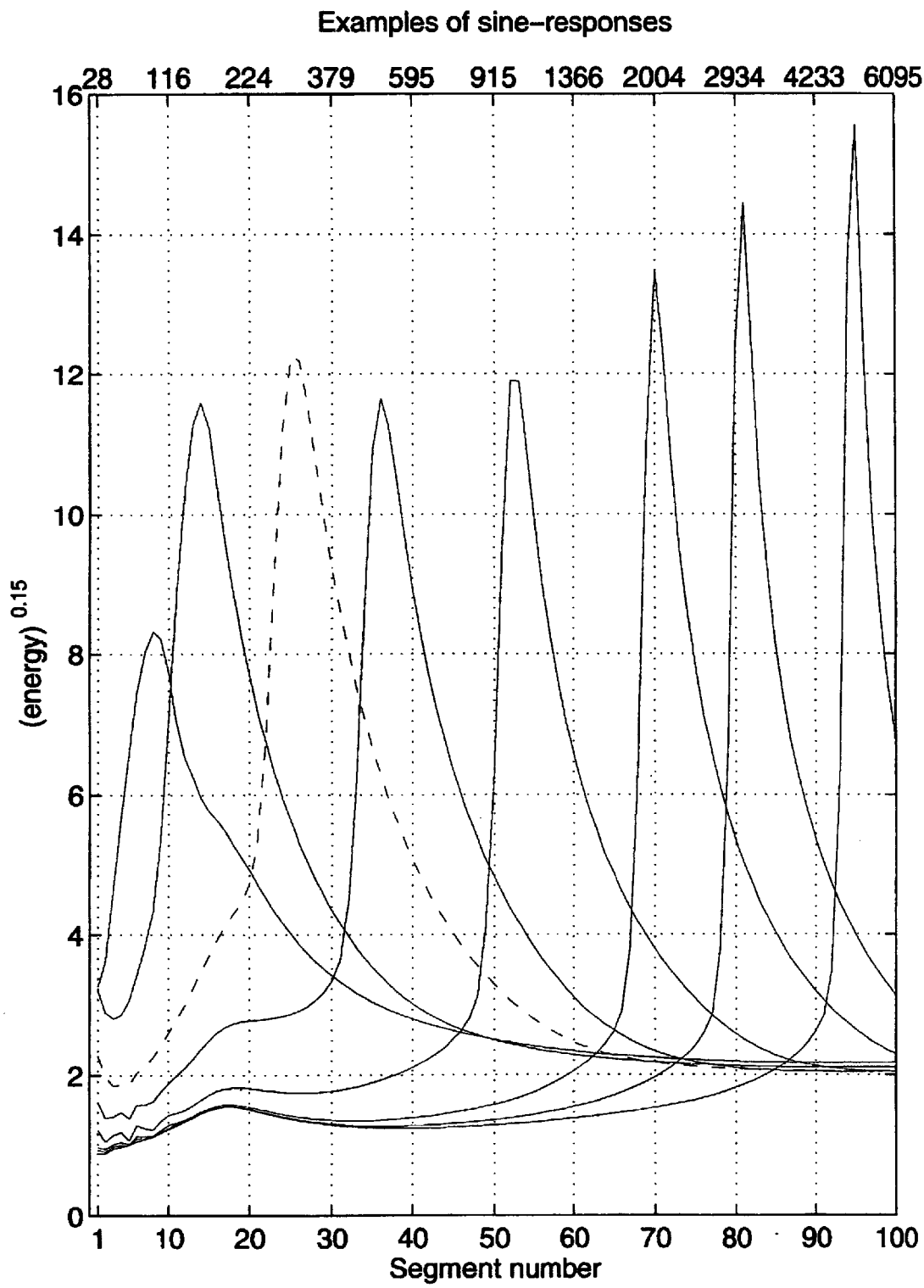
Fig. 2.5

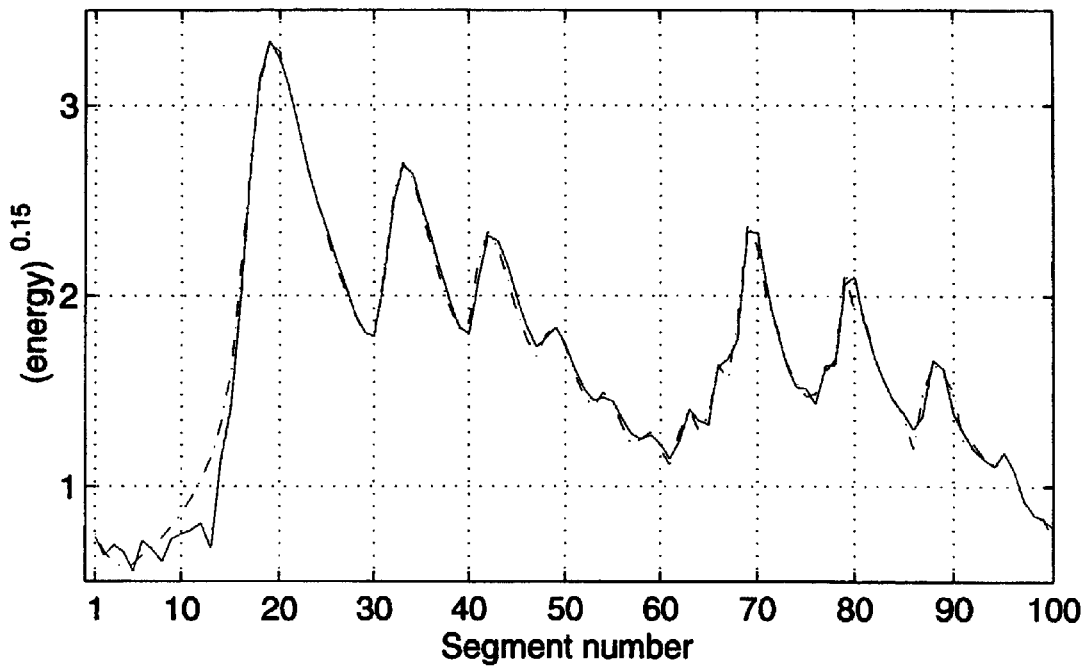
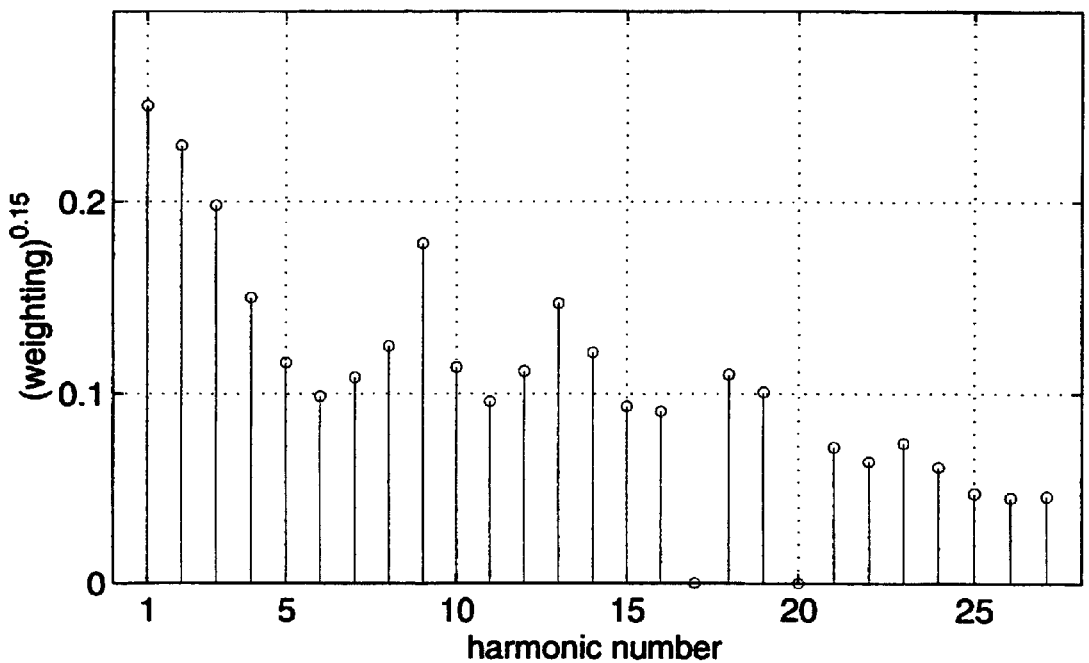
Fig. 2.6

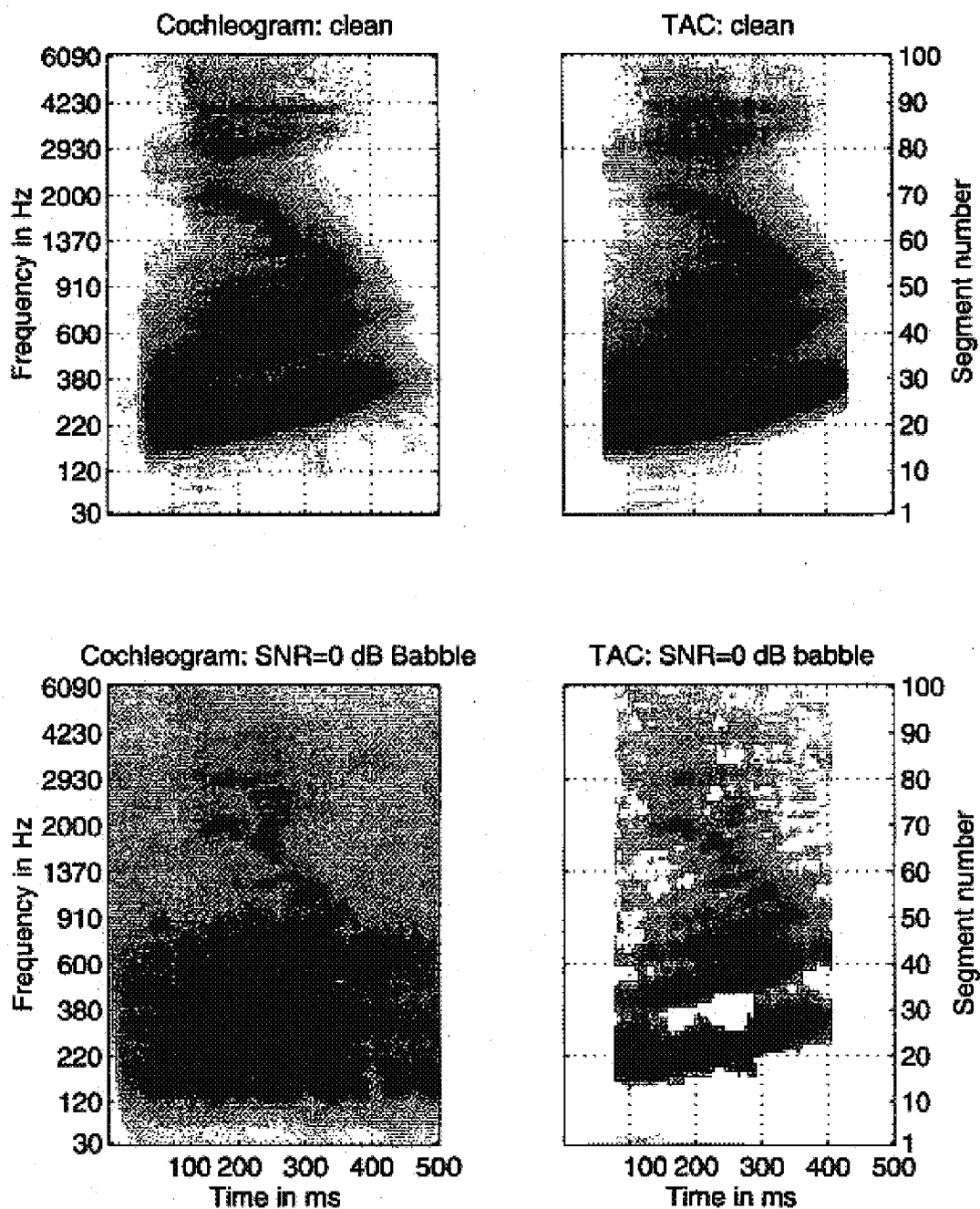
Fig. 2.7

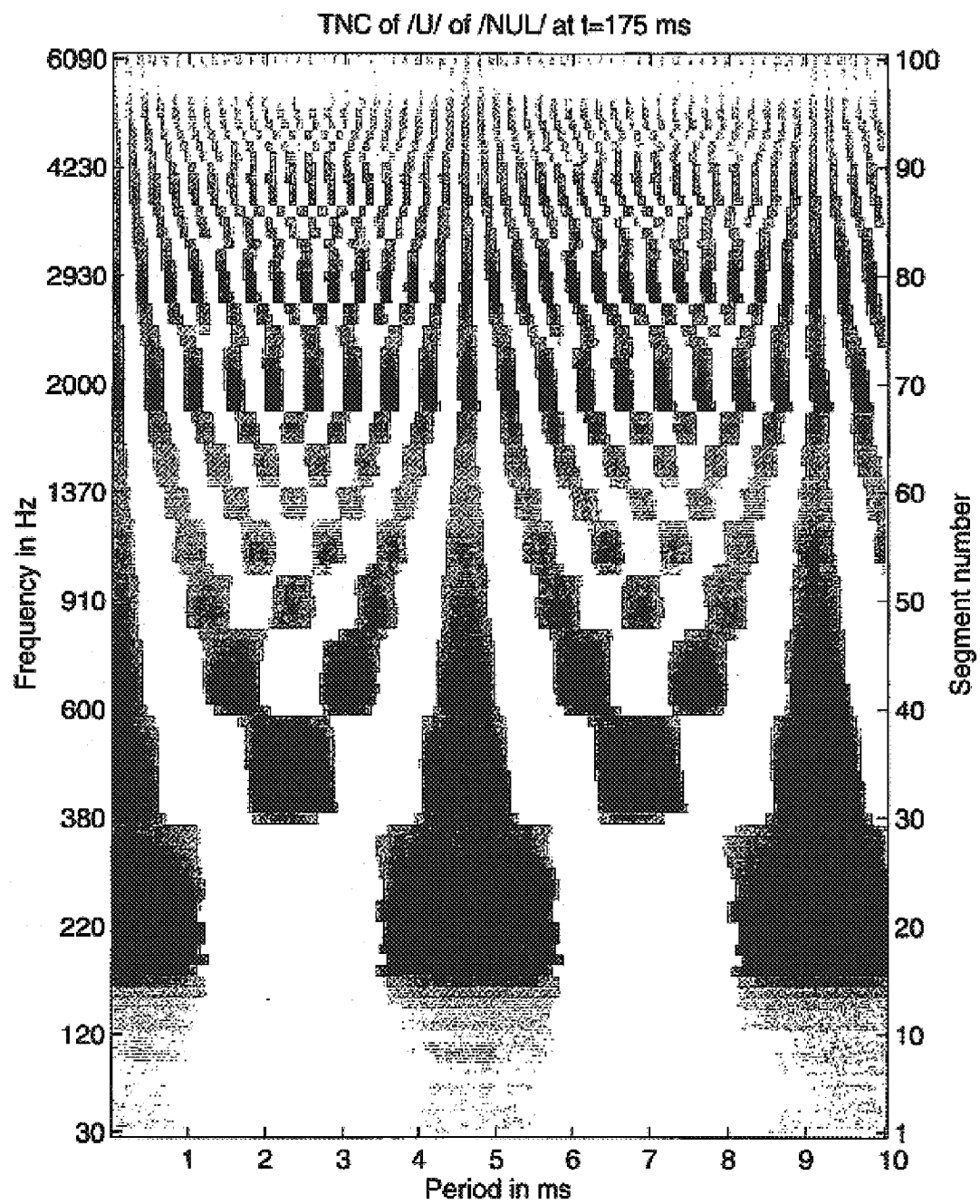
Fig. 2.8

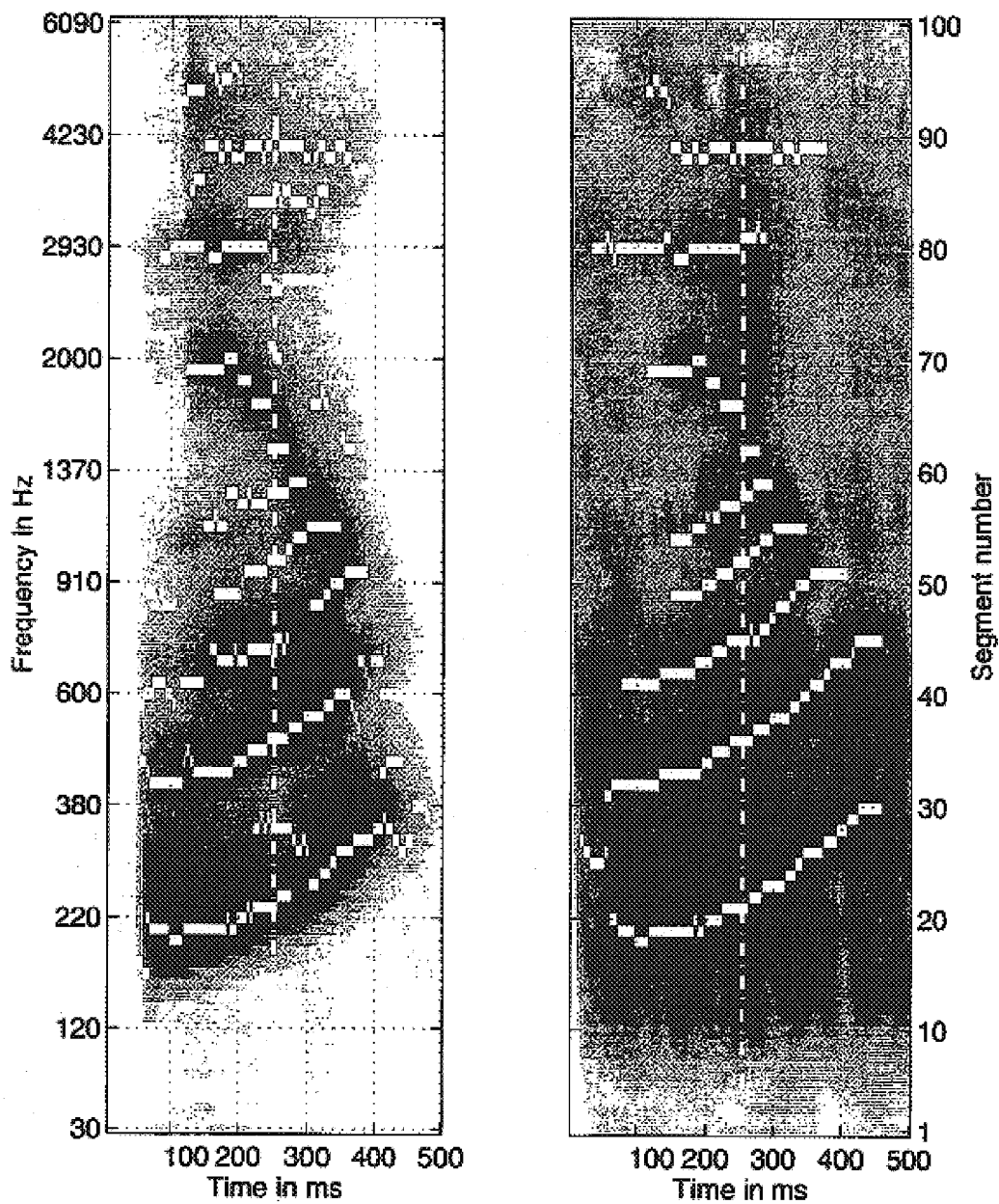
Fig. 2.9

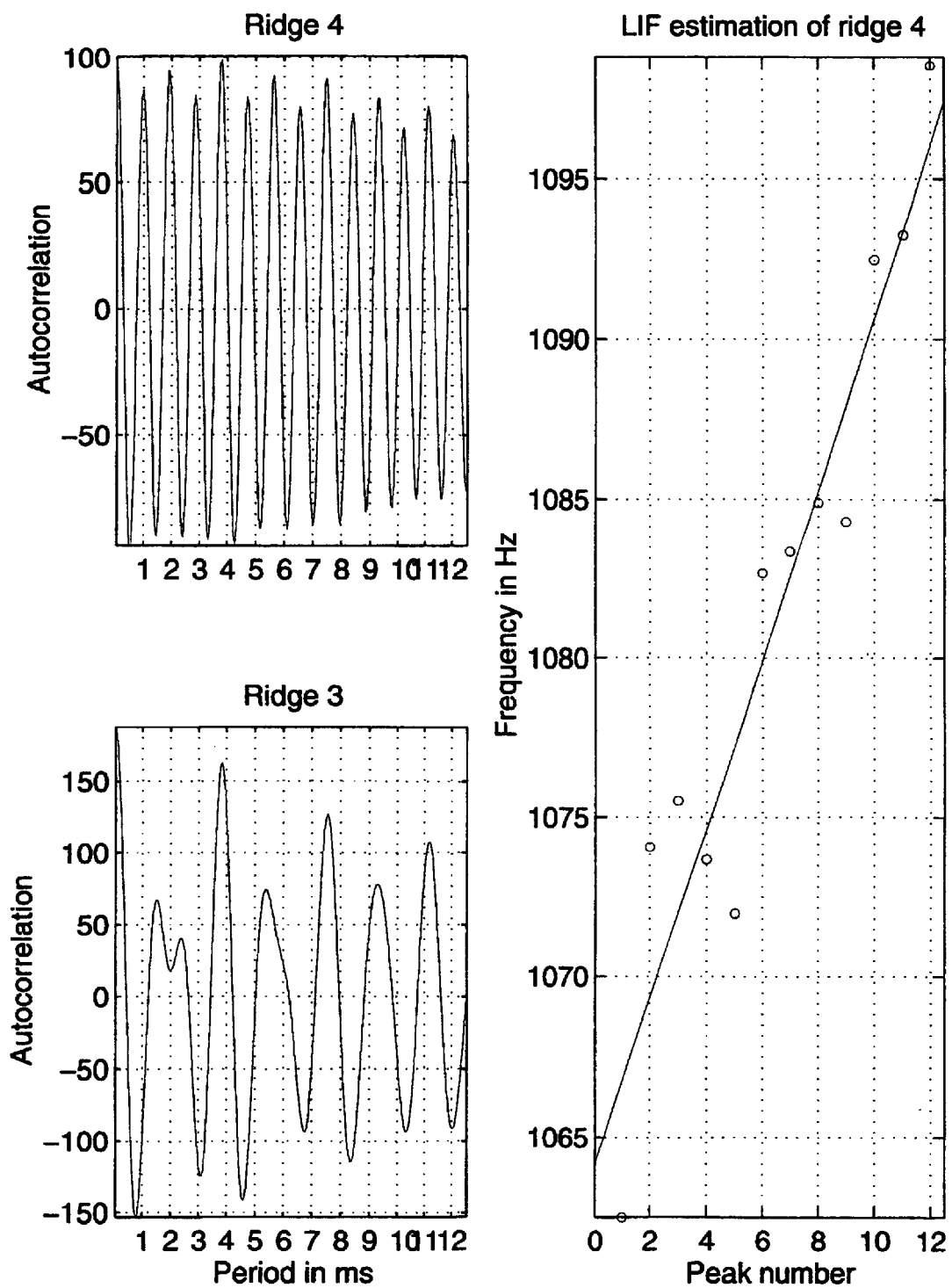
Fig. 2.10

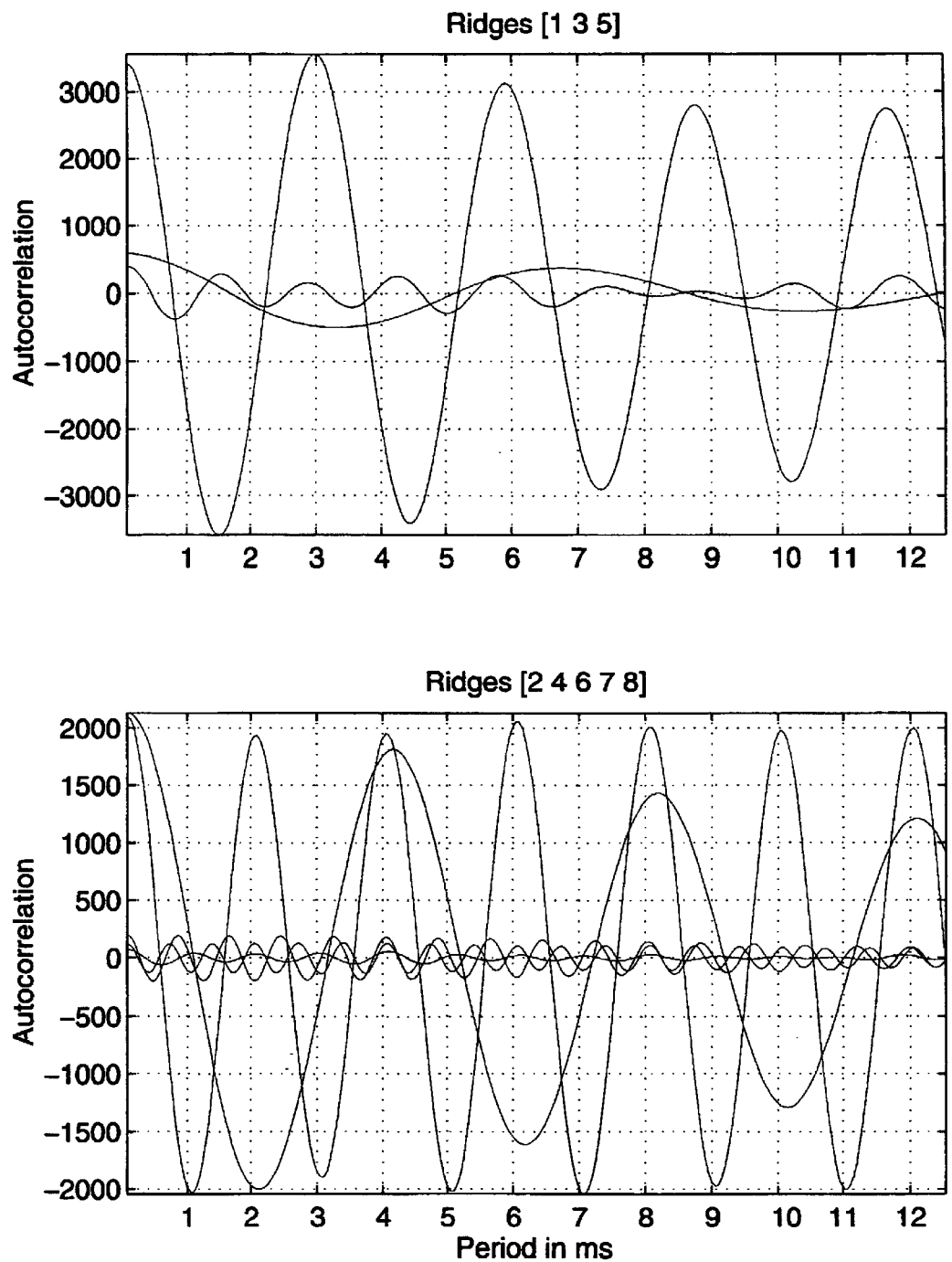
Fig. 2.11

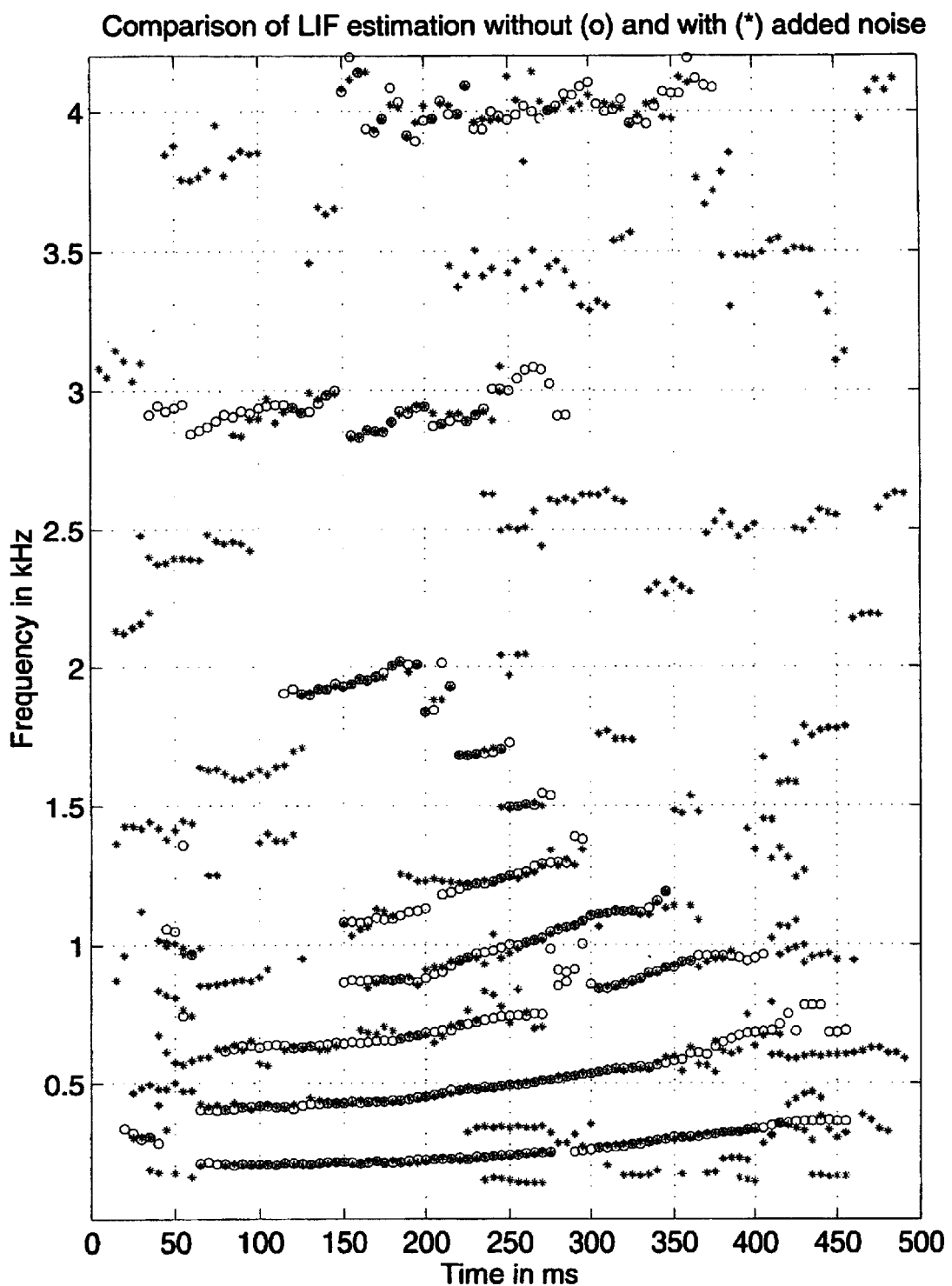
Fig. 2.12

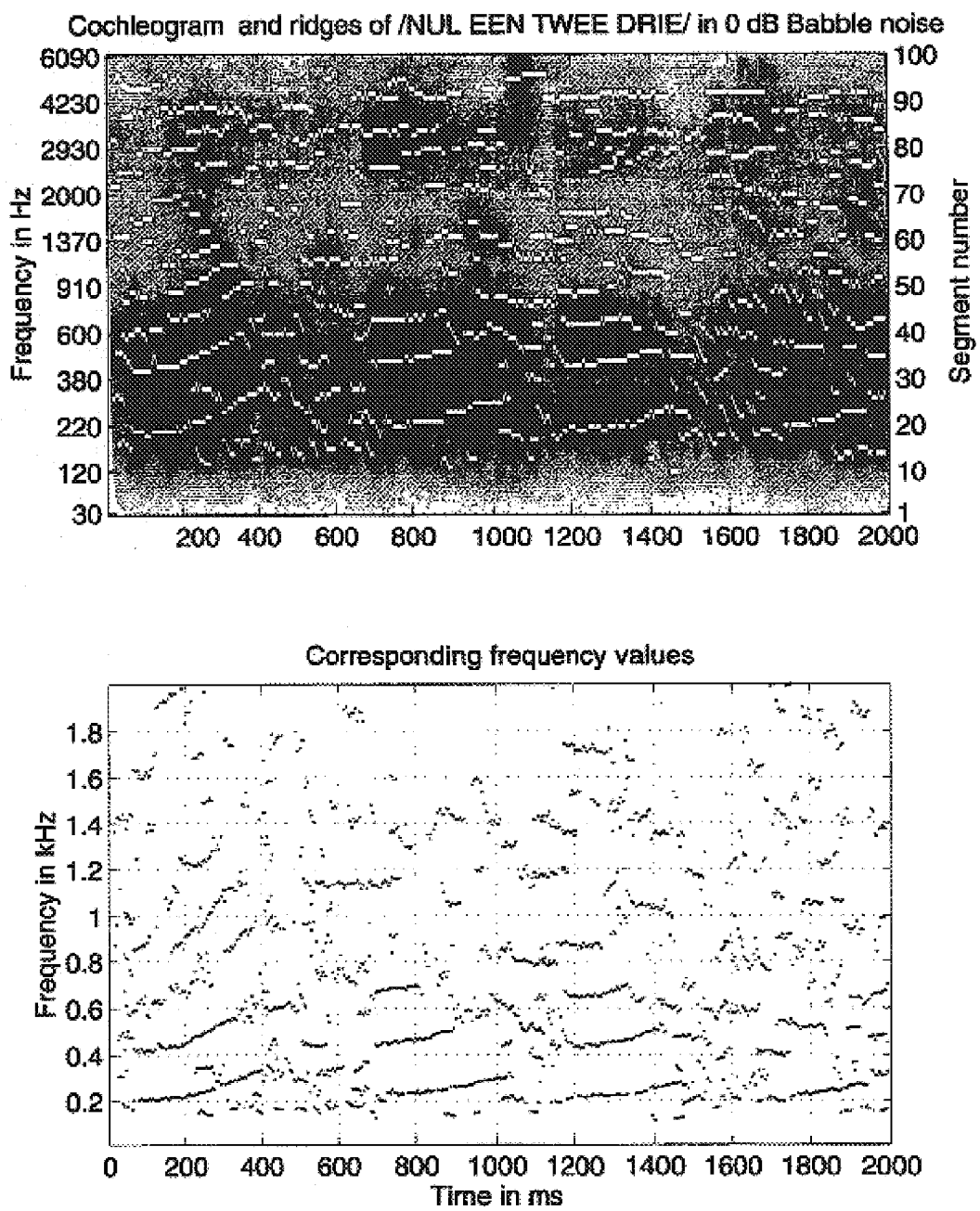
Fig. 2.13

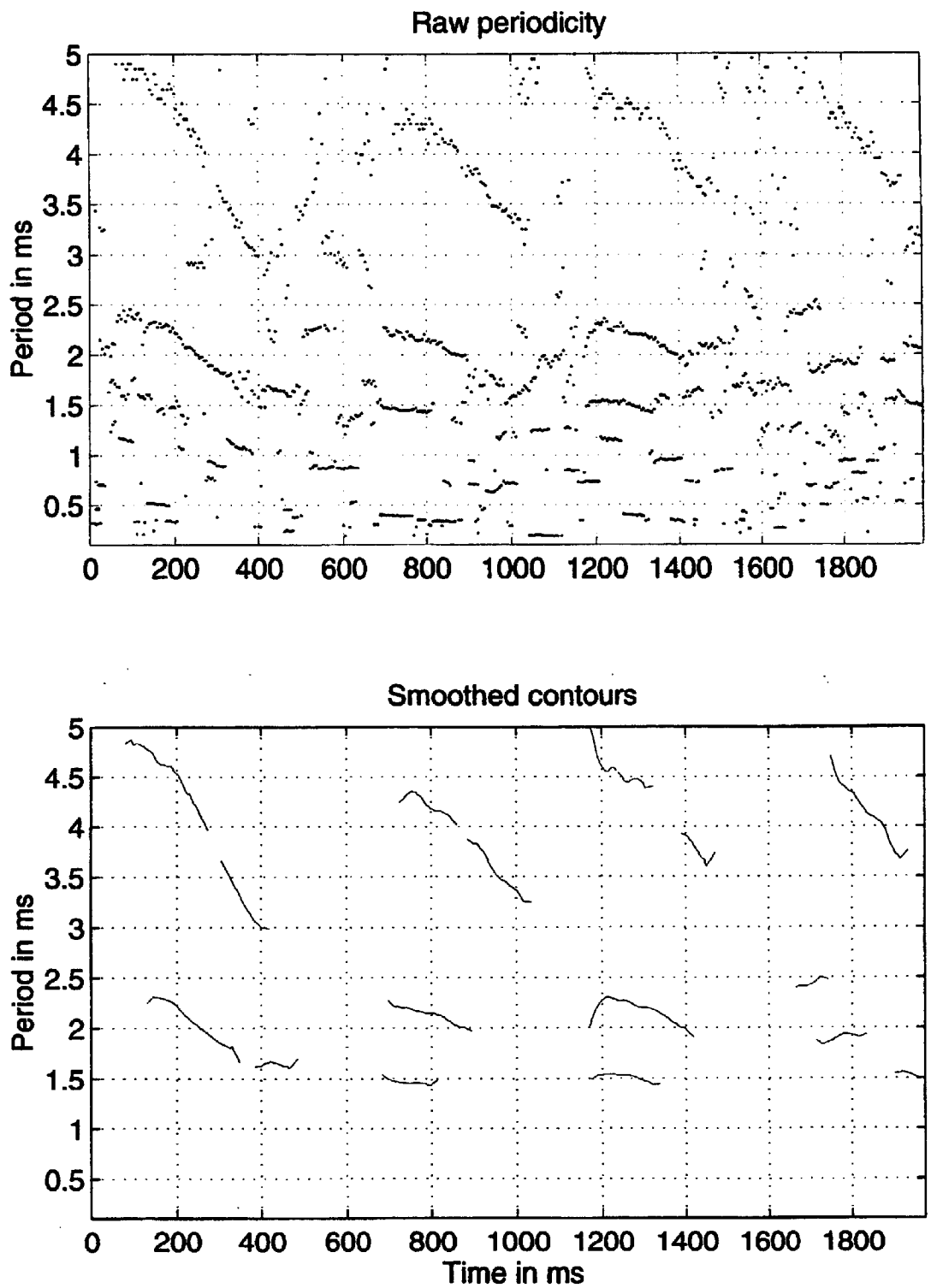
Fig. 2.14

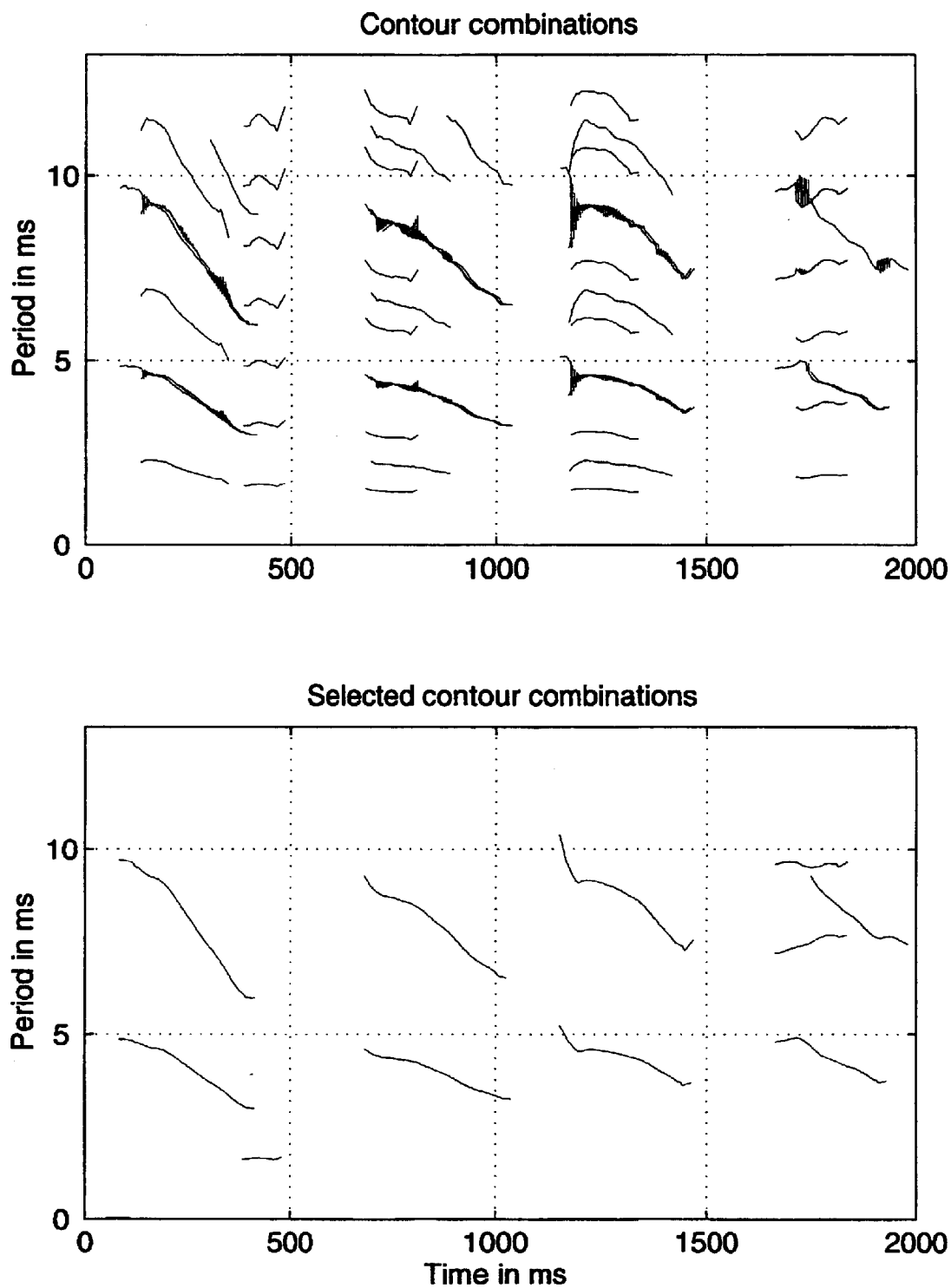
Fig. 2.15

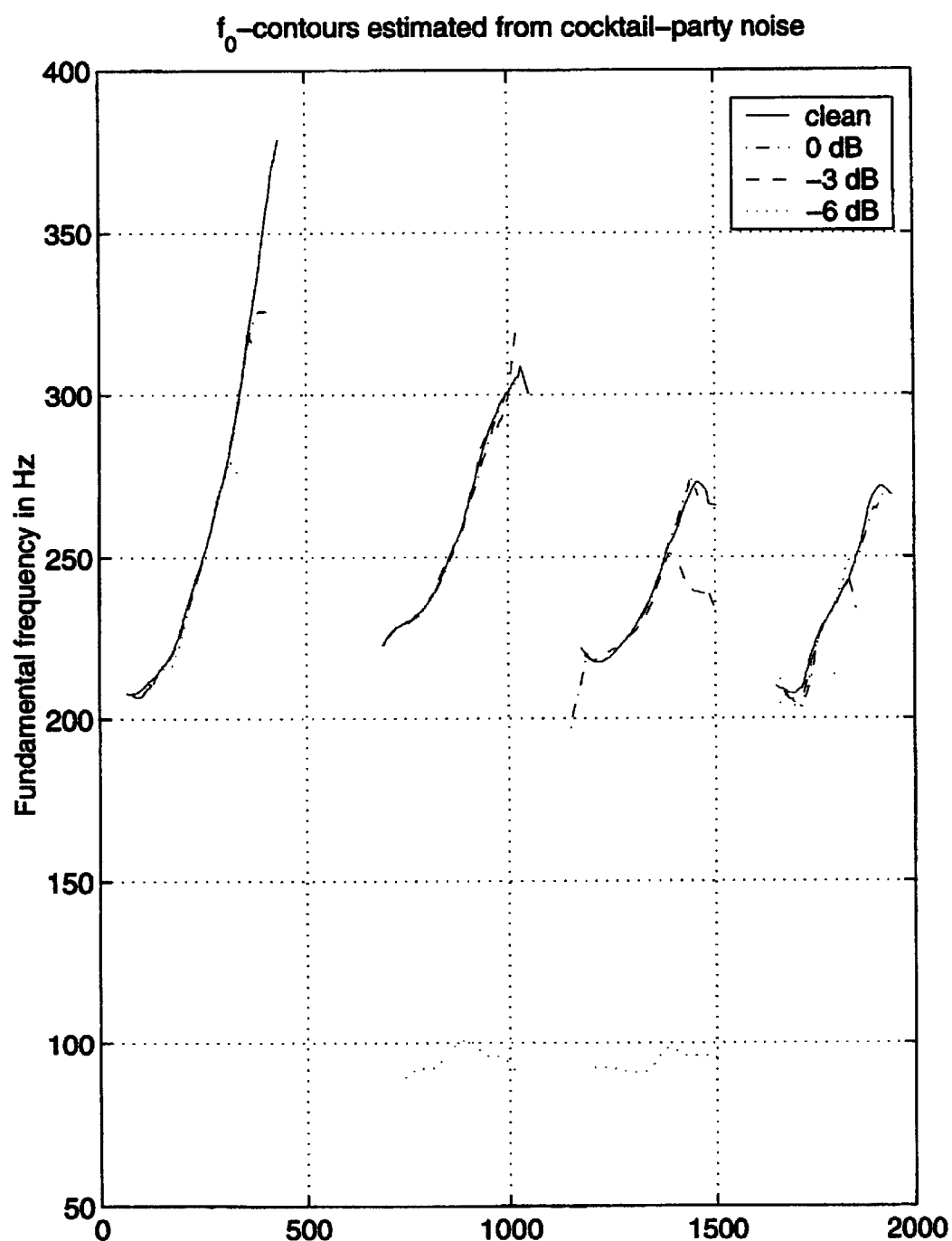
Fig. 2.16

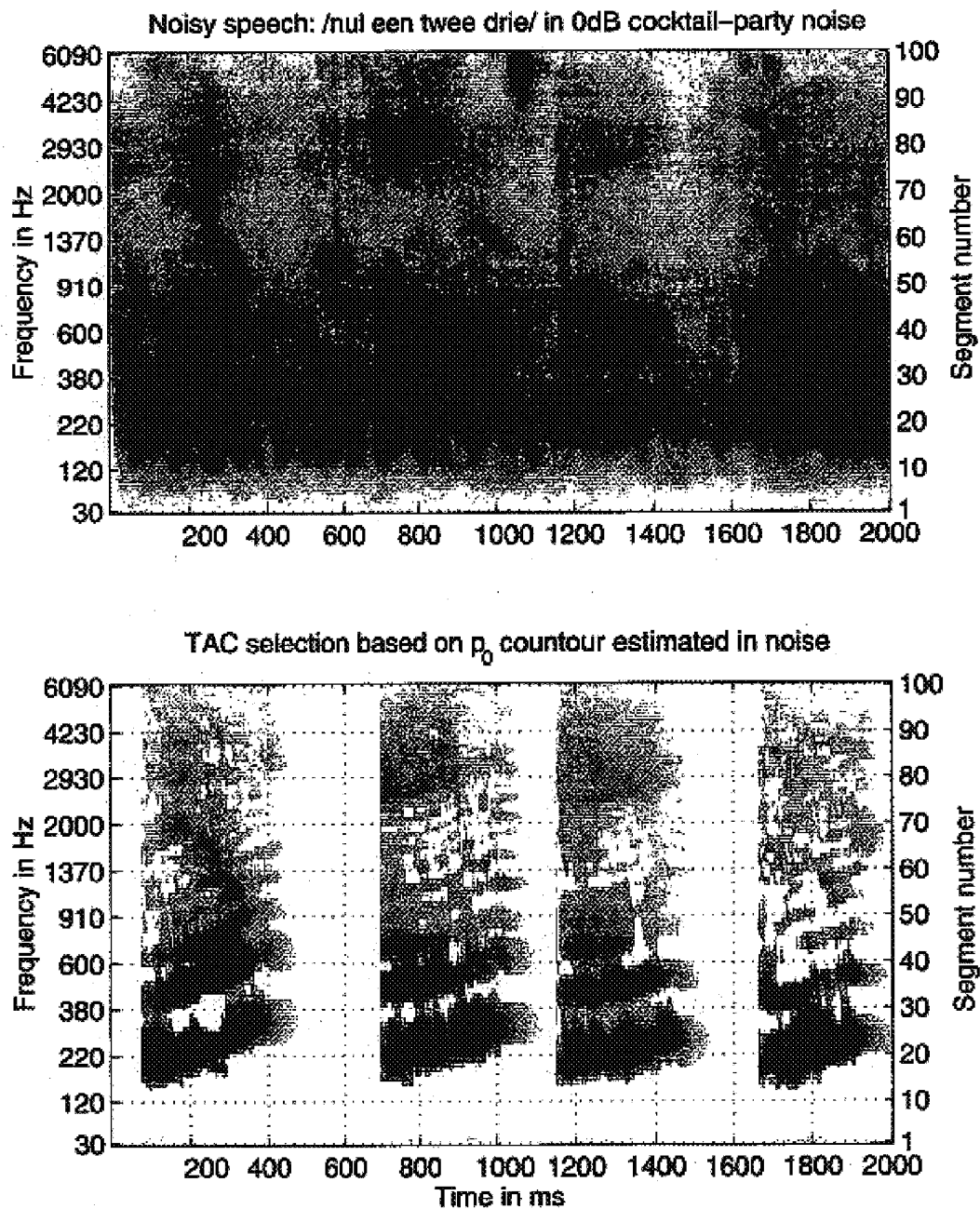
Fig. 2.17

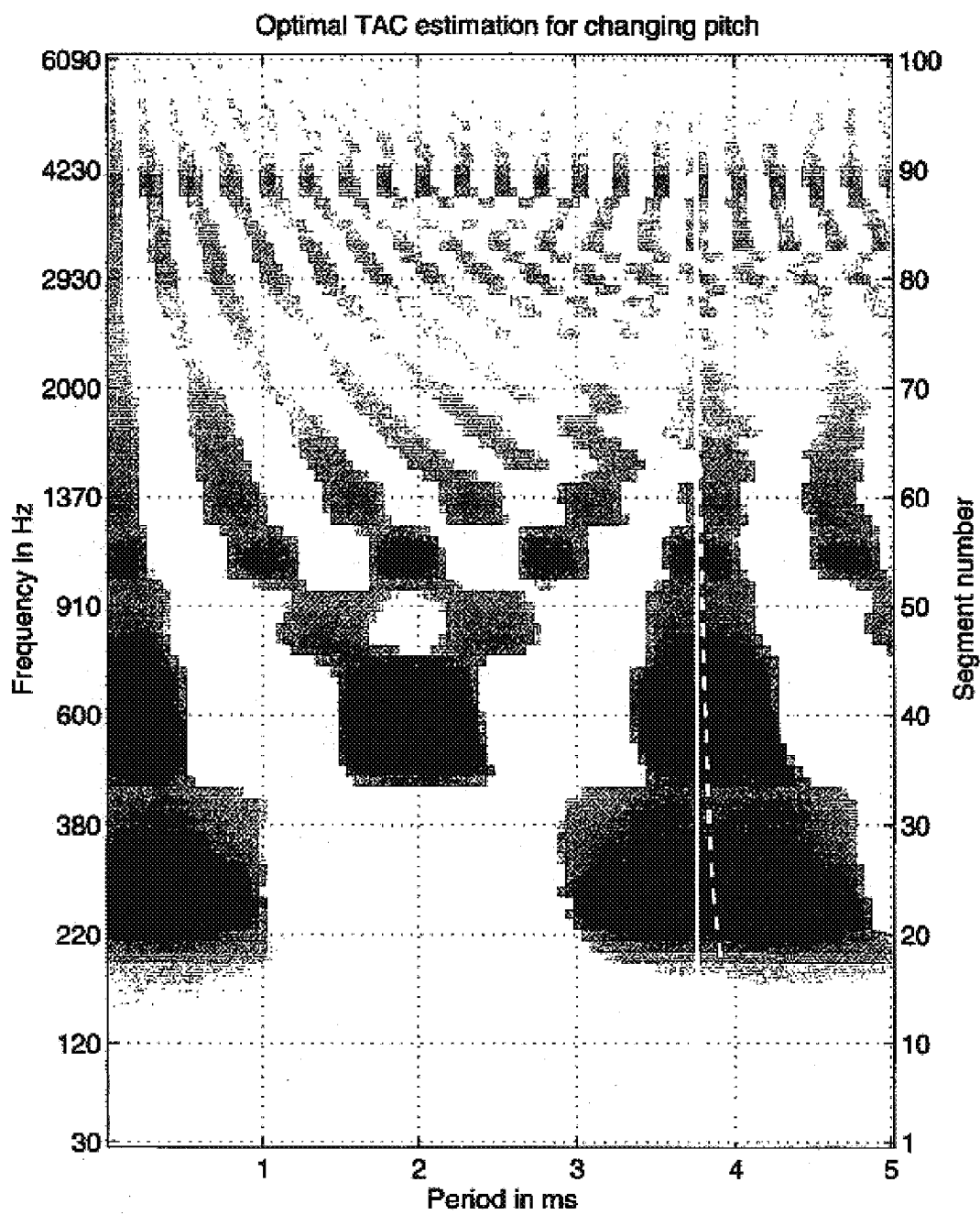
Fig. 2.18

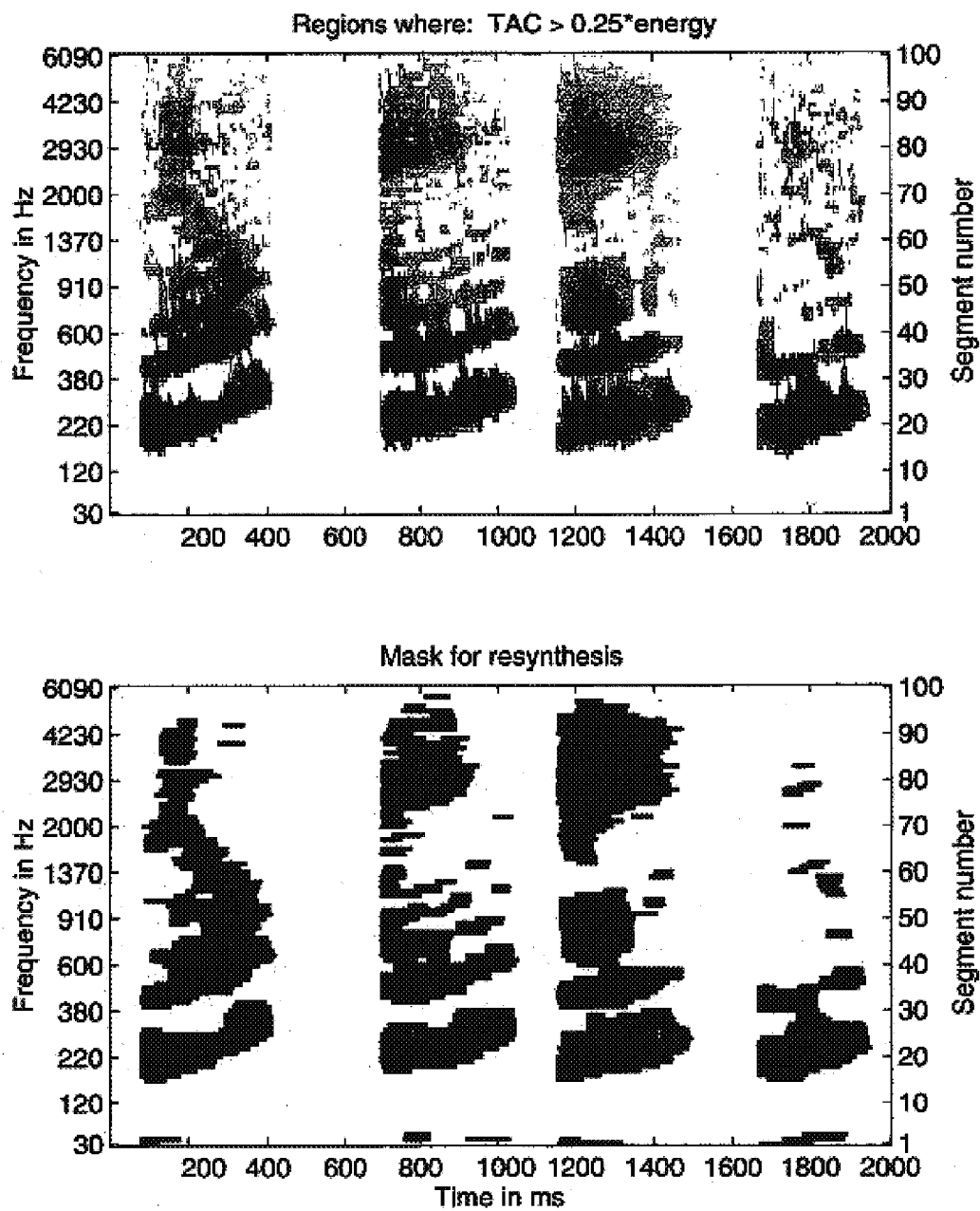
Fig. 2.19

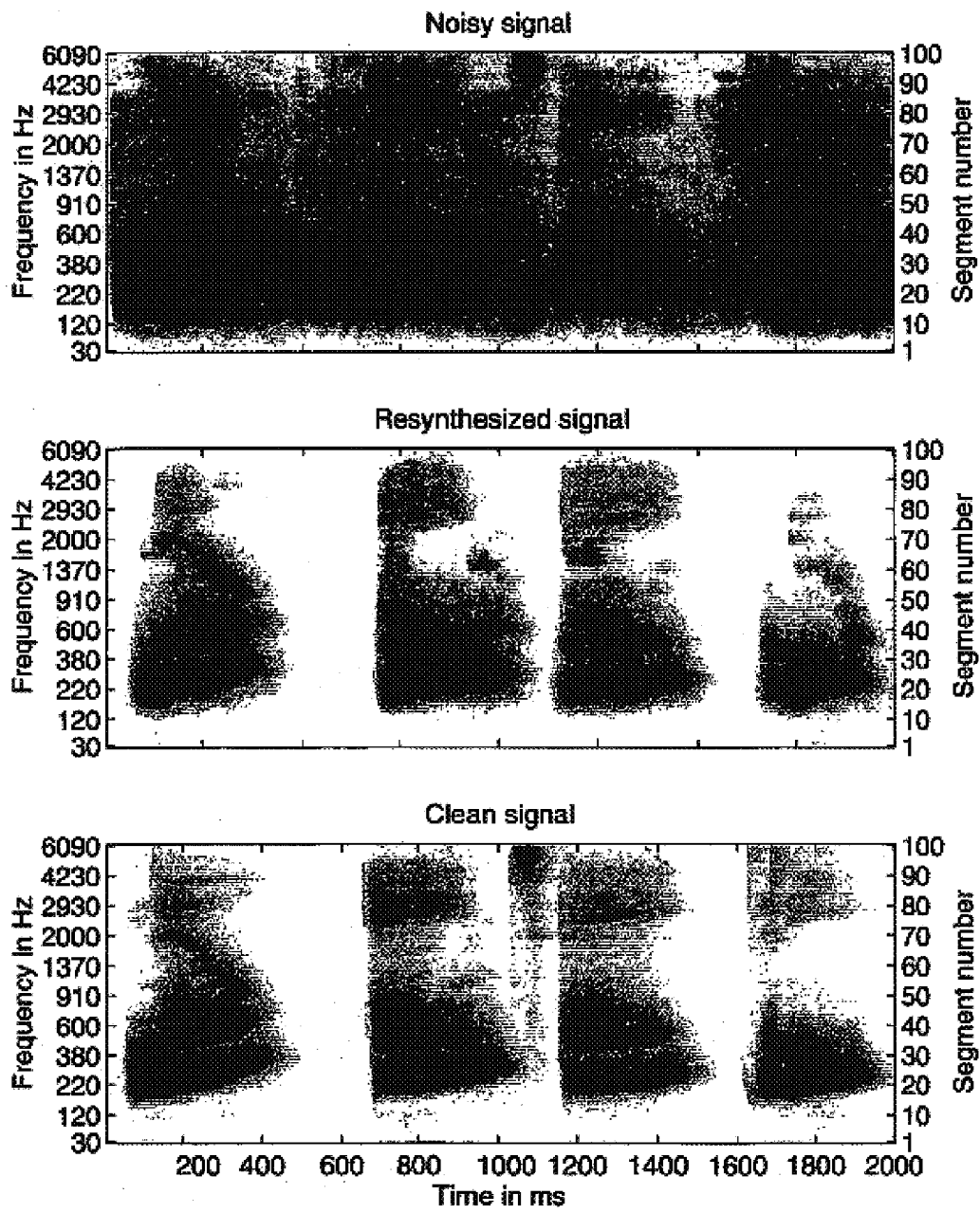
Fig. 2.20

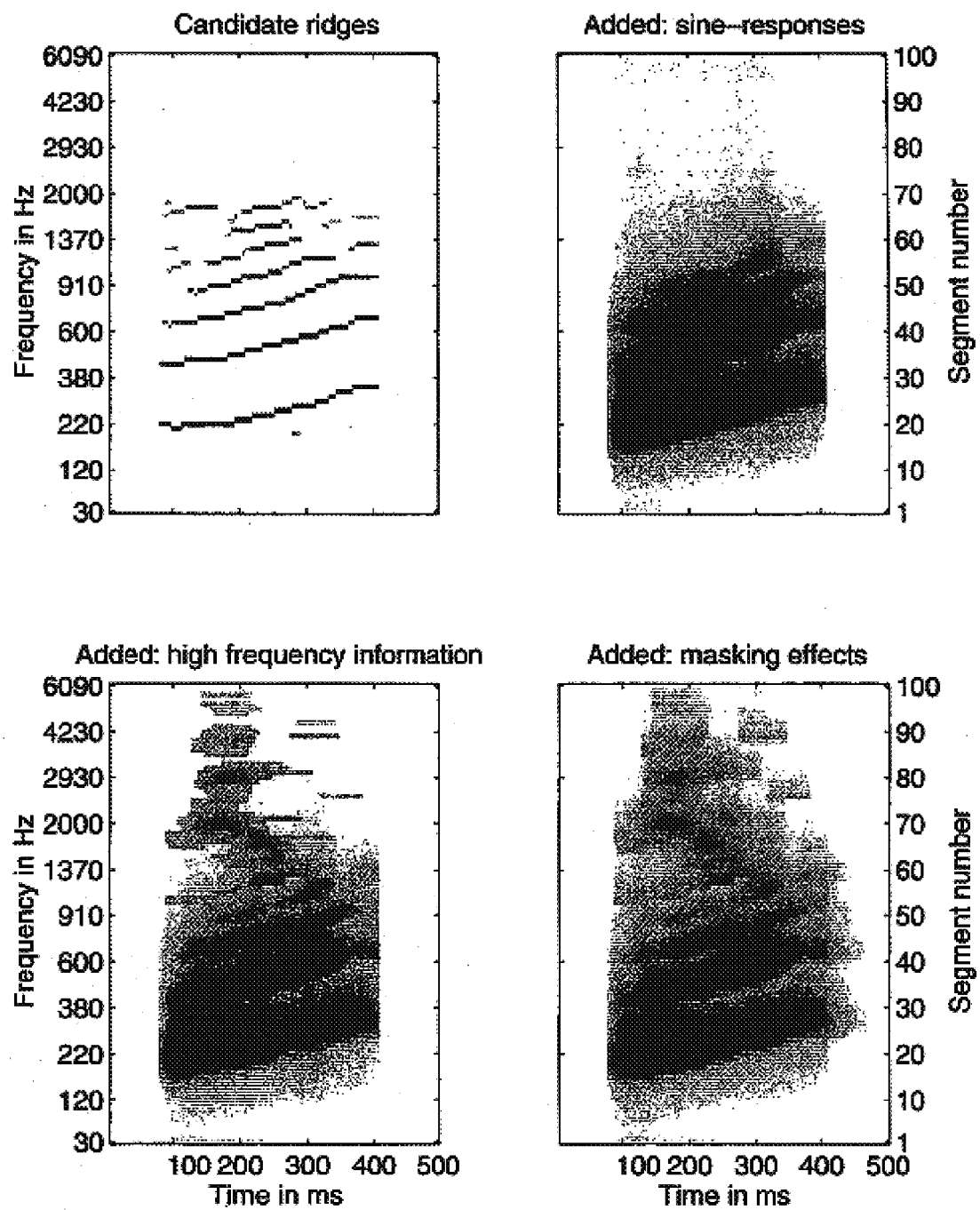
Fig. 2.21

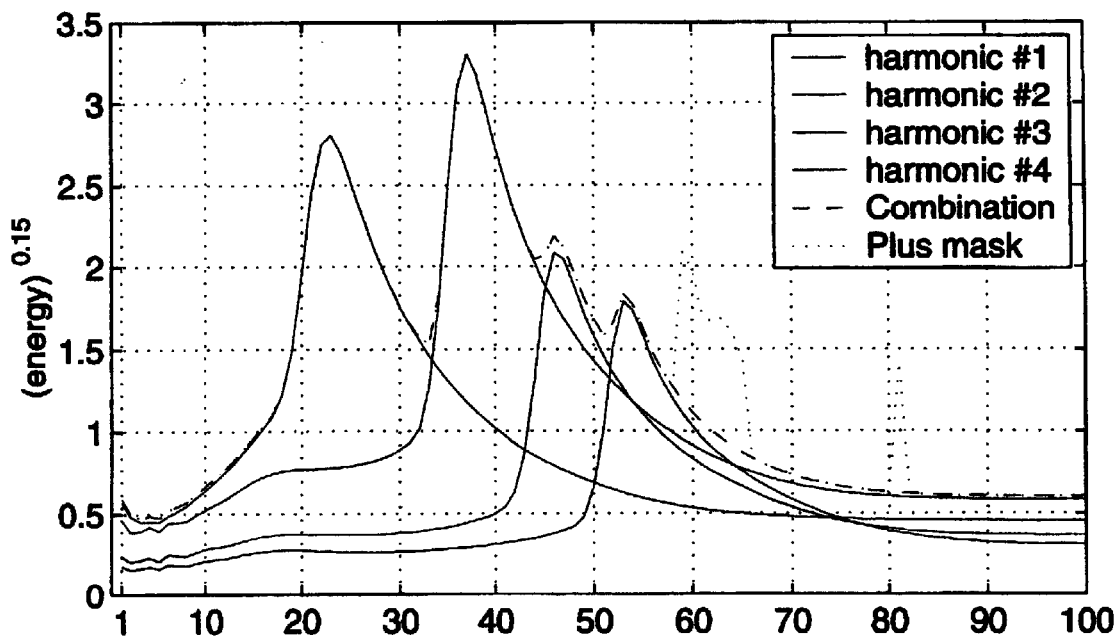
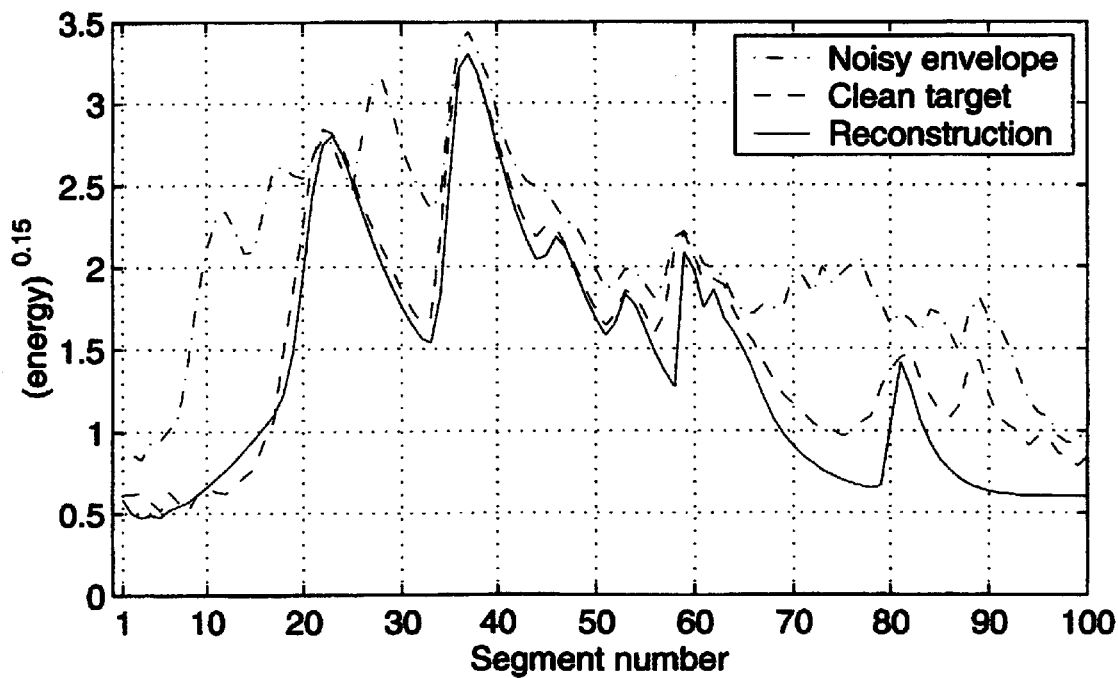
Fig. 2.22

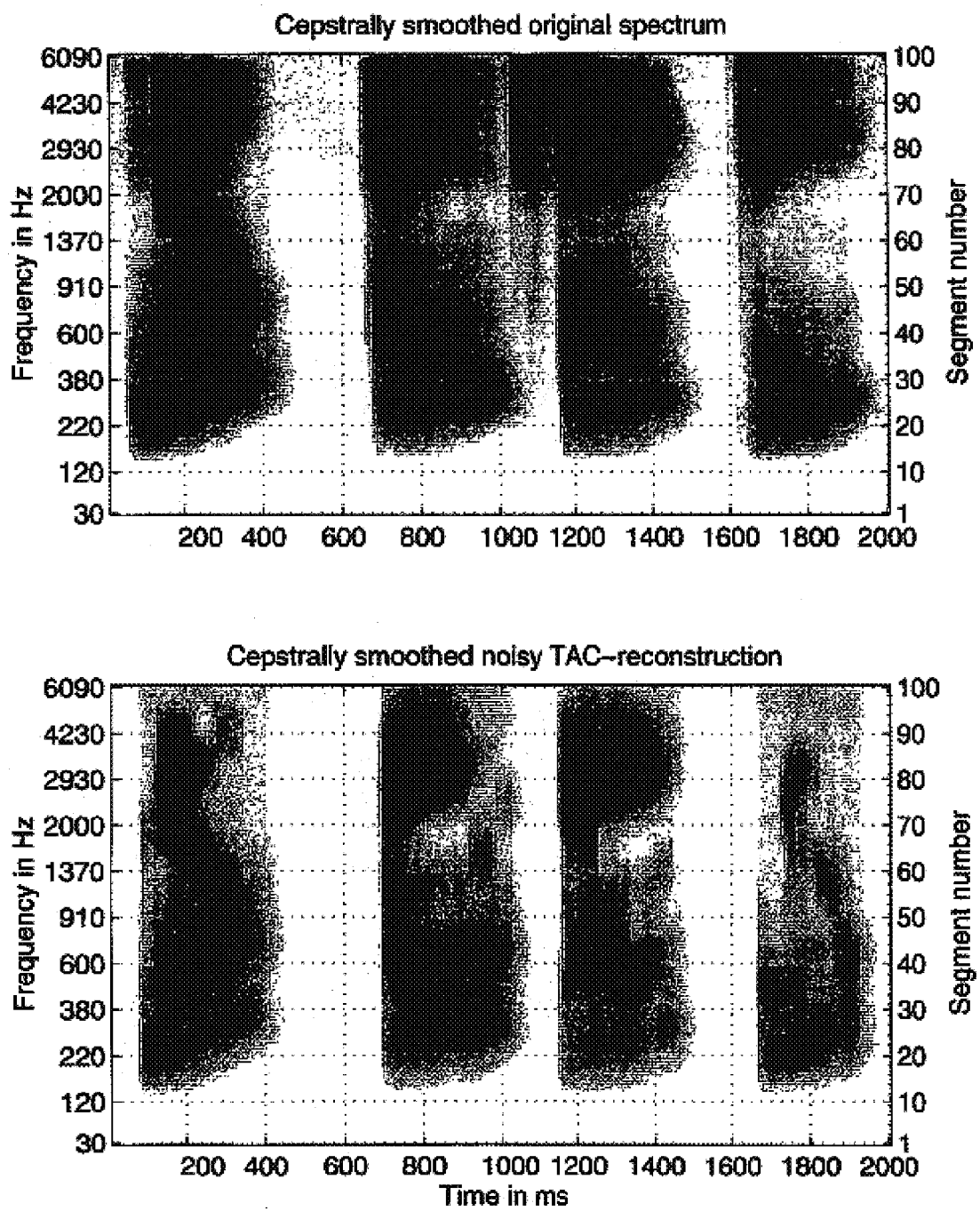
Fig. 2.23

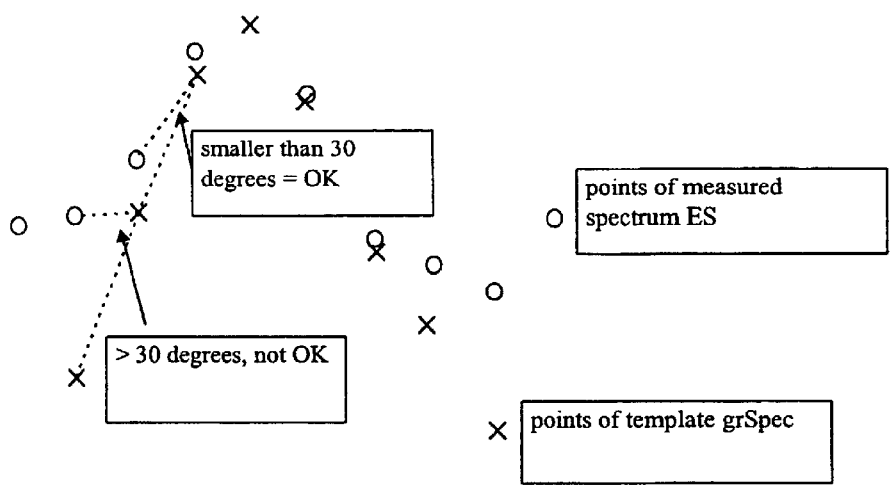
Fig. 3.1
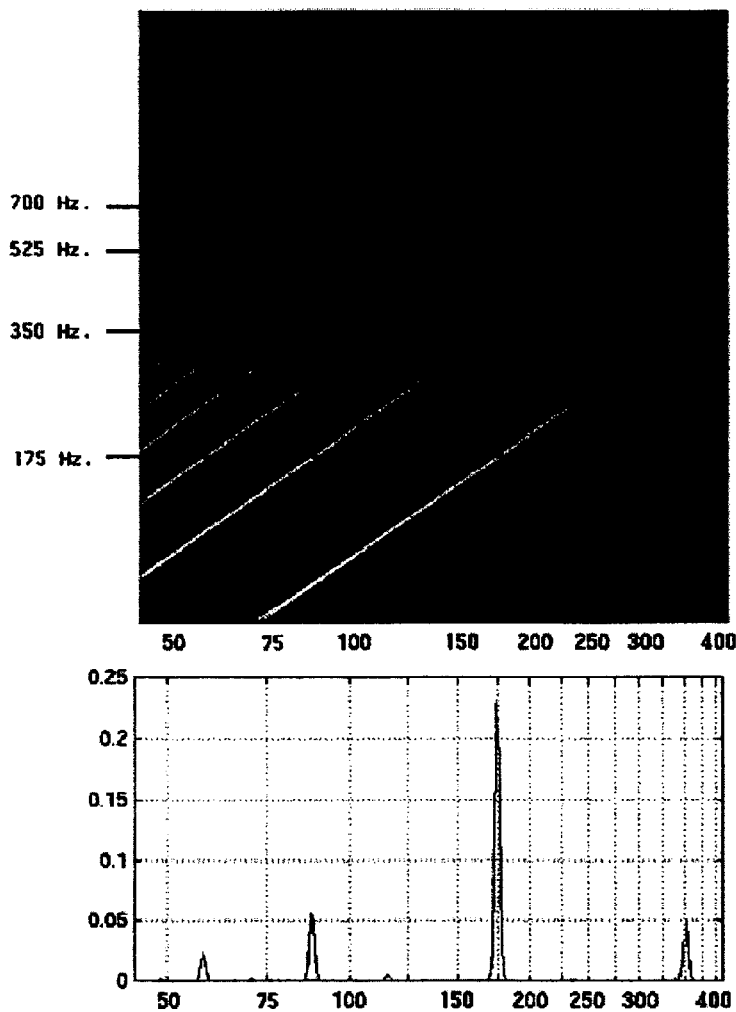
Fig. 3.5A
Fig. 3.5B

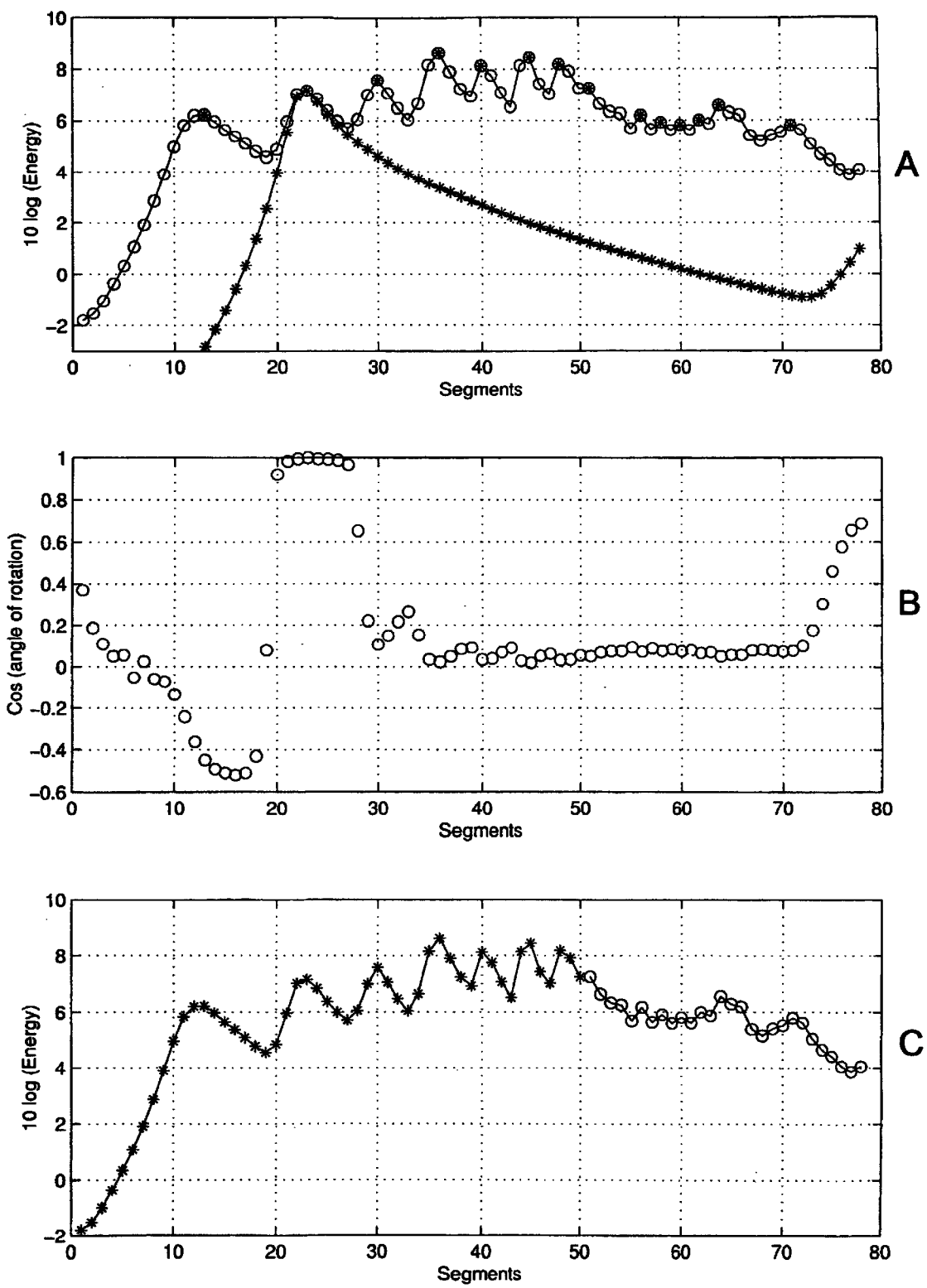
Fig. 3.2

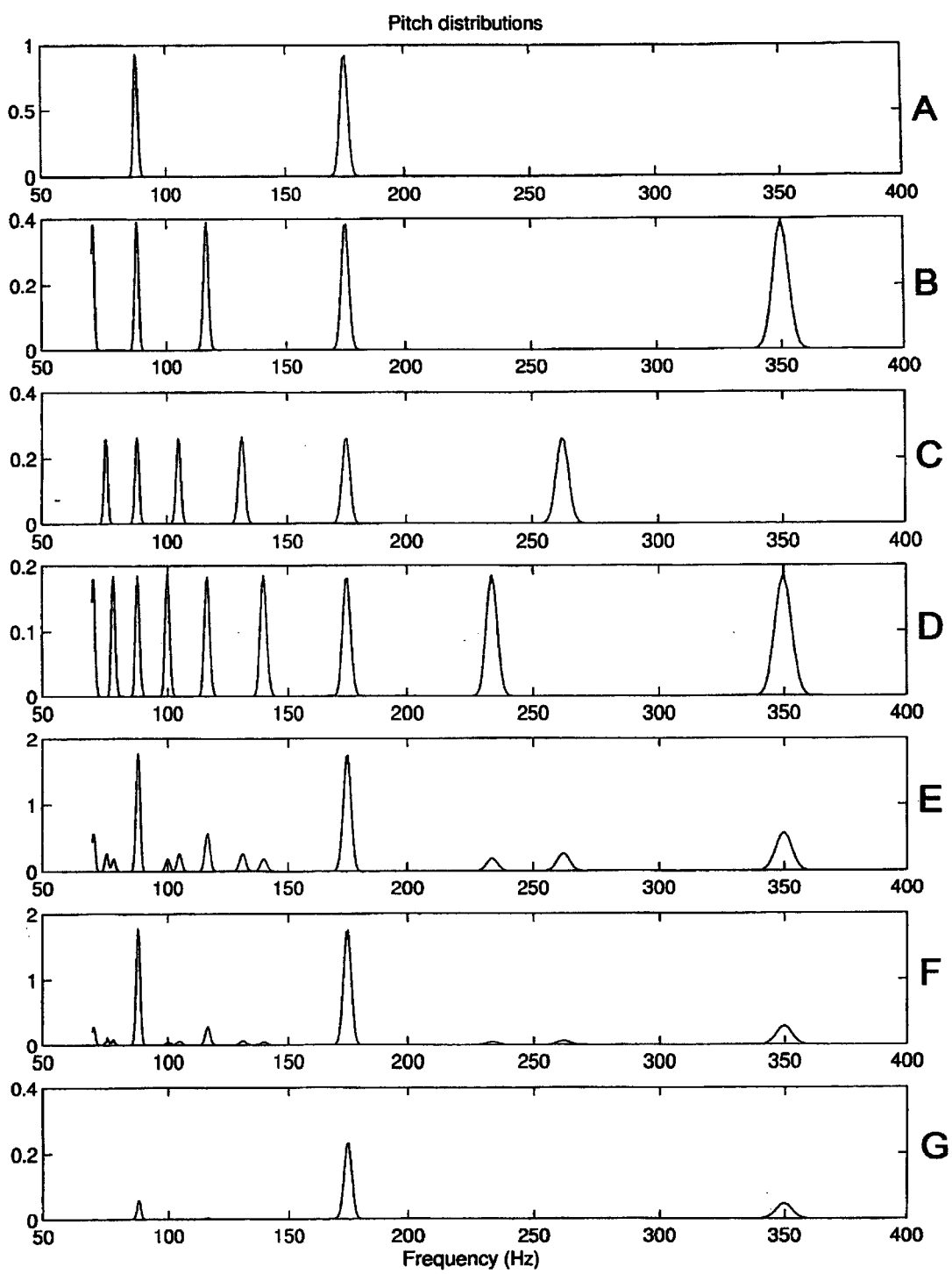
Fig. 3.3

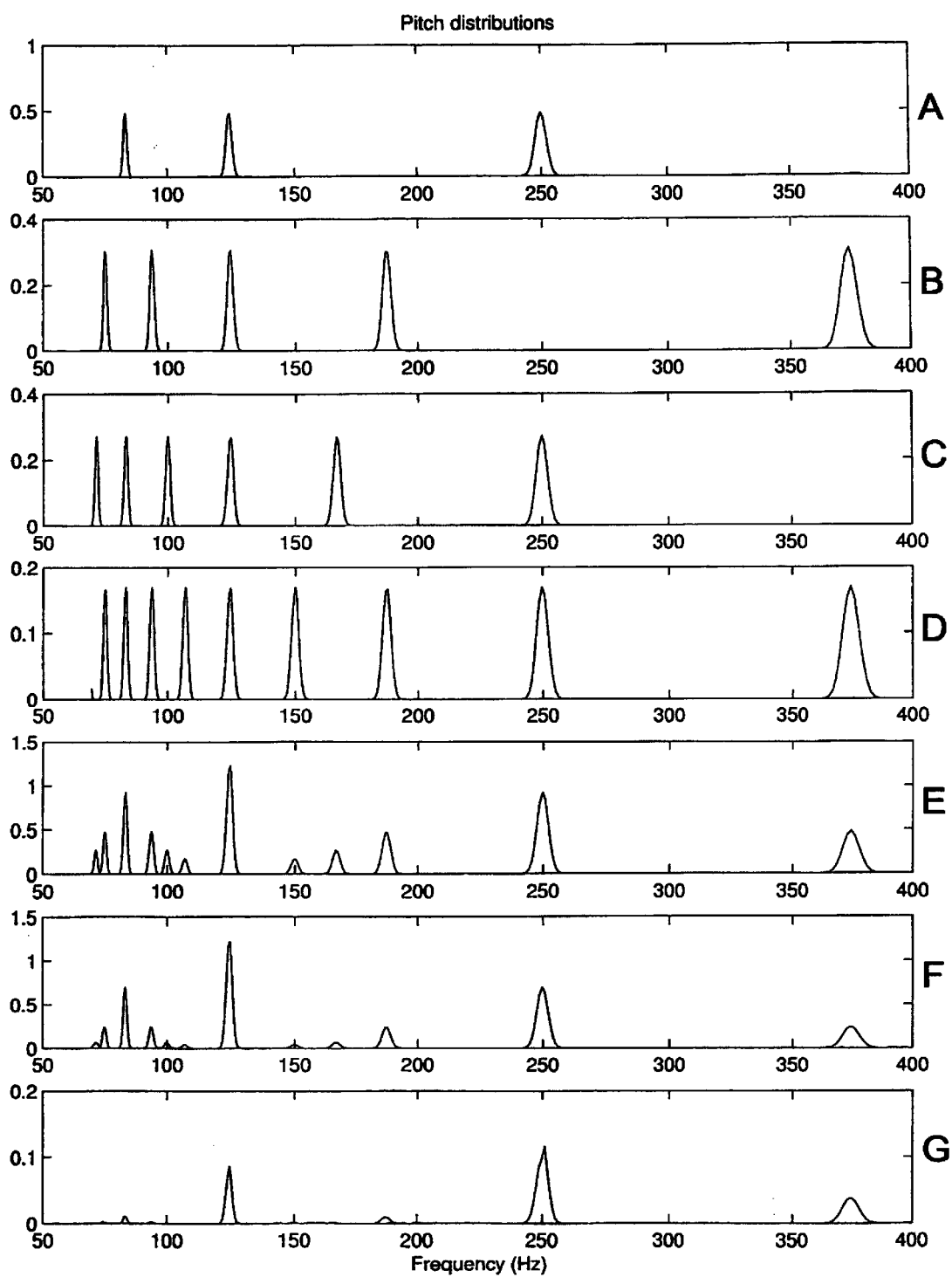
Fig. 3.4

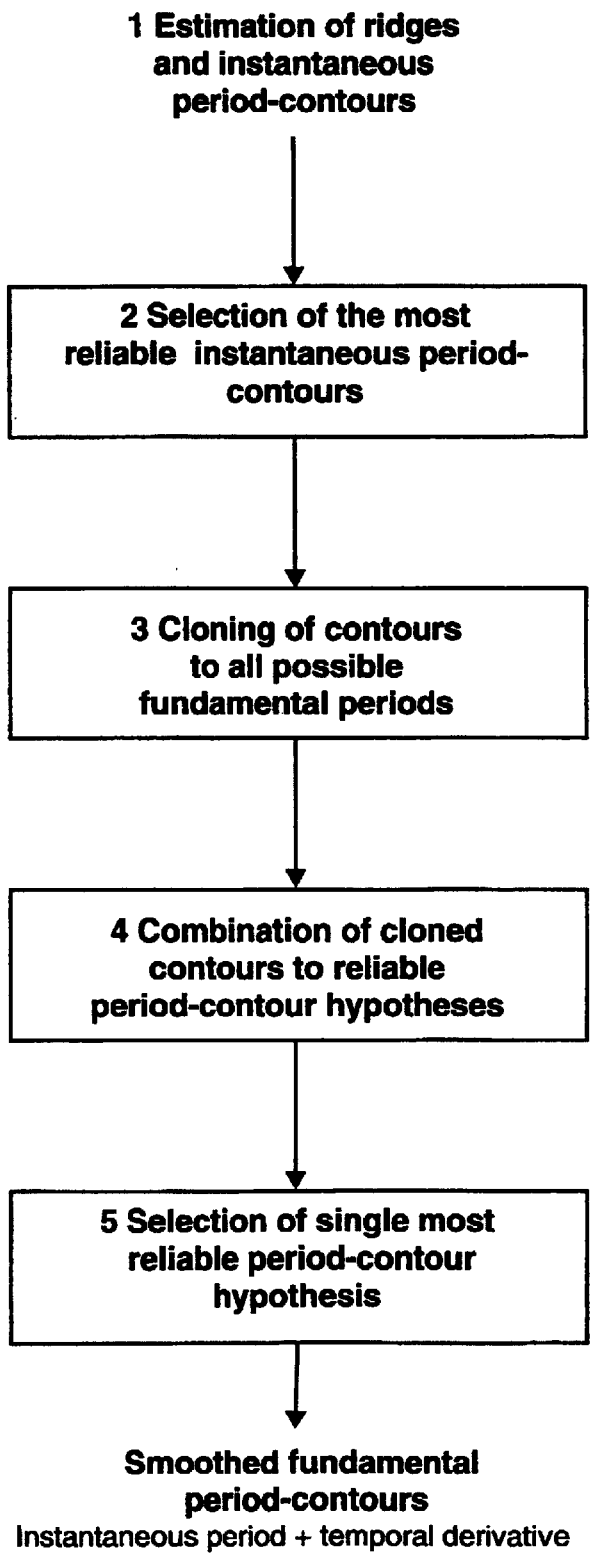
Fig. 3.6

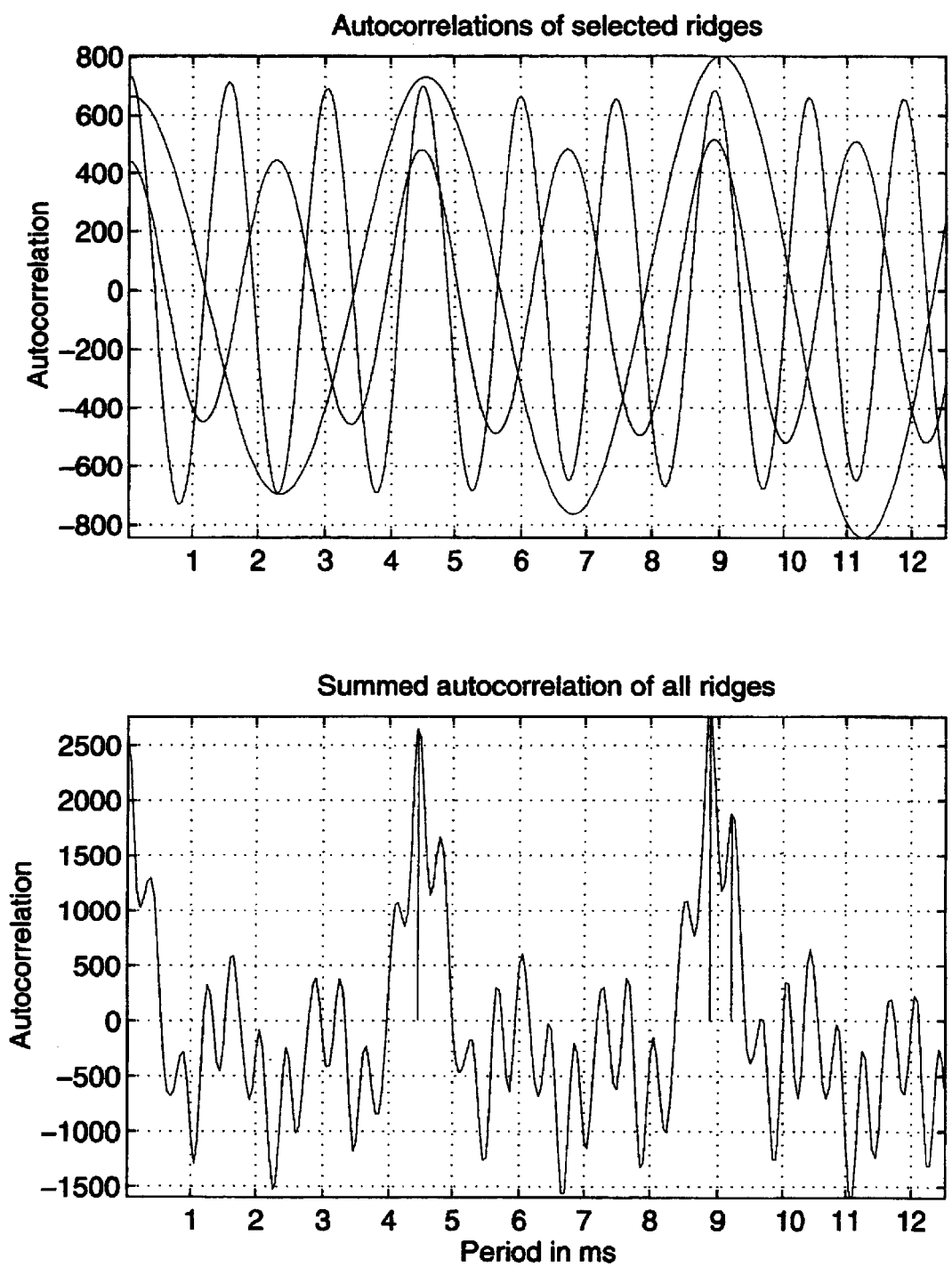
Fig. 3.7

METHODS AND APPARATUSES FOR SIGNAL ANALYSIS

This invention relates to an apparatus for estimating frequency properties as in the preamble of claim 1. Furthermore, the invention relates to an apparatus for estimating the spectrum of a signal as in the preamble of claim 7. The invention further relates to a signal recognition system, a data compression system and a signal improvement system device including such apparatuses and methods for performing functions of the apparatus.

Apparatuses as described above, are known from the article "Using an Auditory Model and Leaky Autocorrelators to Tune In to Speech" by T. Andringa, published in ESCA Eurospeech 97, Rhodes, Greece, ISSN 1018-4074, pp. 2859–2862. From this Andringa 1997 article, it is known to make use of an auditory model which imitates the working principles of the basilar membrane. The output of the segments of the model is used as an input for a set of leaky autocorrelator units which are tuned to a particular, fixed, periodicity. The activity of the responsive autocorrelator units as a function of the segment number is then a direct measure for the spectrum of the periodic signal to be detected.

With the apparatus described in this prior art document, it is possible to reconstruct an energy spectrum of a signal whose fundamental period is both known and constant. However, a problem presents itself in that the known device does not provide for the correct and or optimal reconstruction of the energy spectrum when the period is unknown, is not constant, or both. The object of the invention is to provide a device which enables a correct reconstruction of the signal when the period of the sound signal is unknown and/or is not constant.

In a first aspect of the invention to that end the invention provides a device as claimed in claim 1. In a second aspect of the invention to that end the invention provides a device as claimed in claim 8.

Particularly advantageous elaborations of the invention are set forth in the dependent claims. Further objects, elaborations, modifications, effects and details of the invention appear from the following description, in which reference is made to figures in the attached drawing.

FIG. 1.1 shows a diagram of the known basilar membrane;

FIG. 1.2 shows a block diagram of the device according to the invention;

FIG. 1.3 shows the autocorrelation function determined in respect of one segment of the basilar membrane model;

FIG. 1.4 shows the estimated frequency energy spectrum determined with respect to all segments of the basilar membrane model; and FIG. 1.5 shows the results of FIG. 1.3 and FIG. 1.4 aggregated in a two-dimensional figure.

FIG. 1.6 shows a block diagram of an first example of the low-pass filter shown in FIG. 1.2.

FIG. 1.7 shows a block diagram of a second example of the low-pass filter shown in FIG. 1.2.

FIG. 1.8 shows a block diagram of an extension of the second example of the low-pass filter shown in FIG. 1.7.

FIG. 1.9 diagrammatically shows a flow-chart of an example method according to the invention.

FIG. 2.1 shows a schematic representation of the uncoiled basilar membrane and some example graphs of the BM-segment velocity as functions of time.

FIG. 2.2 shows a two-dimensional graph or cochleogram of the movement of segments of the BM model as a function of time for the word "NUL".

FIG. 2.3 shows a cross-section of the position of the bar at 175 ms in the cochleogram of FIG. 2.2.

FIG. 2.4 shows a graph of the frequency response of the BM model as a function of segment position.

FIG. 2.5 shows a graph of the energy as a function of segment position for sinus waves of different frequencies.

FIG. 2.6 shows a graph of an energy distribution as a function of segment position and a selection of harmonics approximation the energy distribution.

FIG. 2.7 shows a graph of the tuned autocorrelation (TAC) for a noiseless signal and a signal with added cocktail party noise.

FIG. 2.8 shows a time normalised correlogram derived from the /U/ in /NUL/.

FIG. 2.9 shows a graph of ridges determined from a signal with and without noise.

FIG. 2.10 shows a graph of autocorrelations of some ridges and the local frequency estimated from one of these ridges.

FIG. 2.11 shows a graph of autocorrelations as estimated at t=250 ms from /NUL/ in FIG. 2.9.

FIG. 2.12 shows graphs of instantaneous frequencies, estimated in clean and noise conditions, as a function of time.

FIG. 2.13 shows a cochleogram and graphs of ridges and instantaneous frequency contours as a function of time for the sentence /NUL EEN TWEE DRIE/.

FIG. 2.14 shows a graph of local instantaneous periods, the inverse of the instantaneous frequency contours of FIG. 2.13 and the a graph result of an smoothing method applied to these local instantaneous periods.

FIG. 2.15 shows a graph of fundamental period contour hypotheses consistent with the smoothed contours of FIG. 2.14 and fundamental period contours selected from these hypotheses.

FIG. 2.16 shows a graph of pitch contours estimated from the selected contours of FIG. 2.15 as a function of time.

FIG. 2.17 shows a graph of the result of a tuned autocorrelation selection based on the estimated period contours of FIG. 2.16.

FIG. 2.18 shows a part of the Time Normalised Correlation (TNC) where the autocorrelation of FIG. 2.10 are derived from.

FIG. 2.19 shows a graph of the regions of FIG. 2.13 where the TAC value is larger than a quarter of the local energy and the mask derived from these regions.

FIG. 2.20 shows graphs of a noisy signal, a clean signal and a resynthesised signal derived from the noisy signal FIG. 2.21 shows graphs of the noisy signal of FIG. 2.20 in successive steps of the reconstruction process.

FIG. 2.22 shows a cross-section of a reconstructed cochleogram corresponding to t=275 ms in FIG. 2.21.

FIG. 2.23 shows cochleogram representations of the information represented by the cepstral coefficient that are used for recognition.

FIG. 3.1 shows a graph of the selection of peak in a spectrum based on a peak template.

FIG. 3.2A–C show graphs of the results of successive steps of the peak selection.

FIG. 3.3A–G show graphs of pitch distributions for input frequencies: 175 Hz, 350 Hz, 525 Hz and 750 Hz FIG. 3.4A–G show graphs of pitch distributions for input frequencies: 250 Hz, 375 Hz, 500 Hz and 750 Hz FIG. 3.5A–B show a matrix and rows selected for the combination of input frequencies of FIG. 3.3 and the resulting final distribution.

FIG. 3.6 diagrammatically shows a flow-chart of successive steps of a general pitch estimation method.

FIG. 3.7A–B shows graphs of an autocorrelation and a summed autocorrelation.

In the following, the invention will be described with reference to the recognition of speech in a signal. Although the invention can advantageously be applied in the art of speech recognition, the invention applies to signal processing in general and is by no means limited to the processing of sound signals or signals containing speech. Furthermore, although the successive steps of the method are described in interaction with each other, the steps can be applied in different methods as well, as will be explained below.

In this application, an auditory event is defined as a representation that ideally represents all estimatible or determinable information of a single source. For many signal processing methods and devices, it is important to approach such a representation as close as possible.

Most of the known (speech) signal processing methods which intend to approach such a representation, are based upon a quasi-stationarity assumption. This means that certain aspects of the signal, like amplitude and frequency content, can be modelled as originating from a process that can be assumed to be constant over short periods (for speech a value of around 10 ms is usually chosen). The rationale for this assumption is that signals, i.e. speech, are produced by a physical system that cannot change infinitely fast.

This is a very reasonable assumption which is used extensively in this application. However, the assumption holds exclusively for the signal of a single source. If a signal is produced by two sources, it will change more rapidly, and certainly differently, than can be expected of a single source. Consequently, a form of quasi-stationarity that is valid for a single source cannot be applied on mixtures of sources. In an arbitrary, unknown environment, the situation is even worse, since signal contributions might exist for which quasi-stationarity is never a useful approximation. If quasi-stationarity is nevertheless applied, the induced approximation errors will degrade the combined signal irreparably and therefore reduce the probability of reaching a correct description of the signal and/or a correct recognition result.

Quasi-stationarity is often implemented by blocking the signal into frames and assuming that the sequence of consecutive frames provides a sufficiently adequate description of the frequency-content of the signal through time. Since the width of the frame (or the effective width of a window) is inversely proportional to the frequency resolution, a trade-off between temporal and frequency resolution is introduced. Signals in which frequency detail and temporal detail are both important cannot be processed optimally in a frame-based approach. A major problem is the combination of information through time. The use of frames introduces discontinuities that make it difficult to determine the continuity of underlying signal components. This in turn makes it more difficult to assign signal information of a single source to a single representation. The use of non-rectangular windows and discarding phase (the temporal information within the windowed signal) exacerbates this problem even more.

This entails that a large number of signal processing techniques and virtually all speech signal processing techniques are ill suited for use on arbitrary signals. In particular, techniques like the Short Term Fourier Transform (STFT), Linear Prediction (LP) and frame-based filterbank methods should not be used for arbitrary signals. These techniques are nevertheless applied to these signals, often without much success, or with successes on a very narrow range of applications.

Quasi-stationarity, with a proper sampling time, can only be applied safely to signal contributions of a single source. For an unknown mixture of (sound) sources a more suitable form of signal processing is required. It is a goal of the invention to provide such a system.

Therefor a system is provided that exploits the regularities of the source as well as possible. Unfortunately the regularities of the source are unknown because the source is not yet classified. In this case the system can only assume the weakest possible prior knowledge. But any (sound) source shows an onset, an optional continuous development and an offset. Consequently: all (sound) sources that are not impulse-like have a continuously developing part.

In the case of speech, most kinds of music and a wealth of other signals, a continuous development is prominent most of the time. In the case of speech, only for some plosives like the /t/, the /k/ or the /p/ it might be argued that a continuous development is absent. Utterances like "Why I owe you an hour?", on the other hand, can be pronounced in such a way that the complete utterance forms a single continuous whole.

Continuity of frequency and amplitude are well-defined signal properties that are shared by a wealth of sound sources. Such continuity, provided that it can be justified from the signal, can therefore be exploited without any further knowledge of the type of signal. Continuity of signal components is therefore extremely well suited to help with assigning acoustic evidence of individual sound sources to auditory events. As long as a signal component shows a continuous development it is likely to stem from a single source. This is a fairly safe conclusion because the probability is small that uncorrelated sources lead to signal components that fit to each other smoothly. Furthermore, signal properties like a fundamental frequency contour are continuous as well, and can help to group different signal components together: all harmonics of a single quasi-periodic sound source remain integer multiples of the fundamental frequency. Frequency-contours consistent with a certain fundamental frequency contour are likely to belong to the same source, or, as is often the case with music, to multiple sources with a correlated temporal development.

Consequently, continuity of signal components forms one of the most reliable cues for assigning information of a single source to a single representation. While this process is not complete, continuity through time and frequency ought to be conserved.

A flow chart of an example method for assigning information of a single source to a single representation according to the invention which satisfies the above-described restrictions is shown in FIG. 1.9

Firstly, a BM signal of a segment of a basilar membrane is generated from a basilar membrane model device in step I. This BM signal is based on a signal applied to an input of the basilar membrane. This step will be described in more detail in the section starting with the title: The BM model Secondly, the BM signal is integrated in order to provide a measure for the excitation of each segment in step II. A 3 dimensional matrix of segments by time by excitation measure can be provided based on this integration. The visual representation of this matrix is called a cochleogram. This step will be described in more detail in the section starting with the title: The Cochleogram Thirdly, in step III based on information provided by the three dimensional matrix, individual signal components, called ridges, are estimated in the matrix. These individual components are segment-time regions where an instantaneous frequency contour can be estimated. This step will be described in more detail in the section starting with the title: Ridge estimation.

Fourthly, an autocorrelation under the ridges is performed, which provides a measure for the periodicity of the contours in step IV. This step will be described in more detail in the section starting with the title: Running autocorrelation under Ridges.

Fifthly, the autocorrelation values are analysed in order to determine a local frequency for each moment of the development of the fundamental period contour in step V. This local frequency is local in segment and time. This step will be described in more detail in the section starting with the title: Local Instantaneous Frequency contours.

Sixthly, the local frequency is used to estimate the pitch of the signal in step VI. Although officially the terms pitch and fundamental frequency are not interchangeable, the first referring to the (subjective) perception of the (physically measurable) last, the terms will be used interchangeably throughout this document. This step will be described in more detail in the section starting with the title: Fundamental Period Contour Estimation.

Seventhly, a method for correlating the excitations of segments of the BM model is applied in step VII. Since it is unlikely that uncorrelated excitations belong to the same signal, by taking all correlated signal components, the signal is approximated. This step will be described in more detail in the section starting with the title: Tuned Autocorrelation.

Eighthly, a method for determining which basilar membrane segments show a periodicity that corresponds to the segment's own characteristic frequency is applied in step VII. This is performed by a correlation between the excitation and the excitation shifted according to the segment's best period. The information determined in this step can be used to estimate both periodic and a-periodic signal contributions like noisebursts and onsets. This step will be described in more detail in the section starting with the title: Characteristic Period Correlation.

Ninthly, an onset detection device is applied in step IX. This step detects onsets and offsets by searching for rapid changes in the output of the Characteristic Period Correlation device or Cochleogram. This step will be described in more detail in the section starting with the title: Onset detection.

Tenthly, a mask forming method is applied in step X. This masking device uses the information available at this stage to mark regions in time and place that are likely to stem from of the target source. Multiple maskings can be defined that each mark regions of different properties. This step will be described in more detail in the section starting with the title: Mask formation.

Eleventhly, an inverse Basilar Membrane filtering device may be applied in step XI. This step inverse filters the excitation of the basilar membrane using the regions identified by the masking device to arrive at a resynthesised signal that represents the signal information under the mask. This step will be described in more detail in the section starting with the title: Inverse Basilar Membrane Filtering.

Twelfthly, a Reconctrution of the Cochleogram device may be applied in step XII. This step uses the information estimated from the signal and represented by the mask to measure individual signal components and reconstruct a signal by adding the individual signal components. This step will be described in more detail in the section starting with the title: Reconstruction of cochleogram device.

Thirteenthly, a Parameterisation device can be applied to the reconstructed cochleogram in step XIII. This step provides information suitable as input for a recognition device. This step will be described in more detail in the section starting with the title: Parameterisation.

The BM Model

A method according to the invention is started with the generation of a BM signal. In the auditory system the transduction from sound, i.e. pressure fluctuations, to neural information is performed around a structure called the basilar membrane, as schematically shown in FIG. 2.1. The basilar membrane is a coherent physical structure that can be described by the physics of transmission lines. A transmission-line is a structure that is continuous in both time and place, where in the case of the basilar membrane place corresponds to frequency, because each place on the membrane has its own characteristic frequency. Consequently, the basilar membrane transducts acoustic vibrations to neural information so that continuity in time and frequency (via its correspondence to place) are preserved for further processing.

FIG. 2.1 shows a very schematic representation of the essential features of the basilar membrane 1. The basilar membrane is a coiled-up structure 2 with a length of 3.5 cm that is situated in the cochlea, a snail-house-like structure of about 1 $cm^3$. The side of the basilar membrane near the opening of the snail-house is most sensitive to frequencies of about 20 kHz, further inside the cochlea the frequency to which each position is most sensitive decreases down to 20 Hz, according to an (approximately) logarithmic place-frequency relation. The frequency-range of the basilar membrane is therefore 3 orders of magnitude or about 10 octaves. About 3000 hair cells, evenly spread along the basilar membrane, transduct the local vibrations to graded-potentials which in turn are coded as action potentials and transmitted by 30000 neurones to the brainstem. The axons of these neurones form the auditory nerve.

In the shown example device, a one-dimensional transmission-line model of the basilar membrane is used, as is known from: Duifhuis, H., Hoogstraten, H. W., van Netten, S. M., Diependaal, R. J., and Bialek, W. (1985). "Modelling the cochlear partition with coupled Van der Pol oscillators", in: *Peripheral Auditory Mechanisms*, eds. J. B. Allen, J. L. Hall, A. E. Hubbard, S. T. Neely and A. Tubis (Springer, N.Y.) pp. 290–297. The most relevant properties of the model are continuity in both time and place and a one-to-one place-frequency relation. This entails that the basilar membrane model can be interpreted as a filter bank with physically coupled filters: neighbouring filters show similar displacements at all points in time. However, although a basilar membrane (BM) model resembles parts of the mammalian auditory system, the invention is not limited to a transmission line model with such resemblance of the mammalian auditory system. For the sake of clarity, in this application the term 'BM model' is used for any non-uniform transmission line device with a similar function as a cochlea.

It is possible to apply a different basilar membrane model, like for example the known basilar membrane model, which like the actual basilar membrane is non-linear. In this example embodiment of the invention as an advantageously linear version of the model is used. Although a non-linear model is often thought to have a better performance, since is resembles the human auditory system more closely, it is found that a linear model can be implemented with a satisfying performance. This linear version of the BM model device requires less processing and is simpler of design and implementation.

This linearity allows an efficient implementation as an overlap-and-add filter bank and it helps to solve the central problem: how to separate a mixture of signals. After all linearity entails additivity, which can be interpreted such that a mixture of signals a and b can be split without introducing cross-terms that depend on both a and b. The absence of cross-terms, which cannot be guaranteed in most non-linear system, simplifies the design and implementation of a signal separation system and requires less processing.

Furthermore, the known basilar membrane model has an internal update frequency of 400 kHz and comprises 400 segments that span the full human frequency range. To reduce processing time in the example embodiment further, the shown BM model is implemented as a filter bank with 100 channels spanning a frequency range between 30 and 6100 Hz. The filter bank implementation requires an in- and output sample-frequency of 20 kHz. Hereby an increase in computational efficiency is obtained, compared to the known model.

In FIG. 2.1, a part of the electrical equivalent-circuit diagram of the basilar membrane of the inner ear is shown. On the left-hand side in the figure, a signal $V_{sound}$ can be presented, which is processed by a series of up to 400 mutually coupled second-order filters, called segments. Each second-order filter represents a certain mass inertia (coils), stiffness and damping, which determines how fast oscillations in the presented signal $V_{sound}$ are damped by the mutually connected second-order filters. Modelled on the actual inner ear, a coupling takes place of the distinct segments to the nerve tracts which transmit the sound signal impressions to the brain.

The BM model described is advantageously applied in the method described above with reference to FIG. 1.9. The BM model can, however, advantageously be applied in any signal recognition system as long as the system uses the BM signals.

The Cochleogram

A time-frequency representation, like an FFT-based energy spectrogram is thought to represent the most relevant information for the interpretation of the signal. Unfortunately it is discontinuous in both time and frequency. A spectrogram-like time-frequency representation, continuous in place (and indirectly frequency) can be computed by averaging the energy of (overlapping) frames of each basilar membrane segment. However this procedure implies quasi-stationarity that ought to be avoided since the input is not yet identified as a signal for which quasi-stationarity holds.

These problems are solved by using a continuous alternative in both time and place (frequency) for the FFT spectrogram. Such alternative is found to be the leaky integrated square of the displacement or square of the velocity of the basilar membrane segments. The use of velocity (being the first derivative of the displacement) is preferred over the use of displacement because the use of velocity enhances high-frequency components, this reduces the masking effects of high-frequency components by lower frequency components. Leaky integration describes a process were the system, at each point in time, loses information about its previous state, but learns about the present. In this embodiment the following leaky integration method is chosen:

$$r_s(t)=r_s(t-\Delta t)e^{-\Delta t/\tau}+x_s(t)x_s(t), s-1\ldots s_{max} \quad (1)$$

In this formula $r_s(t)$ denotes the value of the leaky integrated energy of segment s at time t, $\Delta t$ is the sample period, $t-\Delta t$ denotes the time of the previous sample, $x_s(t)$ is the current output value of the channel. The time constant $\tau$ of this first order system determines a scope of memory. For large values of $\tau$ the exponent is very close to unity, for small values the influence of the exponent becomes more prominent since it reduces the contribution of the previous value of $r_s(t)$. The square term $x_s(t)x_s(t)$ is nonnegative. Hence $r_s(t)$ is therefore nonnegative as well.

Equation 1 can be generalised as:

$$r_s(t)=L(x_s(t)) \quad (2)$$

in which equation the function L denotes any form of low-pass filtering. So any kind of low-pass filtering can be applied, however application of a leaky integrator is particularly advantageous since a leaky integrator performs a function, which resembles functions of the human auditory system, as is explained in further on. The signal X(t) may be any form of measure of the local activation. So the half-wave rectified velocity, displacement or acceleration, or any other form giving a (non-negative) measure of the local activation, can be used. However the use of the square of the velocity is particularly advantageous since the velocity is assumed to be the driving force for the hair cells in the human auditory system, and squaring this value is a computationally simple operation, which gives an energy measure.

After the low-pass filtering further steps can be performed to determine the signal. For example, a simple visual inspection of the cochleogram can be applied. In order to provide a reliable approach of the signal, which can be obtained in an automated manner, further steps have to be provided, The invention provides such steps, as will be explained below. However, the invention is not limited to these specific further steps.

The value of $\tau$ is kept at 10 ms throughout this application, but can be adapted. Real neurones perform a leaky integration process as well and 10 ms is a normal value for neurones in the auditory system. While the input of equation 1 is the squared basilar membrane velocity, the neurophysiological equivalent is the all-positive amplitude compressed half-wave rectified basilar membrane velocity. The half-wave rectification is performed by the hair cells in the organ of Corti. The natural system shows a dynamic range compression of the BM movements x that is often approximated as a cubed-root ($\sim x^{0.3}$).

Dynamic range compression is necessary to bring all relevant features within the same range. This is important because $r_s(t)$, computed according to equation 2, has a dynamic range that, due to the nature of natural signals such as speech, can be 50 dB or more. To compensate for the square in equation 2 the effect of the cubed-root is doubled and approximated by $x^{0.15}$:

$$R_s(t)=[r_s(t)]^{0.15} \quad (3)$$

This non-linear dynamic range compression will be used exclusively for visual representations. All visual representations will use this form of compression, unless it is mentioned explicitly.

Since the leaky integration process is low-pass filtering process, the output $r_s(t)$ can be downsampled to sampling-rates in the order of the integration time-constant. To accommodate sharp onsets a sampling-rate of 200 Hz, corresponding to 1 sample per 5 ms, is chosen. This leads to the cochleogram as the desired doubly continuous time-frequency representation. FIG. 2.2 shows the cochleogram of the Dutch word /NUL/ (English: ZERO), spoken by a female speaker. This word is part of a target sentence /NUL EEN TWEE DRIE/ that will be used throughout this application by way of an example of an unknown signal. Although the sample is a sound signal the invention is by no means limited to speech or sound, as is stated before.

In FIG. 2.2, the broad band, starting at approximately t=50 ms and f=220 Hz, is the first harmonic hi corresponding to the fundamental frequency $f_0$. The fundamental frequency rises during the utterance to a value above 350 Hz. The band above and parallel to the first harmonic is the second harmonic $h_2$. The lowest few harmonics form a first formant $F_1$. A second formant $F_2$ becomes visible after the transition from the /N/ to the /U/ at t=120 ms and drops during the /L/ from 2000 Hz to a value of a few hundred Hertz. Notice that this change of formant position entails that different harmonics succeed each other as the most prominent local frequency contribution. A third formant $F_3$, is marginally visible during the /N/ but becomes prominent during the rest of the utterance. In the higher frequency regions a fourth and possibly even a fifth formant are visible.

The transition from the /U/ to the /L/ is smooth, the transition from /N/ to the /U/ is partially discontinuous due to the transition from the nasal /N/ to the vowel /U/. At the end of the /N/ the tip of the tongue leaves the hard palate, allowing the oral cavity to contribute in addition to the nasal cavity. Notice that the onset discontinuity of the word is sharp and the offset is smooth. This is due to the exponential decay of the leaky integration process and the ringing-out effect of the basilar membrane in combination with the non-linearity of equation 3.

A vertical cross-section of the cochleogram at t=175 ms is depicted in FIG. 2.3. This figure shows a representation of the energy distribution as function of segment number (the upper horizontal axis) or the corresponding frequency (lower axis) corresponding to the information under the vertical line in FIG. 2.2. Note the peaked structure. At lower segment numbers the peaks correspond to resolved harmonics. For higher segment numbers the individual harmonics are less well resolved and merge eventually into formants. This behaviour is a direct consequence of the non-linear place-frequency relation. Several harmonics are depicted the figure. The first three, the $9^{th}$, the $13^{th}$, the $18^{th}$ and the $25^{th}$ harmonics dominate the response. The $4^{th}$ to $8^{th}$ harmonics are just resolved, for the $10^{th}$ to $12^{th}$ harmonics exists only minimal visible evidence. These harmonics are (partially) masked by the other components. Although the higher harmonics are not resolved, they still contribute to the shape of the formants and contribute to the timbre of the vowel /U/.

Entrainment of segments is a very important property of a transmission-line model and is due to the fact that the basilar membrane forms a single continuous structure. When a prominent signal component drives a certain segment, the segment will drag its neighbours along and they drag their neighbours along, etc. This effect attenuates rapidly as a function of place. Only signal components that can overcome the recruitment-effect of other signal components will achieve local domination and produce peaks. Entrainment is, like masking, more prominent on the high-frequency side, than on the low-frequency side.

Most figures use a place-frequency relation that has been estimated experimentally. In the original BM-model the resonance frequency of the uncoupled segments is chosen according to the Greenwood place-frequency relation were x is measured in mm from the apex:

$$f_c = 190 \cdot 10^{0.6x[mm]} - 145 [H^7] \quad (4)$$

$$s = \frac{400}{3} \cdot \frac{x \text{ [mm]}}{3.5 \text{ [mm]}}$$

The segment index s can be related to x by using the length of the BM, the number or segments in the original model and the fact that in this embodiment only one out of three segments are actually used.

The interaction between segments, shifts the characteristic frequency to a slightly lower value. FIG. 2.4 shows the Greenwood place-frequency relation as the dashed line. The true characteristic frequency as a function of segment number is depicted as the thin black line. It is always below the Greenwood place-frequency relation. Analogous to the characteristic frequency of a segment, every frequency has a characteristic segment. The actual place-frequency relation is based on measuring the response strength of each segment to a range of logarithmically spaced sinusoids of unit amplitude. The resulting matrix, of which the values are grey scale coded logarithmically, forms the background of FIG. 2.4. Notice that high-frequency segments respond more to low-frequency stimulation than vice-versa.

Since (quasi-)periodic signals consist of a combination of sinusoidal contributions, it is useful to study the response of the BM to single frequency stimuli. The response of the BM to a certain frequency is termed a sine response. Several examples are depicted in FIG. 2.5. Irrespective of the driving frequency, all BM-responses have a similar asymmetrical form with a more prominent tail towards the high-frequency side than towards the low-frequency side.

FIG. 2.5 depicts steady-state situations that can only be reached after a sufficient number (e.g. ten) of oscillations and/or a few (e.g. five) times the integration time-constant t. Natural signals rarely show signal components that change slowly enough to fully justify this steady-state assumption. On the low-frequency side of the BM, the pitch as well as the amplitude are seldom constant enough during the 50 ms or more that are required to reach a steady-state. This results in broader responses than the ideal sine-response. On the high-frequency side of the BM, steady-state is reached quicker, but random fluctuations in the pitch of natural signals broadens the responses here as well.

The integrator and the corresponding cochleogram may be used in the method describe above with reference to FIG. 1, however in all situations where a measure of activation is needed in case of oscillating signal components, the aforementioned procedure can be used.

Estimating Individual Signal Components

Since the BM-model used in this signal recognition system is linear, its response is a summation of the responses to the individual components of the driving sound sources. In the case of a quasi-periodic sound source s(t) the input can be described as:

$$s(t) = \sum_n a_n(t) h_n(t), \, h_n(t) = \sin\left(\frac{2\pi n}{T(t)} t - \phi_n(t)\right) \quad (5)$$

where $a_n(t)$ is the amplitude of the harmonic contribution $h_s(t)$. The harmonic is a function of the period-contour T(t) and a phase function $f_n(t)$.

The cochleogram of this signal is defined by equation 1. The square and a sufficiently long integration time-constant t ensure that the effect of the phase-term $\phi_n(t)$ vanishes, except for some exceptional phenomena that are not considered here. In most cases a(t) changes slowly compared to the value of the time-constant t of the leaky-integration process of equation 1. This means that $a_n(t)$ can be treated (for short intervals) as a constant that scales the cochleogram contribution of $h_n(t)$ with a factor $<a_n^2(t)>$. The < >denotes temporal average as estimated by the leaky integration process. The cochleogram contribution of $h_n(t)$ is denoted as $R[h_n(t)]$. For slowly developing $h_n(t)$, $R[hn(t)]$ can be approximated by the sine-responses as given in FIG. 2.4 and FIG. 2.5.

This means that the cochleogram R(t), resulting from a signal s(t) according to equation 1, can be approximated as:

$$R(t) = \sum_n a_n^2(t)R[h_n(t)] \approx \sum_n w_n(t)R_n(t) \qquad (6)$$

$R_n(t)$ is the response of a unit-amplitude harmonic contribution $h_n(t)$, approximated by a succession of the sine-responses of the best segments corresponding to the temporal development of the local instantaneous frequency $h_n(t)$. The weighting $w_n(t)$ determines the scaling of this sine-response.

In principle, the weighting $w_n(t)$ of the sine-responses is unknown and ought to be estimated from the signal. To estimate the contributions of the individual harmonics of the signal in FIG. 2.3 two different approaches are found to be suitable.

The first approach which is developed by the applicant exploits the asymmetry in the sine-responses by neglecting masking towards the low-frequency side. In this case the signal in FIG. 2.3 is approximated by first weighting the sine-response corresponding to the frequency of the fundamental frequency. This accounts for part of the excitation at the position of the second harmonic, the remainder is attributed to the second harmonic. At the position of the next harmonic, the contribution of the previous harmonics is subtracted and the remainder is attributed to the current harmonic. This process can continue until the frequency of the harmonics exceed the characteristic frequency of the last segment, but in practice it is limited to BM regions where harmonics are resolved. This method works therefore particularly well for the first harmonics and may be used for spectral reconstruction, as is explained below.

The second method developed by the applicant is to find a numerical solution of the matrix equation: Rw=E. In this equation, E is the target cochleogram cross-section, R the set of sine-responses associated with the frequencies of the individual harmonics and w the desired weighting values. When applied to the signal in FIG. 2.3, the fundamental frequency $f_0$ is 1/4.60=217 Hz (as can be estimated from TNC in FIG. 2.8. The associated harmonic frequencies are $nf_0$. The characteristic frequency of the last segment of the BM is 6100 Hz; the highest harmonic number that can be expressed is therefore 28. For each frequency a sine-response can be selected and added to the matrix R. Solving w=R$^{-1}$E (in a least square sense) and setting negative values of $w_n$ to zero leads to the results in FIG. 2.6

The upper panel of FIG. 2.6 depicts the target E with the continuous line, the lower panel presents the scaled contribution $w_n$ of each harmonic. The dot-point-stripe curve in the upper panel gives the weighted sum of sine-responses. As can be seen, the match is very good and the harmonic content of the first three formants can be estimated reliably. The weights of the highest harmonics can only be estimated reliable around formant peaks. At other positions the sine-responses associated with the harmonics overlap almost completely and numerical errors might influence the results. Lower fundamental frequencies exacerbates this problem, but using more segments in the BM-model alleviates the problem.

This second method is an efficient and rather elegant method for analysing the harmonic content of a periodic signal when the fundamental frequency-contour is known. The technique also works when the pitch of the signal changes rapidly. In this case the effects of group delay effects have to be accounted for by choosing a set of frequencies that reflect the local instantaneous frequencies of the harmonics. Yet, this correction is straight-forward if correct pitch-contours are provided.

Tuned Autocorrelation

To split a mixture of signals without certainty about the signals origin requires the use of the weakest possible basic assumptions, i.e. the use of the most general signal properties. An important general property is whether or not a signal is quasi-periodic. In speech, music and a wealth of other signals quasi-periodic signs represent the largest fraction of time and energy. Note that perfectly periodic signals do not occur often. Most natural signals show amplitude and/or frequency modulations due to source properties. This limited the usefulness of the known system presented in Andringa 1997

A sound source y(t) is defined to be quasi-periodic with fundamental period-contour, if for each harmonic $y_i(t)$:

$$y_i(t)=y_i(t+T)(t)) \qquad (7)$$

If the harmonic $y_i(t)$ of the sound source entrains segments of the basil membrane the response $x_s(t)$ of the segment will show quasi-periodicity as well. Consequently:

$$x_s(t)=x_s(t+T(t)) \qquad (8)$$

If T(t) is known, equation 8 can be combined with equation 2 to yield:

$$r_{s,o}(t) = L(x_s(t), x_s(t)) \qquad (9)$$
$$= L(x_s(t+T(t)), x_s(t))$$
$$= r_s, T(t)$$

This means that, under the condition that T(t) is the correct fundamental period-contour, $r_s$, $T_{(t)}(t)$ closely approximates the cochleogram contributions for all segments that are recruited by the sound source y(t). This is important because T(t) is a signal property with a very high probability of being unique for sound source y(t). The set of values is defined $r_s,T_{(t)}(T)$ as the Tuned Autocorrelation (TAC) because it is based on autocorrelation values and tuned to a fundamental period-contour T(t) (and hence also to a fundamental frequency-contour $f_0(t)=1/T(t)$).

Equation 9 holds only for a correct fundamental period-contour. For fundamental period-contours that are not correlated with the contour of the target source, the values of $x_s(t)$ and $x_s(t+T)$ will not correlate and their average will be close to zero. This means that the TAC has values similar to the energy measure of the cochleogram for a correctly estimated period-contour and values close to 0 for randomly chosen or uncorrelated period-contours:

$$r_s, T(t)^{(t)} = \begin{cases} r_{s,o}(t) \mid T(t) \text{ is correct} \\ 0 \mid T(t) \text{ is uncorrelated} \end{cases} \qquad (10)$$

This property forms the basis for the assignment of information of particular sound sources into auditory events.

When it is not known which segments are recruited by the quasi-periodic source, the TAC of all segments is computed using:

$$r_s, T(t)^{(t)} = L(x_s(t), x_s(t+T_s(t))) \qquad (11)$$
$$= L(x_s(t), x_s(t+T(t+d_s)))$$

This formula involves a correction for segment dependent group delay. The response time of a linear system can be formalised as group delay. The group delay of a linear system can be defined as the centre of gravity of the squared impulse response $h_s(t)$ of segment s:

$$d_s = \frac{\sum_t t[h_s(t)]^2}{\sum_t [h_s(t)]^2} \quad (12)$$

Group delay leads to a segment dependent time shift in the expression of the harmonics corresponding to the period contour. The results in FIG. 2.7 are computed using and a correct segment dependent period contour $T_s(t)=(t+d_s)$:

$$r_{s,T(t)}(t)=r_{s,T(t)}(t-\Delta t)e^{-\Delta t/\tau}+x_s^{(t)}x_s(t+T_s(t)) \quad (13)$$

$$s=1\ldots s_{max}$$

The upper panels of FIG. 2.7 show the cochleogram of the word /NUL/ (cf. FIG. 2.2) and the positive values of the associated TAC. The lower panels show the cochleogram of this signal when cocktail-party noise is added resulting in a signal-to-noise-ratio of 0 dB (equality of signal and noise energy). The lower right hand panel shows the associated TAC. Compared with the panel above, most of the prominent structures are conserved. The TAC is not defined over the complete 500 ms, since the period-contour of the sound source is only defined when the sound source is present. Note that negative values of the TAC representation are set to zero in visible representations only. This will be done throughout this application.

A tuned autocorrelation that results from a properly estimated period-contour represents quasi-periodic information consistent with this contour. There is no guarantee that all information belongs to the same source, it is however guaranteed that all periodic contributions of the target source that entrain BM-regions will be represented.

The tuned autocorrelation is very robust. This has several reasons. First the tuned autocorrelation selects all segment ranges dominated by target harmonics. In the case of broad-band signals, like speech, in which a few harmonics or formants dominate, a peaked cochleogram results. The probability that formants, or similar structures, of other sounds produce even stronger peaks that succeed in dominating the same regions even more prominently is usually small (but not zero). This probability is of course strongly dependent on the signal-to-noise-ratio (SNR) and the distribution of energy over the frequency range. With common broadband signals that mask the target speech at a signal-to-noise-ratio of −6 dB (ratio=1:4), the number of unmasked peaks of the target speech is reduced to a level where it becomes difficult to find a set of reliable starting points for the search of auditory events. Human speech perception deteriorates rapidly in these conditions.

A second reason for the robustness of the TAC is that a source does not need to dominate to provide a consistent local contribution. As long as the average contributions $x(t)x(t+T)$ of a less dominant source is larger than the average of $x'(t)x'(t+T)$ of a source that is dominating locally, the less dominant source will, even if it is masked optically, provide a positive contribution. Since there are no peaks, this situation does not provide reliable starting points for auditory event estimation. This might explain why some noisy sentences cannot be perceived on first presentation when the listener does not know what to expect, whereas the same sentence is recognisable when the listener could form a correct expectation. For example, a naive listener might have difficulties with a target sentence at a SNR of −6 dB, while an experienced listener can perceive the target sentence at −10 dB or less.

The most important problem with the application of the TAC is the necessity of a correct estimate of the fundamental period-contour T(t). Since it is not directly available, it has to be estimated from the signal. There exists an abundance of pitch estimation techniques, but none of these performs properly on arbitrary (noisy) signals. The tuned autocorrelation can advantageously be applied in combination with a robust pitch estimation technique which performs properly on arbitrary noisy signal. Such a technique is provided in the section on Pitch estimation.

Presently referring first to FIG. 1.1, there is shown a part of the electro-technical equivalent-circuit diagram of the basilar membrane of the inner ear. On the left-hand side in the figure, an input signal $V_{sound}$ can be presented, which is processed by a series of up to 400 mutually coupled second-order filters, called segments. Each second-order filter represents a certain mass inertia (coils), stiffness and damping, which determines how fast oscillations in the presented signal $V_{sound}$ are damped by the mutually connected second-order filters. Modelled on the actual inner ear, a coupling takes place of the distinct segments to the nerve tracts which transmit the sound signal impressions to the brain.

With the aid of such an electric equivalent-circuit model of the basilar membrane as depicted in FIG. 1.1, the device according to the invention is operative. To that end, the basilar membrane model of FIG. 1.1 is included in FIG. 1.2 in the block having reference numeral 1. To the basilar membrane model 1 a sound signal 2 which may be contaminated with noise is applied. To one or more segments of the basilar membrane model 1 there is connected a low-pass filter 3. This low-pass filter 3 yields an output signal 4 which constitutes an estimate of the input signal 2.

The filter function included in the low-pass filter 3 is chosen advantageously. To that end, in a first variant of the invention, the low-pass filter is designed as a multiplier having a first and a second input, while to the first input a signal is applied which stems from a segment of the basilar membrane and is present for a predetermined period of time, to the second input the signal is applied shifted over an adjustable time T1, and that the multiplier provides a time T1-dependent output signal which is dependent on the frequency substantially present in the signal of that segment and forms a measure for the frequency content of the sound signal.

In another variant of the invention, the low-pass filter is designed as a multiplier having a first and a second input, while for each segment of the basilar membrane, to the first input a signal is applied which stems from that segment, that to the second input the signal is applied shifted over a time T2, and that the multiplier provides a segment-dependent output signal which forms a measure for a frequency energy spectrum substantially present in the sound signal during the period of time.

In a more mathematical formulation and graphic representation, the invention can further be elucidated as follows.

For the calculation of the frequency content and the frequency energy spectrum, use is made of the block diagram in FIG. 1.6, wherein $x_s(t)$ represents the signal stemming from the basilar membrane model 1, and T denotes an adjustable time shift.

Here, $\alpha=e^{-\delta/T}$, and, further, use is made of a time axis (for t and T) which is scaled such that $\delta t=1$.

In the implementation of the device for determining the frequency content, the information signal coming from the basilar membrane model 1 is a segment series s(t) which is a stepwise continuous function, so that within a predetermined period of time in the graphic representation in FIG. 1.7, the segment number is constant. The output set {r s(t), 0(t), . . . , r s(t),Tm (t)} represents the current autocorrelation under the segment contour at time t.

FIG. 1.3 shows a typical curve of the above-mentioned output set at a particular time t, with T indicated on the x-axis.

In the implementation of the device for determining the frequency energy spectrum, the measuring results of the segments from the basilar membrane model 1 that represent the low frequencies appear with some delay with respect to the segments relating to the higher frequencies. For a given signal T(t), this necessitates correction by the formula $T_s(t) = T(t+d_s)$, wherein $d_s$ is the local group delay of segment s.

This leads to the following implementation shown in FIG. 1.8.

In this case an energy content is determined for each segment of the basilar membrane model 1, resulting in an output set {r1, T1(t) (t), . . . , $r_{sm}$,$T_{sm}$(t)} relating to time t.

FIG. 1.4 graphically represents the corresponding measuring result, with the segment numbers of the basilar membrane model 1 indicated on the x-axis.

Further, reference is made to FIG. 1.5 presenting a graphic representation of the autocorrelation values and representing, as variables, time shift T on the x-axis and the segment numbers of the basilar membrane model on the y-axis. It is to be noted here that the embodiment of the device for determining the frequency content of one segment gives a measuring result that corresponds with a horizontal cross section such as it can be determined, for instance, for the segment of the basilar membrane model that has a resonance frequency of about 470 Hz. The device that serves for determining the frequency energy spectrum of all segments of the basilar membrane model gives a measuring result that corresponds with a cross section in vertical direction, for instance taken at t=4.7 ms.

Time Normalised Correlogram

Equation 13 can be generalised to a more general continuous autocorrelation function:

$$r_{s,T}(t) = L(x_s(t), x_s(t+T)) \quad \begin{matrix} s = 1 \ldots s_{max} \\ T \in [0, T_{max}] \end{matrix} \quad (14)$$

This function is a usually implemented as a time-evolving matrix of dimensions (# segments)×(# periods). In this application it is called the Time Normalised Correlogram (TNC). The positive values of the TNC can be depicted in a similar way as the TAC-spectrograms. This is shown in FIG. 2.8

This figure shows the TNC for t=175 ms in the middle of the /U/ of NUL. The vertical line at T=0 corresponds to the energy spectrum that was depicted in FIG. 2.3. The vertical band at T=4.6 ms represents the TAC for the fundamental period $T_0$. This band is repeated around 9.2 ms for $2T_0$. These bands form the peaks of a large vertical structure that narrows as the frequencies of the individual harmonics increase. Each broadband quasi-periodic source has a similar structure, of which the overall structure is exclusively determined by the instantaneous fundamental period.

Of central importance is that the TNC is continuous in time, periodicity and place (with place related to frequency). The name TNC is derived from the fact that its definition in equation 14 ensures that if a quasi-periodic signal starts at time to, its TNC starts to build-up at this time irrespective of the period T of the signal: for $t<t_0$ the temporal average of x(t)x(t+T(t)) is close to zero, while after t0 it is large and positive and independent of the value of T(t). This form of time-of-onset normalization helps to study the temporal development of all types of sources. A more elaborate discussion, where different definitions of correlograms are compared, is given later in this section.

Since it is unlikely that uncorrelated sources show a similar development of the instantaneous fundamental frequency, the probability is low that the vertical structures of different sources overlap. This is not the case for the energy term at T=0 where all sound sources get expressed on top of each other. The introduction of periodicity as an extra signal dimension, allows not only a mixture of a periodic and an a-periodic signal to be split, but also mixtures of quasi-periodic signals! Note that this is partly an idealisation: the combination of two or more quasi-periodic signals leads to a super-position of the individual TNC's that is more difficult to interpret than a single one.

The vertical cross-section of the TNC corresponds to an autocorrelation lag T for all segments s. The horizontal cross-section corresponds to the full running autocorrelation of a single segment. For a-periodic signals the correlation would drop rapidly as a function of T, but since this source is periodic, the autocorrelation has the appearance of a cosine. Notice that most segments are dominated by a single harmonic. This is most prominent for segments that correspond to the lower harmonics. The periodicity of the local running autocorrelation reflects the frequency of the segment's main driving force as a function of time. The first period that occurs in all segments is 4.60 ms that corresponds to 217 Hz. For the second harmonic the second period peaks at 4.6 ms. This corresponds to an instantaneous frequency of 1/(4.612)=434 Hz, as expected. Just above 2000 Hz a region of the BM is dominated by the ninth harmonic. This region corresponds with the second formant. Note that the position of the tenth harmonic cannot be estimated as it is masked by the ninth. The third formant gets expressed just below 3000 Hz and is dominated by the 13th harmonic at: 2826 Hz. Note that the TNC allows the determination of instantaneous local frequencies with very high accuracy. This is a direct consequence of the avoidance of a frame-based approach and the conservation of continuity. The details of the local frequency estimation algorithm are explained further on.

The TNC is an extremely rich representation, but its most important feature is that the TNC can represent arbitrary continuous paths through time (t), place (s) and periodicity (T).

This means that if we know or hypothesise a period-contour T(t) as a source property we can investigate the consequences of T(t) as a continuous function of time. On the other hand, if it is known that a segment sequence s(t) represents information of a single sound source, it is possible to use the TNC to study the development of information represented by the running autocorrelation under the segment sequence s(t). Using a time dependent path along segments is advantageous since the fundamental period of a signal is not constant in time for a large variety of signals, such as speech sound and music sound.

Note that the TNC uses a deliberate choice of the direction of the correlation. For frame-based autocorrelations based on:

$$r(n) = \sum_{t=0}^{N} x(t)x(t \pm n) \quad x(t) = 0 \text{ if } t\phi\{0, 1, \ldots, N\} \quad (15)$$

it makes no difference whether the correlation is based on lags corresponding to t+n or t−n. As long as all contributions are summed, the result is the same. The convention is to choose a minus sign, since it resembles a causal system without delay. For a continuously updated (or running) autocorrelation, the choice for 't−n' leads to a different temporal ordering of information than an implementation based on 't+n'.

Three different continuous implementations of a leaky integration based correlogram will be discussed in this section. However, the invention can be applied with many other correlator variants. The first choice is:

$$r^-_{s,T}(t) = L(x_s(t), x_s(t-T)) \quad \begin{array}{l} s = 1 \ldots s_{max} \\ T \in [0, T_{max}] \end{array} \quad (16)$$

This equation is the defining function of the matrix elements of a time-evolving matrix. Conform equation 11, denotes the value of the autocorrelation of segment s and autocorrelation lag T. The superscripted '−' refers to the minus-sign in the last term. The matrix-indexes of the s-dimension span and those of the T-dimension span, with. Again, $x_s(t)$ denotes the output of BM segment s. This implementation is causal without the need for a delay.

A second implementation, defining the TNC, looks forward in time:

$$r^+_{s,T}(t) = L(x_s(t), x_s(t+T)) \quad (17)$$

Dropping the indices, this implementation will be referred to as $r^+(t)$. Because future information cannot be processed before it is available, this implementation entails a time-difference between the current time t and the moment the full correlogram is available of $T_{max}$ (e.g. 12.5 ms).

A form of group delay normalisation is often performed. During normalisation, group delay is treated as a delay, instead of a combination of a delay and a temporal smearing of the expression of energy. Group delay normalisation is performed by time-shifting the response of a basilar membrane segment with the local group delay $d_s$. The information of high-frequency segments at time t is combined with information of low-frequency segments, 30 ms or more later in time. This leads to a representation of the energy expression that is sometimes convenient, group delay normalisation can be performed either with a '+' or a '−' sign. Only the '+'-version is considered here, but a '−' version is possible as well:

$$R^{gd}_{s,T}(t) = L(x_s(t+d_s), x_s(t+d_s+T)) \quad (18)$$

Compared to equation 14 an even longer delay is necessary. While the minimal delay in equation 14 was $T_{max}$, now the delay is $T_{max}+d_s$. The inverse of $T_{max}$ is the lowest frequency to be expressed in the correlogram. For speech, a useful lower limit is 80 Hz or 12.5 ms and the corresponding group delay is 28 ms. The combined delay is consequently more than 40 ms. More important than this delay might be the fact that $r^{gd}(t)$ presents information that, originally, was separated 30 ms or more in tie. With a frame sampling rate of 5 ms, this corresponds to 6 frames or more.

From the viewpoint of the conservation of continuity, equation 18 conserves continuity of time less well than the other implementations. In these implementations a change between neighbouring segments a and b at time t involves a minimal step in time, while in the case of group delay normalisation the effective change is:

$$s_a(t) \rightarrow s_b(t+\Delta t+d(s_b)-d(s_a)) \quad (19)$$

Because the group delay differs slightly between neighbouring segments, an additional temporal shift is introduced that may reduce the validity of the continuity assumption during rapid changes of signal. Since the continuity of the TNC is a basic assumption (i.e. an assumption that cannot be checked during processing), violations of continuity may lead to unpredictable results. However, group delay itself is a continuous function of place in the transmission line model used here. This implies that continuity remains guaranteed in the combination with group delay.

Natural signals are rarely stationary, so we must choose the correlogram version that is most suited to reflect non-stationary signals. This is the TNC, because compared with $r^-(t)$ and $r^{gd}(t)$ it reflects onsets and signal changes the moment they occur. Furthermore the way $r^-(t)$ builds up leads to all kids of practical problems in the context of the tasks and solutions of the rest of this overview; particularly during onsets and rapid changes. The $r^-(t)$ is therefore not a suitable choice. The combination of a minus sign in combination with group delay normalisation complicates this further. This is the reason why it was not considered in the first place.

Using group delay normalisation is not necessarily required. However, unlike $r^-(t)$, $r^{gd}(t)$ can be used without additional problems. It provides a visible representation with the effects of group delay partially corrected.

Estimation of Ridges

The instantaneous local frequency information as obtained with the TNC forms the basis for the optimal estimation of pitch-contours in unknown noisy circumstances. Computationally the TNC is extremely inefficient since it is of the order (# segments)×(# samples per second)×(# periods). For 100 segments, a sample frequency of 20 kHz and a maximum period of 25 ms (500 different values) this corresponds to $10^9 \times$(2 multiplications+1 addition) per second. Although it is possible to increase the efficiency of the computation considerably, a more efficient approach is required.

This approach is found by determining regions in the cochleogram that are likely to provide prominent information about a single signal component (e.g. a harmonic). As discussed in the context of FIG. 2.3, each signal contribution tries to recruit a region of the basilar membrane. This means that each position is generally dominated by a single signal component. Furthermore, all these regions show a peak at the position that corresponds to the frequency of the signal component. This means that each peak corresponds to a single signal component. Signal contributions like the 10th to 12th harmonic in FIG. 2.3 are almost completely masked by stronger contributions and do not show up as separate peaks. When the search space is reduced to peaks in the cochleogram, one efficiently selects positions where information of individual signal components can be estimated reliably.

To reduce the number of spurious peaks, ridges can be formed by combining peaks through time. All peak-positions that cannot be classified as members of reliable ridges (the selection thereof is explained in more detail in the section on reliability measures) are discarded. This leads to FIG. 2.9 which shows two complementary representations: the left hand panel gives the ridges as estimated in 0 dB cocktail-party noise superimposed on the cochleogram of /NUL/. The right hand panel shows the complementary information: the noisy cochleogram with the ridges as estimated in a clean signal.

The panels allow a convenient comparison between ridge estimates in noise, versus estimates in clean situations. The ridges estimated in the noisy signal often coincide with the most prominent peaks of the clean target. Since the ridges are estimated from a noisy signal they also represent positions where information of the source dominates. As can be seen in the right hand panel, the cocktail-party background consists mainly of the intensity peaks in speech of other speakers. Since these intensity peaks last shorter than the whole sound source, the ridges will be less reliable. For backgrounds consisting of a lot of uncorrelated sources, or backgrounds containing a-periodic noises this is often the case. This requirement helps to solve the problem since it efficiently reduces the search space by pinpointing the most important sources of information.

An important case arises when two signal contributions have frequencies that correspond to a single segment or its close neighbours. In this case, periods with constructive and destructive interference alternate. This results in amplitude modulation with a period that is the inverse of the frequency difference between both signal components and the formation of a ridge at the position corresponding to the weighted mean frequency of both components. The leaky integrated energy value associated with this ridge shows amplitude modulation. In noisy situations this may result in interrupted ridges.

Another important interaction between signal components arises when the signal components correspond to segments that are further apart, so that both entrain their corresponding best segment. Somewhere in between (due to the asymmetrical nature of masking usually close to the high-frequency segment) segments exist that feel a comparable influence from both components. These segments must follow two different frequencies without rupturing the BM. Consequently the average local amplitude (and consequently the corresponding energy) is small. The corresponding local energy is small as well. This leads inevitably to a situation with two peaks separated by a valley. For signal contributions that persist for some time, the corresponding peaks string together to form temporal ridges. This proves the existence of stable ridges corresponding to sufficiently separated continuously developing signal components.

Estimation of Running Autocorrelation

The local instantaneous frequency-contours are estimated using a running autocorrelation. Using the new method to determine the ridges, we now have a set of continuous ridges $\{s_i(t)\}$ and since the TNC is continuous in time t and place s, it is possible to compute a running autocorrelation along the ridge s(t) as:

$$r_{s(t),T}(t) = L(x_{s(t)}(t), x_{s(t)}(t+T)) \tag{20}$$

$$T = [o, T_{max}]$$

As the peak position changes smoothly, so does its associated autocorrelation. Note the symmetry with the tuned autocorrelation of equation 13. That equation represented a set of functions over all segments s with period-contour T(t) as a function of time, while equation 20 is a set of functions over all T with the segment sequence s(t) as a function of time. The TAC describes vertical cross-sections of the TNC and the running autocorrelation a horizontal cross-section.

Typical examples of autocorrelations estimated this way are given in the left hand panels of FIG. 2.10. The upper autocorrelation is a typical well formed example that is representative for a large majority of ridges. In some situations the autocorrelation shows a mixture of frequency contributions. The lower autocorrelation gives an example where the third harmonic is partially masked by the second. This leads to a confused autocorrelation and a more complicated or even impossible Local Instantaneous Frequency (LIF) estimation (as described in the next section). The system assumes a well-formed autocorrelation. Ill-formed autocorrelations occur occasionally and lead to (incorrect) LIF estimations that do not correspond to the segments characteristic frequency. It is found that these values can be discarded.

Estimation of Local Instantaneous Frequency Contours (LIF)

The autocorrelation in the upper panel of FIG. 2.10 corresponds to the fourth harmonic of the target signal of FIG. 2.9 at time t=285 ms. This situation is chosen because it does not correspond to a very prominent ridge and the local frequency is changing rather rapidly. The local instantaneous frequencies can be approximated by computing the average peak distance, in this case 13 oscillations that fit in 12.0 ms. This is equivalent to 1083 Hz. But, as will be shown, this is an unnecessary application of quasi-stationarity that results in the average local frequency between t=285 ms and t=285+12 ms.

The use of a first order approximation of the development of the interpeak distance improves the local instantaneous frequency estimation. This can be implemented by taking the distance in samples between peaks and fitting a first order model through these values. The value of this model for the autocorrelation peak at T=0 yields an estimate for the LIF. This is an efficient method, but this method may suffer from temporal discretisation effects since the sample period of 0.05 ms is not insignificantly small compared to the local instantaneous period of 0.94 ms.

Temporal discretisation effects are reduced by improving the estimation of the peak positions using a three-point quadratic fit. This leads to a tenfold improvement of the peak position estimation. The right hand panel shows the frequencies that correspond to the re-estimated inter-peak distances and the linear fit through these values. The resulting LIF value at the position of peak 0 is 1064±5 Hz. The error is less than 0.5%. For speech sounds, fluctuations in pitch prevent a higher accuracy. Note that the LIF changes 25 Hz or 2.35% per 10 ms. A rate of change of 2.35% per 10 ms corresponds to a factor 10, or 3.3 octaves, per second. These are natural values for spontaneous speech.

The local instantaneous frequency estimation is very accurate in both time and frequency because fixed time-windows are avoided. The estimation of the local instantaneous frequency using a windowed signal is limited by the application of quasi-stationarity and the trade-off between temporal and frequency resolution:

$$\Delta t = \frac{1}{\Delta f} \tag{21}$$

The choice of the width of the window determines the temporal resolution as well as the frequency resolution. Increasing the size of the window reduces temporal resolution $\Delta t$ but increases frequency resolution $\Delta f$ and vice versa.

Additional assumptions about the signal, such as assuming that the signal consists of a single harmonic complex, can increase instantaneous frequency estimation, but with arbitrary signals the validity of these assumptions cannot be guaranteed.

The TNC-based LIF-estimation is subject to equation 21 as well, but in a different way. It is based on entrainment and limited to signal contributions that lead to ridges. This means that two components with frequencies corresponding to neighbouring segments cannot be resolved since they lead to a single ridge. The same is true for situations where one component masks the other. This inability can be alleviated by increasing the number of BM-segments and sharpening the response-curves. But sharpening the response-curves lead to an increase in group delay according to equation 21. In a transmission-line, equation 21 Δt can be interpreted as group delay while Δf denotes a measure of the sharpness of the tuning-curves.

The accuracy of TNC-based LIF estimation is therefore limited to signal components that produce ridges. It is further limited by the number of peaks and the accuracy of the peak position estimation in the running autocorrelation. And finally it is limited by the validity of the first order approximation. In the case of slowly changing signal contributions, stable ridges are formed and the maximal lag of the autocorrelation can be chosen to represent a number of periods that allows a very accurate LIF-estimation without invalidating the first-order approximation. Note that the error associated with the first-order fit provides a measure of the reliability of the estimate. This can, for example, be used during pitch estimation.

FIG. 2.11 gives examples of a few autocorrelations estimated a time t=250 ms (see FIG. 2.9) from the noisy /NUL/. The lower panel shows the running autocorrelation of the ridges 2, 4, 6, 7 and 8 (numbering starting from lowest ridge) at t=250 ms in the left hand panel of FIG. 2.9. The autocorrelations suggest that these ridges arise from harmonics that belong to the same source: they all agree on a periodicity of 4.10 ms (244 Hz). The upper panel shows the autocorrelation of ridges 1, 3 and 5 that do not agree with this periodicity. Of these ridge 3 and 5 might agree on a periodicity of 2.9, 5.8 or 8.7 ms.

The local instantaneous frequency estimation is robust to noise. LIF values are computed and depicted in FIG. 2.12 for two conditions: the dots are the values of the local instantaneous frequencies as estimated from the clean /NUL/. The stars are estimated from the noisy /NUL/. Note that most frequency contributions in the clean signal remain clearly present in the noisy environment. A closer examination shows that the perturbation is often less than 2 percent. This indicates that the ridges form a very reliable source of information for the estimation of individual signal components.

Fundamental Period-contour Estimation

The development of a reliable and robust pitch estimation technique is difficult. The main reason for this is that it is generally impossible to determine which signal contributions or signal properties belong to a certain source prior to recognising the sources. This is a direct consequence of the inability to determine the signal type, for example whether the signal is speech or not, without being able to recognise the signal.

Yet although this problem is generally insoluble, some features, like smoothly developing harmonics, can be used. They can be used as long as the user ensures that other types of sounds do not occur, unfortunately this not what one wants for a system that can deal with unknown situations.

Two fundamental period-contour estimation techniques were developed: one for clean signals that is described in the section: estimation of the pitch of clean signals, and one for signals contaminated with noise or containing signals from multiple sources that is described in the next section.

Robust Fundamental Period Contour Estimation for Noisy Signals

This section describes an embodiment of a technique to estimate period contours of complex signals. It is split in two parts. The first part gives an overview, the second part provides a more detailed overview.

This property is used for the contours as depicted in the lower panel of FIG. 2.14. The upper panel of FIG. 2.15 shows all fundamental period-contour hypotheses consistent with the smoothed contours of FIG. 2.14. Some of the fundamental period-contour hypotheses overlap or extend each other smoothly. This is a strong indication that the period-contours stem from the same source: the probability that uncorrelated period-contours form a consistent whole is small. The lower panel depicts a selection of the upper panel based on three main criteria: the contours must have a certain minimal length, for example 50 ms, they must be sufficiently smooth and in case of multiple concurrent contours only the longest contours are selected. This results in a strong reduction and it often results in a set that includes a more or less correct pitch-contour candidate.

The finale step compares the remaining concurrent candidates with the original local periodicity information, depicted in FIG. 2.14 to determine which candidate explains most of the period values and, to prevent octave errors, has a reasonable ratio of odd and even harmonics. The candidates that meet these demands best forms the final output of the algorithm.

FIG. 2.16 shows a comparison between pitch-contours estimated from signals with different signal-to-noise-ratios of babble-noise. Apart from some differences during on- and offset the algorithm is able to find the correct contours for SNR's of −3 dB and better. When the algorithm produces a correct contour, the match is usually well within 1% of the actual value. The algorithm identifies the regions where the most prominent harmonics of the target sounds are still quite able to dominate locally in these conditions and further uses periodicity information to find the pitch-contour that combines as much of these regions as possible. Because the periodicity information in these regions is still virtually unimpaired, the pitch-contour must be of similar quality as estimated in clean conditions. During onset and offset the local signal-to-noise-ratio is more unfavourable making it more difficult to determine the period-contour unambiguously.

Since the pitch-contour estimation technique looks for long, smooth and well supported fundamental frequency-contours, it finds all combinations of evidence that can be supported.

Fundamental Period-contour Estimation in Noise

The development of a reliable and robust pitch estimation technique is not straightforward because it is generally impossible to determine which signal contributions or signal properties belong to the target class prior to recognizing the signal. A first period-contour estimation device is developed for signals like speech produced in complex, unknown and variable environments. It is designed to be very robust. A description of this device will be given in this section. A second fundamental period contour estimation device is developed for noiseless signals: its function relies on the assumption that the target is not contaminated with noise. This device is based upon the property that all harmonics of a periodic source show a common periodicity. This invention will be presented in the section: Fundamental period estimation for noiseless signals.

Indicators for reliable sources of information are found to be:

1. the most energetic ridges at each moment
2. long ridges
3. smooth ridges
4. ridges with frequencies that correspond to the local characteristic frequency Ridges in which more of these features are combined are particularly reliable. The presented embodiment uses an approach that operates on the complete utterance, but it is possible to reimplement the device in a way that provides estimates of period-contour hypotheses with a delay of only 100 ms or less. The lower limit of this delay is determined by a combination of group delay effects, the temporal scope required for the computation of local frequencies and, most importantly, the number of period hypotheses the system is allowed to produce. With a delay of 50 ms the system has less information available to reduce the number of likely fundamental period candidates than when it is allowed to integrate information over 100 ms. Optionally, the delay depends on the signal itself: very reliable infromation requires a small delay, while less reliable information requires more and longer processing.

This section describes a device that relies on a set of fixed criteria that work well in most circumstances. The next section presents a set of reliability measures that can replace the fixed criteria of this embodiment to enhance the flexibility and reliability of the implementation.

This embodiment uses the period domain, alternative implementations might use the frequency domain.

FIG. 3.6 provides an overview of the five steps of the robust fundamental period-contour estimation algorithm.

Step 1 estimates ridges and local instantaneous period contours (the inverse of the LIF contours). Step 2 selects the most reliable instantaneous period contours. Step 3 clones these contours to all possible fundamental period contours. Step 4 combines the cloned period contours to reliable fundamental period contour hypotheses. Step 5 is optional and selects the most reliable fundamental period contours, so that at each moment only a single fundamental period contour hypotheses exists.

The input for the algorithm is the information as represented in FIG. 2.9 and encompasses the cochleogram, the ridges and the local instantaneous period.

The first step has already been described in the section on LIF estimation.

The second stage of the algorithm is the selection and smoothing of the most energetic ridges. This algorithm starts with the detection of instantaneous periods whose corresponding best segment differs more than one segment from the ridge's best segment. These period values are replaced by the segments characteristic period (also called best period).The available information is depicted in the upper panel of FIG. 2.14 For visual clarity only periods smaller than 5 ms (i.e. frequencies higher than 200 Hz) are depicted. Since this representation is based on a situation with a signal-to-noise-ratio of 0 dB it shows a lot of spurious contributions that must be discarded.

Each ridge is followed, and as long as successive periods are within 5% of each other they are assigned to the same period-contour. When two successive periods are not within 5%, an additional check is performed to check if the next value is within 5%. If a valid next value can be found, the gap is filled with the average of its neighbors, otherwise a new contour is started. All contours are augmented with a smoothed version p(t) of the contour (see the lower panel of 2.14). Smoothing is performed using a 5-point (25 ms) linear approximation. In the middle of the contour the smoothed local period is based on a local neighborhood of 2 frames on each side. In the two first or last points of a contour the smoothed period values are based on the corresponding values of the first order approximation. Finally, the average ordinality of each contour is computed. The ordinality is a measure of the relative importance in terms of energy. A segment of the most energetic ridge has ordinality 1, the second most energetic segment has ordinality 2, etc. A period-contour is accepted whenever its length exceeds 50 ms and its average ordinality is smaller or equal than 2, or alternatively whenever its length exceeds 75 ms.

The smooth ridges p(t) might, or might not, stem from harmonics of the target speech. It is assumed that each contour represents a single harmonic number from start to end. If the harmonic number n would be known the fundamental period p0(t) would be known, since:

$$p_o(t) = p(t)n \text{ or } f_o(t) = \frac{f(t)}{n} \quad (22)$$

As a further limitation, valid fundamental period values are limited to values between 2.5 me (400 Hz) and 13.3 ms (75 Hz), a range that spans most speakers. For example a period p=6 ms can be the result of the second harmonic of a fundamental period p0=12 ms, or the first harmonic of p0=6 ms. A period p'=2 ms can represent any harmonic number in the range of 2 to 6. This corresponds to any p0 in the set {4, 6, 8, 10, 12} ms. If p and p' stem from the same source, they share the same fundamental period p0. In this case either 6 or 12 ms.

As visualised in the upper panel of FIG. 2.15, the smoothed period-contours are multiplied by each possible harmonic number and cloned to all possible fundamental periods. This involves a change in the correspond characteristic segments of the contours, and since each segment has its own group delay this implies a temporal shift according to:

$$t \rightarrow t + d(s_{np}) - d(s_p) \, nt\{1,2,\ldots\} \quad (23)$$

d(sp) and d(snp) are the group delays associated with the segments that are most sensitive to respectively period p and period np. Note that this time-shift implicitly defines the instantaneous fundamental period as the period of the first harmonic.

The third step combines the cloned contours into smooth fundamental period-contour hypotheses. This is a complicated process since contours can often be combined in different ways. When the local periods of two cloned contours fall, on average, within 3% of each other they are combined into a single hypothesis. Contours that partially or completely extend each other are combined when a second order fit can be estimated that matches both contours within 3% during 25 ms. The time-shift of equation 22 is very important because it allows a reliable comparison between multiple contours. When this form of group delay correction is absent, contours of the same source will not be combined during rapid changes of pitch. Finally fundamental period hypotheses shorter than 50 ms are discarded. This results in a strong reduction and it often results in a set that includes a more or less correct pitch-contour candidate. This set is depicted in the lower panel of FIG. 2.15. The current set of fundamental period contour hypotheses might form a suitable output. But for application in which it is important to choose maximally one period contour per time step an optional last step is possible.

This optional fifth and last step involves a forced choice between concurrent contour hypotheses. When applied in standard ASR-systems this is a very important stage since it determines which auditory events will be formed. This choice decides which part of the signal will be interpreted according to the expectations and limitations of the recognition system. Errors at this stage will lead to recognition errors. This warrants a very careful decision process that is based on all available information: i.e. all ridges and their corresponding instantaneous periods. The decision process chooses at most a single period-contour for each moment, The selected hypothesis maximizes the number of instantaneous period values that it can claim as a possible harmonic, in combination with a fair distribution of even and odd harmonics.

The number of claimed harmonics by fundamental period-contour hypothesis p(t) is determined by counting the number of instantaneous period values that satisfy:

$$\cos\left(\frac{p(t+ds)}{p_{s,t}}e\pi\right) > 0.95 \quad (24)$$

ps,t is the instantaneous period value derived from a ridge at time t in segment s. And p(t+ds) is the fundamental period hypothesis that is group delay corrected with a value ds to denote the expected instantaneous fundamental period the position of segment s. Again group delay correction is necessary because the instantaneous frequency information of different regions of the basilar membrane is compared. The criterion of the equation above is equivalent to accepting a deviation of 5.1% around the expected value.

A variant of this equation can be used to count the number of odd and even harmonics that are within 5.1% of the expected value:

$$N_{p(t)} = N^o_{p(t)} + N^e_{p(t)} \quad (25)$$

$$= \sum_i \left[\cos\left(\frac{p(t+d_i)}{p_i}\pi\right) < -0.95\right] + \sum_i \left[\cos\left(\frac{p(t+d_i)}{p_i}\pi\right) > 0.95\right]$$

The index i refers to all possible period values ps,t, while p(t+di) is the required group delay correct value for the local instantaneous fundamental period reflected at time t in segment s. Np(t) is the total number of accepted harmonics, Nop(t) and Nep(t) are the number of odd and even harmonics. In this case the odd harmonics fall around the minimal values, while the even harmonics coincide with the maximal values of the cosine function. The square brackets denote a Boolean value: 1 if the statement is true, 0 if the statement is false.

The beat hypothesis of two or more concurrent hypotheses is the one that maximizes:

$$\text{Average \# harmonics per frame} \cdot \text{Fraction odd harmonics} \quad (26)$$

$$= \frac{N_{p(t)}}{L} \cdot \frac{N^o_{p(t)}}{N_{p(t)}} = \frac{N^o_{p(t)}}{L}$$

L is the length of the fundamental period-contour hypothesis expressed as a number of frames. Both criteria are important. The average number of claimed harmonics is a measure of the quality of the hypothesis: short hypotheses that claim a large number of harmonics per frame are usually to be preferred over longer hypotheses that claim a lower number of harmonics per frame. The fraction of odd harmonics is low when the fundamental period-contour is an octave too low. This happens quite often, because spurious contributions tend to increase the average number of claimed harmonics. The combined criterion reduces to the average number of odd harmonics per frame. This simple criterion has a high probability to select the correct hypothesis.

The selected hypothesis is reestimated and smoothed using all claimed harmonics. The smoothing is similar to the smoothing applied in the first stage. Since all claimed harmonics contribute to the estimation, the number of data points is much larger. The local linear approximation in each frame is now based on all data points that correspond, after group delay correction, to an environment of 25 ms. When 25 data points exist that correspond to a smaller environment, the local estimation is based on these 25 points. The use of equation 22 defines the fundamental period-contour as the instantaneous period-contour of the first harmonic. To comply with the demands of the selection algorithm in section Selection of periodic signal contributions the period-contour is time-shifted to reflect the instantaneous period of the source instead of the instantaneous period of the first harmonics.

The final output of the algorithm is a sequence of parameters that define the first order approximation at each frame. One parameter gives the local instantaneous fundamental period, the other the temporal derivative. Since both are smoothed temporally, the actual period may fluctuate around the estimated values. The technique described in Selection of periodic signal contributions decides on the final and most optimal value.

FIG. 2.16 shows a comparison between pitch-contours estimated from signals with different signal-to-noise-ratios of babble-noise. Apart from some differences during on- and offset the algorithm is able to find the correct contours for SNR's of −3 dB and better. When the algorithm produces a correct contour, the match is usually well within 1% of the actual value. The device identifies the regions where the most prominent harmonics of the target sounds are still quite able to dominate locally and the device uses periodicity information to find the pitch-contour that combines as much of these regions as possible. Because the periodicity information in these regions is still virtually unimpaired, the pitch-contour must be of similar quality as estimated in clean conditions. During onset and offset the local signal-to-noise-ratio is more unfavorable making it more difficult to determine the period-contour unambiguously.

Experiments suggest that the algorithm can estimate correct period contours in more than 95% of cases or more for most noisy situations with an SNR higher than 0 dB. In these cases it allows a very good TAC-estimation. Between 0 and −3 dB the probability of a correct estimation reduces to 70%, below −3 dB the device is not reliable due to the fixed parameters. Its reliability can be increased using the reliability measures presented in the next section.

In the next section an alternative method is presented to determine the possible pitch values at each (sampling) moment in time (step 3). These values can than be connected to from pitch contours in a manner similar to the procedure described for the estimation of ridges (as described in the section on ridge estimation). The formation of a global reliability score for these pitch contours is also outlined in the next section.

This alternative method allows the determination of pitch contours with a minimal delay, as mentioned before in this section.

Reliability Measures

As described before, the fundamental period contour estimation selects the most reliable information. When reliability measures have to be determined at the highest level of the system (selector device), reliability measures determined at lower levels play an important role. The reliability measure(s) at a certain level is (are) constructed from reliability measures available from lower levels, as well as from new information obtained at the level itself. From the lowest to the highest level the following measures of reliability can be defined:

1) The reliability of individual peaks in the energy output at a certain moment in time. This measure depends on the local signal to noise ratio (SNR).

2) The (global) reliability of a ridge can be constructed from the (local) reliability values determined for the peaks that are used to construct the ridge. Other influences may come from the length of the ridge and the continuity of the ridge (in both position and energy).
3) The reliability of frequency contours depends on the reliability of the ridge under which the frequencies are determined. Also the continuity in frequency may play a role, as well as the fit of the autocorrelation with a standard shape.
4) During the selection of the ridges reliability measures are not determined but contribute to the reliability at higher levels by selecting only ridges that can be assumed to belong to the same source.
5) The (global) reliability of a pitch contour is constructed from:
   the reliabilities of the ridges contributing to the determination of the pitch/the ridges fitting to this pitch contour
   a goodness-of-fit measure determined within the pitch determination method.
   continuity of the pitch
6) The reliability measure of the final selection can be based on the reliability of the pitch contour on which the selection is based. Also, the amount of masking possibly present at every position can be determined and used give a reliability score that depends on time and place.

The above mentioned measures will be explained in more detail below. With reference to FIG. 3.1., peak search and estimation of local SNR will be explained in more detail below. At every moment in time peaks can be found in the energy output of the BM model. These peaks are local maxima (of the energy as a function of position). The position of the peak can be determined with higher precision than the discretisation steps used in the model, by using a quadratic interpolation. The next step is to search a peak template (in a pre-determined set of peak templates) that has a peak closest to the position of the local maximum. This is done for all peaks individually.

Next, the points of the energy spectrum (ES) that fit well to the template (grSpec) have to be determined. A fit method using the vertical distance between ES and grSpec would lead to a bad fit at the steep slope of the template, whereas the fit would be much better at the shallower regions. Therefore a method was constructed using the angle of rotation needed to place a point of ES on the template grSpec. This method starts at the peak position. First it checks the point to the left of this position. If the directions in which the point on ES and the point on grSpec can be found are not more than a degrees apart, it is assumed that the ES point could be placed on the template grSpec, and attention is turned to the next point. As long as the angle of rotation, required to place the ES point on the template grSpec, is less than a degrees, the points of ES are assumed to fit to the template. When a point is found that would require a rotation larger than a degrees, the point is classified as non-fitting and the search to the left is ended and the process repeated on the right-hand side of the peak.

FIG. 3.2a shows an energy spectrum, with a template for one of the peaks. In FIG. 3.2b the cosine of the angle of rotation required to place the ES points on the template are given. It is clear that the cosine is close to 1 (small angles) for points near the peak. The change to values near 0, or even negative values, is rather abrupt and corresponds well with the limit of the region we would intuitively indicate as fit-region. In FIG. 3.2c finally the points branded as fitting well to peak templates are colored red.

FIG. 3.3a shows the energy output of the cochlea as a function of time and position for the signal 'one four zero'. In 3.3b the areas colored red are the parts classified as fitting to peak templates.

If an area is determined that fits to a peak, a measure can be obtained for the local SNR. This measure should give the ratio between the energy at the peak and the energy at the ends of the fit region. Because the values at both ends can be very different, an average between the two is used. It should be noted that because the dB scale is a logical scale to use for SNR, the SNRs for both sides are determined in dBs and then averaged. In FIG. 3.3c the fit areas are color-coded with the SNR values determined for the fit regions. FIG. 3.4 gives the results of this technique in noise conditions (car factory noise, 0 dB) It is clear that the method identifies the regions where reliable information can be obtained for determining frequency content of voiced parts of a speech signal in noise.

In this application a description is given of the determination of local frequency under a ridge. Because the signal under a ridge is approximately sine-shaped, and the frequency close to the local characteristic (or best) frequency fc, the autocorrelation can be assumed to have a cosine-shape, with its first maximum at the delay corresponding to 1/fc. This implies that 1/fc can be taken as a first estimate for a peak search, which can e.g. use interpolation to find the peak considerably faster and more accurate than the describe method. As an extra measure of reliability, the correspondence between the autocorrelation values and the assumed cosine shape can be determined.

In the previous part ridges have been determined. Now it has to be determined which ridges belong together and/or which ridges belong to the target source. For this the assumption is used that our target has a uniquely defined pitch at each moment in time (in each 5 ms frame). We therefore have to determine which ridges share a common pitch. In other words, we have to find a pitch frequency that would explain most of the ridges found. This pitch estimate can then be used in the following section, as a basis for selection of the source from the background.

The pitch estimation uses the frequencies of all the ridges as determined in the previous section. These frequencies form the input to a so-called sub-harmonic summation (see JASA 83(1) January 1988 Measurement of pitch by subharmonic summation, D. J. Hermes for a detailed description).

This sub-harmonic summation operates as explained below. For each frequency that has been found the pitch values that could have given rise to this frequency are determined. These possible pitch values are called sub-harmonics. To avoid large numbers of possible pitch values, especially in the low frequency range, the range of possible pitch values has been limited to [45 Hz–400 Hz]. This range spans the pitch values found in human voices. Also the range of possible input frequencies has been limited (to [70 Hz–2000 Hz]). This is the range in which frequencies can be determined accurately. We now have a set of possible pitch values for each of the frequencies found in the current frame.

Because the frequencies can not be determined with infinite accuracy, Gaussian distributions are formed around each possible pitch value. This leads to a possibility distribution of pitch candidates for each frequency found in the current frame (input frequency). These distributions are summed over all input frequencies. If a pitch has a high probability in most of the distributions, it will get a high probability in the summed distribution. If a pitch value has a high probability in only a small fraction of the individual distributions, its probability in the summed distribution will be reduced. This procedure leads to a high peak at the pitch that is present in the largest fraction of the individual distributions. This is illustrated in FIG. 3.3.

FIGS. 3.3A–D show the pitch distributions for individual frequencies. In FIG. 3.3A, an input frequency of 175 Hz is used. In FIG. 3.3B, an input frequency of 350 Hz is used In FIG. 3.3C, an input frequency of 525 Hz is used In FIG. 3.3D, an input frequency of 750 Hz is used. These frequencies are the first four harmonics of 175 Hz. In FIG. 3.3A, the lowest frequency (175 Hz) has only two possible pitches in the pitch range: 87.5 Hz and 175 Hz. For the higher harmonics in FIGS. 3.3 B–D the number of possible pitches increases. Logically we see a peak at 175 Hz in all of the FIGS. 3.3 A–D. But at 87.5 Hz we also get a peak in all four distributions. This is because it is exactly 175Hz/2. That means that all harmonics of 175 Hz are also harmonics of 87.5 Hz. These are the only two frequencies in the range [45 Hz–400 Hz] where all four harmonics have a peak. Summing the distributions leads to the graph in FIG. 3.3E. It is already clear that 87.5 Hz and 175 Hz are the best candidates, but we get significant contributions at other frequencies (e.g. at 350 Hz and 116.6667 Hz).

But these pitch candidates only explain part of the input frequencies. Therefore we multiply each pitch candidate with the fraction of input frequencies that it explains. This leads to the graph in FIG. 3.3F. It is obvious that the extra peaks in the distribution are significantly decreased. However, we are still left with two candidates: 87.5 Hz and 175 Hz. Because we chose harmonics of 175 Hz, we want this to be the best resulting candidate. A way to achieve this is by "punishing" the candidate at 87.5 Hz for the fact that it would have given rise to intermediate harmonics at 262.5 Hz, 437.5 Hz, 612.5 Hz, etc., but these frequencies are not in the input. The candidate at 87.5 Hz is "punished" for the fact that half of its harmonics are missing from the input. Because the situation we found here for 175 Hz and 87.5 Hz occurs frequently and leads to so-called octave-errors. The punishment for missing harmonics is more severe (quadratic, which could be seen as a double application of this correction). The final distribution shown in the graph in FIG. 3.3G now shows a high peak at 175 Hz and no real alternatives with high probabilities, just the way we would like it.

The situation is a little more complicated when we use the following frequencies: 250 Hz, 375 Hz, 500 Hz, and 750 Hz. The resulting graphs are shown in FIG. 3.4A–G in a similar order as the graphs in FIG. 3.3A–G. The frequencies could be the 2nd, 3rd, 4th and 6th harmonics of 125 Hz. In this case, we would have a substantial number of missing harmonics. Or we could have the 1st, 2nd and 3rd harmonics of 250 Hz and, by chance, a 375 Hz component from some other source. In FIG. 3.4E we can see what the result of our sub-harmonic summation is. It is clear that in this case there are two alternatives for the pitch: 125 Hz and 250 Hz, and these alternatives are about equally likely to be correct.

In this sort of situation we have to use additional information from other frames to be able to make a choice between the two alternatives. If in the next or previous frames we find other harmonics of 125 Hz, it is this alternative that will be chosen. If, however, we only find the harmonics of 250 Hz and the 375 Hz component has a different time development than the others, we may conclude that it was produced by a different source.

Because determining the distribution of sub-harmonics for all frequency components in the current frame can be computationally intense, we chose to form a matrix filled with sub-harmonic distributions for a large number (550) of input frequencies. This is called the pitch matrix and can be computed at the initialization. From this matrix the distributions for the input frequencies can be determined easily by linear interpolation between the two rows with frequencies closest to the input frequency. The matrix and the rows selected for the case of the combination 175, 350, 525 and 700 Hz is shown in the FIG. 3.5, along with the resulting final distribution.

Fundamental Period Estimation for Noiseless Signals

A fundamental period estimation device that can be applied to noise-less (speech) signals has been developed. The algorithm presented in this section is intended a fast alternative for the more general period estimation technique presented earlier. This device can be used estimate fundamental period contour for speech databases prior to a automatic speech recognition.

The demands for a fundamental period estimation algorithm to measure the robustness of a speech recognition system are slightly different from a system that aims to select and track as much of the source as possible. This is optimised in the general fundamental period estimation.

For an ASR-test it is necessary to produce a signal representation that resembles the stored templates as well as possible, this means that noise should contaminate the selection as little as possible. During onset, but more often during the offset, the signal energy might be relatively low, while little linguistic information is conveyed. For example, the information after t=360 ms in the word /NUL/ in FIG. 2.2 is of little consequence, while a rising pitch can be estimated for at least another 100 ms. During these last 100 ms, the signal-to-noise-ratio decreases rapidly which results in a more contaminated TAC-selection. To reduce this contamination it is beneficial to be conservative while determining whether or not the start or end of a signal is voiced.

This is implemented by restricting both the energy and the decay behaviour of the ridges in the low-frequency half of the basilar membrane model. This part of the basilar membrane is hardly affected by unvoiced signal components. When the energy loss corresponds to 50% or more in 10 ms, or when the energy does not exceed 1% of the expected maximal energy of the utterance, the frames are considered as unvoiced. This combined criterion can be replaced by more sophisticated criteria.

The decay-criterion is a bit more restrictive than the decay of the leaky integration process in the absence of input. The decay in 10 ms associated with a leaky-integration time constant of 10 ms is e−10/t=e−1=0.37 while the applied threshold is 0.5. For speech signals this threshold is very efficient. Because the fundamental period-contour estimation is very good and because there is little driving energy in the signal the selection that is based on the intermittent fundamental period-contour is usually almost indistinguishable from a selection based on a continuous version of the period-contour. The combination of both criteria lead to fundamental period-contours that tend to have an earlier offset, as required for ASR applications.

The fundamental period algorithm is based on a summation of the autocorrelation along ridges. This algorithm is similar to correlogram based algorithms that claim to model aspects of human pitch perception. The main difference is the use of the running autocorrelations under ridges, instead of computing and summing an FFT-based correlogram. This reduces computational load and because quasi-stationarity is not applied a better estimation of the instantaneous pitch can be achieved for signals with a rapidly changing pitch. As mentioned in the context of FIG. 2.7, the autocorrelations along ridges that stem from the same source agree on the fundamental period as the first common periodicity that all ridges share. FIG. 3.7 shows a typical example of a set of autocorrelations and the corresponding summation. Note that all autocorrelations are simply added and no group delay correction has been performed. The result is therefore an approximation. The optimization in the selection algorithm (see Selection of periodic signal contributions) determines the final instantaneous fundamental period.

In each frame the three highest peaks in the summed autocorrelation with values higher than 0.3 times the local energy along the ridge are selected and sorted, the highest first, according to the autocorrelation value. When no peak satisfies the criterion, the frame is considered to be unvoiced. It is assumed that one of these autocorrelation lags corresponds to the desired fundamental period value for this frame. The selected peaks are combined into temporal contours. Contours of a duration less than 25 ms are discarded. In each frame the remaining contours are compared with the corresponding best-frequency of the segment of lowest ridge. Contours that fall 60% or more of the time within 10% of the best frequency of the lowest ridge is chosen, the other contours are discarded. Finally, the selected period-contours are smoothed with the same procedure as described in section fundamental period estimation in noise. The final output of the algorithm is, conform the demands of the TAC-selection algorithm in section Selection of periodic signal contributions, the parameters that define the first order approximation of the local instantaneous fundamental period at each frame.

This technique combines two sources of knowledge that complement each other: periodicity information in the autocorrelations provides an accurate periodicity estimation and position information facilitates the choice of the correct fundamental period candidate Selection of Periodic Signal Contributions The next step is the actual assignment of information to auditory events. The lower panel of FIG. 2.17 shows typical examples of TAC-based auditory events. The application of a single constraint, a period-contour, already has an advantageous result on the noisy signal in the upper-panel. On the low-frequency side, the TAC cochleogram reliably selects the first harmonics, on the high-frequency side it assigns large areas of the time-frequency (actually time-place) plane to the auditory event. On the low-frequency side the selected regions are dominated by a single harmonic. On the high-frequency side the regions are dominated by formants: complexes of harmonics that agree on a common fundamental period.

Because small pitch estimation errors can lead to large effects, the TAC-selections is preferably based on a local optimisation process. The fundamental period-contour, as estimated by the pitch estimation algorithms, describes the general development of the period-contour well, but does not represent rapid pitch fluctuations. The estimation process results for each frame in a period value and a local temporal derivative. This gives a reliable indication of the local temporal development, but the actual instantaneous period may fluctuate around this average development. The local period estimation and its derivative lead to local instantaneous periodicity values $T_s$. The dashed line in FIG. 2.18 shows these as a local instantaneous periodicity curve. To estimate the optimal value for the instantaneous period this curve is shifted upwards and downwards in periodicity (i.e. right and left in FIG. 2.18) and the corresponding TNC-values for each choice of the local instantaneous period are computed. The choice of the instantaneous period that maximises the sum of the positive values of the compressed TNC is chosen as the final instantaneous period on which the selection is based.

The best instantaneous period is the value that optimises the area under the positive values and the x-axis. This optimisation procedure is a very efficient way to reduce the effects of natural pitch fluctuations and small period estimation errors.

Although the selection as depicted in FIG. 2.17 was based on correct period-contours, it cannot be guaranteed that the selection is correct: one of the background speakers might be the source of one of the period-contours. Further processing, using knowledge of possible source types, like for example voice types of speakers and all aspects of language, must solve this problem. Fortunately, the information represented by an auditory event, based on a correct period-contour estimated in rather noisy situations, comprises accurate information about the relative importance of individual harmonics and formants. This is enough to reduce the number of possible interpretations of the data to a few hypotheses.

Although the TAC-approach cannot assign non-periodic information to auditory events, it can help in determining the position of likely candidates of a-periodic auditory events that might be assigned to the same stream. In normal speech the position of a-periodic signal components is strongly correlated to the periodic components. In most cases, these contributions end just before or during the onset, and start during or after the offset of a periodic contribution. In the case of the /T/ of /TWEE/ (/TWO/), starting at t=1000 ms and most noticeable in the segment range from 90 to 100 in the upper panel of FIG. 2.17, a simple form of template matching may suffice to detect likely candidates of a-periodic contributions.

The Characteristic Period Correlation (CPC)

To deal with aperiodic signals like onsets and aperiodic noises other devices were invented While periodic signals are characterized by a discrete set of signal contributions, an aperiodic signal is characterized by a continuous distribution of frequencies. A typical aperiodic signal like a unit pulse represents an equally weighted distribution of frequencies. Each range of frequencies tries to entrain the range of basilar membrane segments with a corresponding characteristic frequency $f_c$. This results in a situation in which each segment of the BM oscillates, on average, with its characteristic frequency. This leads to a pre-liminary definition of the Characteristic Period Correlation (CPC) as:

$$t_s^c(t) = L(x_s(t), x_s(t+T_{c,s})) \tag{27}$$

where $T_{c,s}$ denotes the segments characteristic period The CPC provides values close to the energy values of the cochleogram for basilar membrane regions that oscillate with the characteristic period. It also produces high values for regions that are entrained by low frequency components that oscillate with a much larger period that the characteristic period. To ensure that the CPC is less sensitive to the latter regions the CPC can be redefined $$r_s^c(t) = \frac{L(x_s(t), x_s(t+T_c)) - L(x_s(t), x_s(t+T_c/2))}{2} \tag{28}$$

which corresponds to half of difference between the correlation between $x_s(t)$ and $x_s(t+Tc,s)$ and the correlation between $x_s(t)$ and $x_s(t+T_{c,s}/2)$. When the segments oscillate with a period close to the characteristic period the latter correlation will be negative, but in absolute value comparable to the first correlation. Half of the difference between the two correlations results in CPC-values close to cochleogram values. For segments that oscillate with an period larger than 2 times the characteristic period a positive correlation between $x_s(t)$ and $x_s(t+T_{c,s}/2)$ results which reduces the CPC to small values compared to those of the cochleogram. It is possible to formulate alternative embodyment of the CPC that show a similar behavior by combining contributions depending on different fractions of $T_c$.

The CPC can be used in a device for the estimation of aperiodic (and periodic) signal components. Conform its definitions the CPC responds maximally for segments that oscillate with a period close to the characteristic frequency. Regions for which this holds can be identified using a criterion like:

$$r_s^c(t) > C_s r_s(t), C_s < 7 \qquad (29)$$

where $C_s$ is a constant that may depend on the segment number. A typical value of this constant is 0.85 or all values of s. Regions of the segment-time plane that satisfy this criterion are entrained by signal components with frequencies corresponding to the characteristic frequency. Note that the CPC offers a useful method to determine aperiodic signal components, but can also be used effectively to increase the accuracy with which regions can be identified that have been recruited by periodic signal components. This may be used in the estimation of reliability measures.

Onsets and Offset Detection

The CPC, as well as the cochleogram can be used to pinpoint on- and offsets. These are per definition aperiodic and result therefore in a continuum of frequency components. Onsets may differ in rise time. The rapid onset of a sinusoid leads to a transient with a very broad frequency content that evolves within a few times the local group delay ds to an ideal sine response. A more gradual buildup of the sinusoid leads to reduced transients in combination with a gradual buildup of the strength of the ideal sine-response. When the rise time of the sinusoid is small compared to the local group delay the transients represent a broad range of frequencies which results in a prominent impulse-like response. When the rise time is large compared to the local group-delay, the transients are small or absent. At each point in time after the onset the ideal sine-response approximates the BM response. Note that offsets appear as the onset of a new signal that destructively interferes with the old signal. The techniques for the detection of offsets is therefore very similar to the detection of onsets. Focus is therefore on onsets.

One of the ways to detect onsets can be detected is by measuring whether the scaled energy gradient stemming from either the cochleogram or the CPC exceeds a threshold:

$$\frac{\frac{\partial}{\partial t} E(s,t)}{E(s,t)} > C_{Onset}(s, t_o) \qquad (30)$$

An example of a threshold $C_{Onset}(s,t_0)$ that can be used is n times the energy variance during $[t-t_0, t]$ ms (n=2 and t0=20 works well for noisy speech). Alternative thresholds that depend on the local group delay and/or depend on the gradient in the segment direction s can be formulated.

In most applications it is important to identify the type of signal component that starts. This can be achieved by a more careful analysis of the details of the onset and consecutive development of the signal component. The broadness (in terms of the frequency range of the responding segments) and duration of the initial transient in combination with the rise-time of the steady state signal is a reliable indicator of the rise-time of the signal. In the case of speech the plosives /B/, /P/ and especially the /T/ give rise to a transient that involves a large number of segments. These show up as a vertical structures in a graphical depiction of the onsets. These broad transients are missing or minimal in noise bursts like the /s/ and the /f/. The onsets of voiced speech is often slow compared to the local group-delay and onset effects are minimal. Artificial sounds like the beeps of a telephone can be easily identified on the basis of an for speech uncharacteristically rapid onset (and offset).

Mask Formation

For applications like automatic speech recognition and speech coding is important to identify signal components that meet the characteristic requirements of the type of signal to be recognised. The combination of the cochleogram, the CPC, and the TAC-selections with the corresponding period contour can be used to identify a mask: i.e. a set of areas in the segment-time plane that reflect signal components that meet the requirements of the target class. The mask defines which signal components will be processed during speech coding or speech recognition and is therefore of crucial importance.

Forming a mask is a two stage process. In stage one all signal components are described individually and signal components that do not meet the characteristic requirements of the target class of signals are discarded. In stage two all accepted signal components are evaluated in combination with each other and a final selection is made. Because mask forming depends crucially on the characteristic properties of the target class, it is impossible to formulate a complete set of criteria. The rest of this section discusses some useful criteria using speech signal processing as an example.

The stage one evaluation of signal components involves the identification of individual signal components. This stage is facilitated by excluding regions with insufficient energy or regions where the energy decreases at rate close to the rate associated with the low-pass filtering. When the low-pass filtering is implemented as a leaky integrator it reduces in the absence of input within τ ms to e−1=0.37 the original value. A suitable threshold for speech to exclude all signal components that decay with a rate corresponding to a loss of half of the energy per τ ms. This exclusion of regions can he implemented as:

$$M = M_{org} \left\{ E(s,t) > C_{Energy}(s,t), \frac{\frac{\partial}{\partial t} E(s,t)}{E(s,t)} > C_{decay}(t) \right\} \qquad (31)$$

$M_{Org}$ is the complete segment-time plane. $C_{Energy}(s,t)$ is the threshold for the energy. This threshold can be an absolute value or a value dependent on a long term average of the local energy. $C_{Decay}(t)$ is the threshold for the decay rate.

In the case of quasi-periodic signals, a fundamental period contour can be estimated and a TAC-selection can be computed. To identify the most important harmonic contributions within the TAC-selection and to discard most spurious contributions due to incidental correlations, the TAC-selection can be compared with the energy values of the cochleogram. Whenever the TAC-selection exceeds a certain fraction, e.g. 0.25, of the local energy the corresponding time-segment region is accepted. This leads to a mask $M_{TAC}$ defined by:

$$M_{TAC} = M\{r_s, T(t)^{(t)} > C_{TAC}(s,t) r_s(t)\} \qquad (32)$$

M denotes the complete segment-time plane, $C_{TAC}(s,t)$ is the threshold for acceptance that may depend on s and t, $r_{s,T}(t)$ and $r_s(t)$ denote the TAC-selection and the cochleogram respectively. Note that each period contour T(t) leads to a TAC mask.

Regions that are entrained by a matching frequency component can be identified by:

$$M_{CPC} = M\{r_s^c(t) > C_{CPC}(s) r_s(t)\} \tag{33}$$

, where $r_{cs}(t)$ denotes a CPC as for example computed, $C_{CPC}(s)$ is a segment dependent criterion for local entrainment.

Onsets can be identified using a similar strategy:

$$M_{Onset} = M\left\{\frac{\frac{\partial}{\partial t}E(s,t)}{E(s,t)} > C_{Onset}(s,t_0)\right\} \tag{34}$$

where the scaled energy gradient (computed using a CPC or the cochleogram) must exceeds a threshold $C_{Onset}(s,t_0)$ that may depend on the position along the BM and some scope of time dependent on $t_0$.

Note that the onset mask is often a subset of the CPC mask and/or the TAC mask. The peaks of the TAC-selection show up in the CPC mask as well The information represented "under" the combined masks provides a wealth of basic signal properties that can be used to exclude mask regions from fewer processing. This requires knowledge about the target signal. Typical criteria for speech to exclude certain regions from further processing include:

- TAC-selections corresponding to pitches outside a normal human pitch range
- TAC-selection with a (too) constant pitch
- TAC-selection with a unrealistic formant pattern
- TAC-selections with unrealistically fast onsets
- coherent areas of the TAC masks that are to short (e.g. 20 me for high frequency components and 40 ms for low frequency components) or do include less than two or three segments.

The estimation of a-periodic contributions is possible by applying two complementary methods. The first method excludes regions represented by the TAC masks (one for each period contour T(t) from the CPC mask according to:

$$M_{Aperiodic} = M_{CPC} - M_{TAC} \tag{35}$$

This leads to a mask fir a-periodic information. This mask can be tailored to show only coherent contributions of sufficient area of the segment time plane by class specific criteria.

An alternative method is to compute a running autocorrelation for the main coherent regions of the CPC mask. When the running autocorrelation decreases within a few times the local characteristic periods to values close to zero the region is a-periodic. This approach can be used to ascertain that the regions estimated in first pass are truly a-periodic. The combination of both methods leads to a reliable estimation of coherent regions of the segment-time plane that reflect a-periodic regions.

In the second stage of mask forming the individual signal components are combined. For this stage other target-class dependent constraints must be used. Typical constraints for speech are:

- unvoiced components of speech signals are strongly correlated to the voiced portions of speech. Isolated voiced signal components can be discarded.
- voiced components that differ too much in average pitch are unlikely to stem from the same source. Accepted voiced signal contributions should form an linguistically plausible period contour.
- overlapping pitch contours cannot stem from the same source The application of these constraint leads to one or more masks, that represent diverse forms of information that might stem from the target source. It is the task of further processing stages to use this information optimally.

Note that all of the variables used to create masks have an associated reliability measure. These reliability measures can be used during the mask formation process.

Inverse Basilar Membrane Filtering

Because the TAC forms a reliable basis for the assignment of information to auditory events, one might wonder if this could be used to split a combination sound into the constituting sound sources.

All quasi-periodic signal contributions that dominate a certain region in the time-place plane of the TAC cochleogram represent basilar membrane oscillations. Since this embodiment of the basilar membrane model is implemented as an impulse response based finite impulse response (FIR) filter, it is possible to inverse the filtering by reversing the impulse response in time and compensating for the frequency-effects caused by the double use of the basilar membrane filter.

A full inversion results in the original mixture of signals. But if inverse filtering is based on the regions of the time-place plane that are recruited by the target source, the output is, ideally, based on information of the target exclusively. The masks as defined in the previous section can be used for this purpose. To reduce the effects of on- and offsets the mask is tailored to consist of long continuous contributions of single segments: small holes in the positive values of the TAC-traces are filled up and isolated positive points are discarded. Finally the mask is provided with smooth 10 ms wide on- and offsets. This leads to the mask as depicted in the lower panel of FIG. 2.19.

To improve the sound quality, the background is not discarded completely, but reduced with an adjustable factor: in this case a factor of 100 in amplitude (40 dB in terms of energy). By not completely discarding the background, unnatural "deep" silences are reduced and some evidence of a-periodic contributions, like the /T/ of /TWEE/, remains in the signal, which facilitates perception. When the resulting resynthesised sound is presented to the basilar membrane model again the cochleogram of the resynthesised sound can be computed. This is presented in the middle panel of FIG. 2.20. The resynthesis did not contain unvoiced regions, but these regions can be added to the mask. It is however very difficult to combine voiced and unvoiced regions reliably.

The upper panel shows the cochleogram of the original signal. This signal formed the only source of information: no a priori information was used, nor necessary. The lower panel forms the clean reference. Apart from the second formant structure of the last word, which is masked completely, all important periodic contributions are represented faithfully. Note that the resynthesised cochleogram is more "fuzzy", this is due to spurious contributions of the background. A way to avoid this is to measure and smooth all individual signal components and add these together in a true speech synthesis process.

Reconstruction of Cochleogram

The resynthesised sound, as computed in the previous section, can be used as input for standard recognition systems, such as speech recognition software like Philips Freespeech and L&H VoiceXPress. An alternative and computationally favourable input of a recognition system can be based on the TAC-cochleogram.

A suitable input for an ASR-system is a representation that describes the temporal development of the spectral envelope of the target speech while suppressing the effects of pitch. As the upper-right hand panel of FIG. 2.7 proves, the TAC-cochleogram of the voiced parts of a clean signal resembles the standard cochleogram closely. The TAC-cochleograms in the lower panel of FIG. 2.17 can be tailored to resemble the clean cochleogram better by filing up the negative values.

This reconstruction process is a two-step process that is illustrated in FIG. 2.21. The first stage searches for evidence of individual harmonics and uses this evidence to compute the lower half of the reconstruction. The second stage adds information about the rest of the spectrum using the mask and an approximation of diverse masking effects.

The first stage of the algorithm is the estimation of coherent ridges in the first 60 segments of the selection. The ridges are formed, as in the fundamental period estimation algorithm, by combining successive peaks that differ less than 2 in terms of segment number. Ridges longer than 15 ms are accepted as candidates for harmonics. Since the fundamental period-contour is known, it is possible to predict the segment numbers of the first harmonics. The ridges that, on average, are within 1 segment of the expected value of the first 4 harmonics are accepted as harmonics. Note that this criterion can discard spurious ridges on the bases of a mismatch in temporal development. The number of harmonics that can be modelled in this way depends on the spatial resolution of the basilar membrane. With a more sharply tuned BM-model and a higher number of segments a higher number of harmonics can be modelled individually. In this case 4 harmonics were treated individually because the acceptance regions of the first 4 harmonics do not overlap in the present BM model. The algorithm is only weakly sensitive to the value of this parameter.

The upper left hand panel of FIG. 2.21 shows all candidate ridges. The energy development along these ridges is smoothed by replacing each value with a three point local average. The smoothed harmonic ridges are used to reconstruct an estimate of the original cochleogram by adding contributions of successive harmonics conform equation 6. This process is shown in the top panel of FIG. 2.22.

The reconstruction starts with weighting the ideal sine-response (as shown in FIG. 2.5) of the fundamental frequency. It is assumed that harmonics influence each other only upward in frequency. At the position of the second harmonic, part of the energy can be attributed to the first harmonic, and the rest of the energy is used to weight the ideal sine-response of the second harmonic. In FIG. 2.22, a large fraction of the energy of the position of the third harmonic must be attributed to the second harmonic, the fourth is relatively more important. The resulting partial reconstruction, using only 4 harmonics, is depicted in black.

The second stage of the algorithm is the reconstruction of the high-frequency range. The mask is used again to pinpoint the regions that are most likely to represent information of the target. The selected values under the mask that exceed the partial reconstruction replace the values of the partial reconstruction. The result of this step is depicted in the lower left hand panel of FIG. 2.21. This stage leads to high-frequency contribution with unrealistic upward and downward slopes. The black peaks in the upper panel of FIG. 2.22 show this clearly. To make the reconstruction more realistic without adding extra information, the ridges of the mask can be augmented with flanks that represent the masking effects consistent with a source that excites the position of the peak next to the flank. These can again be estimated from the sine-responses and added to the reconstruction. Finally the ringing out effect of the BM and the effect of leaky integration can be modelled as an exponential decay. This models the forward masking effect of the reconstruction. The final reconstructions is shown in the lower right hand panel of FIG. 2.21 and drawn in black in the lower panel of FIG. 2.22.

Visual inspection shows that the reconstruction is often of high quality. Part of the signal, for example the high frequency range of FIG. 2.22, has a very unfavourable local signal-to-noise-ratio. As can be seen in the lower panel of FIG. 2.22, the probability of a correct reconstruction is high when the dashed target is close to the dash-dotted line that corresponds to the total energy. This corresponds to situations where the local SNR is favourable (SNR>3 dB). When the distance between the dashed and the dash-dotted line increases the probability increases that the reconstruction is incorrect. When the distance is more than 3 dB, what corresponds to a local SNR of 0 dB, the reconstruction is likely to contain spurious contributions. An example can be seen around segment 71.

This results in synthetic correlograms as depicted in FIG. 2.23. The upper panel shows the "reconstruction" based on the TAC of the clean signal. A comparison with the lower panel of FIG. 2.20 shows that the main components of both figures are very similar. This indicates the validity of the reconstruction method. The lower panel of FIG. 2.23 shows the reconstruction based on the TAC as estimated from noisy data. Since part of this signal is masked and some spurious contributions of the background are added, the match is not perfect, but the main features of both figures are similar (under a visual inspection).

The procedure described here is not the only possible way to arrive at a reconstruction of the signal from an individual source. As mentioned in the description of the various sub-processes, alternatives are available. Such alternatives would include the use of reliability measures as described in the section reliability, to guide the formation of the mask or the inverse matrix method to determine the strength of individual harmonics.

An alternative embodiment of the reconstruction process uses a variant of the signal component estimation technique described in the section Estimating individual signal components. In this embodiment a mask is used to pinpoint reliable regions. Both E and R are adapted so that values outside the mask are set to zero. The solution of $w = R^{-1} E$ gives the desired weighting.

This reconstruction process can also be used to describe the harmonic content of the selected signal. This description can for example be used to efficiently code the data representing the signal. Such a harmonic content description can also be used in further signal analysis.

Parameterisation of

An HMM-based ASR-system requires an estimation of the spectral envelope of the target speech without distractors like pitch information. The representation as depicted in FIG. 2.23 is not very suitable since the most energetic components are the first harmonics. Although these carry formant information, the detailed realisation of the first formant is strongly dependent on pitch. To reduce the effect of irrelevant pitch differences and to stress the second and third formant, the values of the compressed cochleogram can be multiplied by a segment dependent factor. This factor is e.g. 1 for the first segment and 5 for the last segment. The multiplication factor of intermediate segments can be a linear interpolation between the two extremes.

This is an operation with a similar effect as pre-emphasis, a form of high-pass filtering that is usually applied within the standard methodology of ASR, and results in a spectrum where all frequencies contribute with similar energy. This form of pre-emphasis can be followed by an algorithm that estimates the spectral envelope, e.g. by connecting the peaks of consecutive harmonics.

As a final step, the envelope of the cochleogram must be coded as efficiently as possible. To produce as set of parameters similar to MFCC-values, a cosine transform of the "enhanced" cochleogram can be performed. The result is a variant of a cepstrum. The first 8 to 14 values of the cepstrum, representing low spatial frequencies are kept, the rest is discarded. Finally, the time-step between successive frames is increased from 5 ms to 10 ms by averaging successive values. This brings the frame step to a standard value and speeds up processing. These values are stored on hard disk and are used as input for the speech recognition system.

The stored parameters are not very informative, but they can be transformed back to a cochleogram-like representation using the inverse cosine transform. The result is shown in FIG. 2.24

Both panels reflect the information available to the speech recognition system. The upper panel is based on the original clean signal. The energy contributions per segment are enhanced by values between 1 and 5, the spectral envelope is coded with 12 cepstral coefficients. Compared to the lower panel of FIG. 2.24, the high-frequency segments are much more prominent, the first harmonics are less prominent, and the formant features are broader. The lower panel is based on the reconstructed TAC-cochleogram of FIG. 2.23, it has a good general agreement with the ideal cochleogram, but is noisy due to masking and spurious background contributions. These two representations are suitable as input for recognition systems.

What is claimed is:

1. An apparatus for estimating frequency characteristics of an input signal, the apparatus comprising:
    a basilar membrane model device to which the input signal is applied; and
    first and second correlator devices, each of said correlator devices connected to a separate segment of the basilar membrane model device and each of said correlator devices having:
        a first input, connected to a respective one of the segments of the basilar membrane model device, for receiving a segment signal from the respective one segment, the segment signal being present for a predetermined period of time; and
        a second input, connected to the respective one segment, for receiving the segment signal but shifted by an adjustable time shift; and
        wherein the time shift associated with the first correlator device is related to the time shift associated with the second correlator device, the first and second correlator devices collectively providing an output signal which is responsive to the time shifts and to frequencies present in the segment signal applied to each of the correlator devices, and the output signal forms a measure of the frequency characteristics of the input signal.

2. The apparatus recited in claim 1 wherein the adjustable time shift is adjusted to correspond substantially to an inverse of the frequency of one of the segments.

3. The apparatus recited in claim 1 wherein multiple segments of the basilar membrane model device are each connected to a separate one of the correlator devices, and wherein the apparatus further comprises a cross-correlator device connected to the respective outputs of a number of the correlator devices for determining common periods predominantly present in segment signals from the multiple segments.

4. The apparatus recited in claim 1 wherein at least one of said correlator devices is a leaky autocorrelator device which performs an operation represented by the following equation:

$$r_{s,T} = L(x_s(t), x_s(t-T)) \quad s = 1 \ldots s_{max}$$
$$T = [0, T_{max}]$$

where: r is the output signal of the correlator device;
    X is the excitation signal;
    s is segment position;
    t is time;
    T is the adjustable time shift; and
    L is a low-pass filtering function.

5. The apparatus recited in claim 1 wherein at least one of said correlator devices is a low pass filter device which performs an operation represented by the following equation:

$$r_{s,T} = L(x_s(t), x_s(t-T)) \quad \begin{matrix} S = 1 \ldots s_{max} \\ T = [0, T_{max}] \end{matrix}$$

where: r is the output signal of the correlator device;
    X is the excitation signal;
    s is segment position;
    t is time;
    T is the adjustable time shift; and
    L is a low-pass filtering function.

6. The apparatus recited in claim 1 wherein at least one of said correlator devices is a time normalized correlator device which performs an operation represented by the following equation:

$$R_{s,T}^+(t) = L(x_s(t), x_s(t+T))$$

where: $R^+$ is the output signal;
    X is the segment signal;
    s is segment position;
    t is time;
    T is the adjustable time shift; and
    L is a low-pass filtering function.

7. The apparatus recited in claim 1 wherein one of said correlator devices is a time normalized correlator device with a group delay corrector.

8. The apparatus recited in claim 7 wherein the time normalized correlator device with a group delay. corrector performs an operation represented by the following equation:

$$R^{s,Tgd}(t) = L(x_s(t++d_s), x_s(t+d_s+T))$$

where: $R^{gd}$ is the output signal;
    X is the segment signal;
    s is segment position;
    t is time;

T is the adjustable time shift;

d$_s$ is the group delay as a function of the segment position; and

L is a low-pass filtering function.

9. The apparatus recited in claim 3 wherein the adjustable time shift is responsive to at least one common period predominantly present in the segment signals.

10. The apparatus recited in claim 9 wherein the adjustable time shift is further responsive to a segment dependent group delay of at least two segment signals.

11. An apparatus for determining peaks in an input signal, the apparatus comprising:

a basilar membrane model device to which the input signal is applied;

first and second integrator devices, each of said integrator devices being connected through a corresponding input thereof to a separate segment of the basilar membrane model device so as to receive a corresponding basilar membrane signal, said each integrator device generating a segment excitation signal from its corresponding basilar membrane signal and transmitting said the segment excitation signal to an output of said each integrator device;

a peak search device, connected to the outputs of said first and second integrator devices, for determining peaks in the segment excitation signals collectively produced by both integrator devices; and a correlator device comprising:

a first input, connected to a respective segment of the basilar membrane model device, for receiving a segment signal, said segment signal being present for a predetermined period of time; and a second input, connected to said separate segment, for receiving the segment signal but shifted by an adjustable time shift, said correlator device also being communicatively connected to the peak search device such that a segment excitation signal of a segment at a selected position of the basilar membrane device is applied to the correlator device; and wherein the adjustable time shift, the selected position and a value produced by the respective segment itself vary in time depending on peaks determined by the peak search device.

12. The apparatus recited in claim 11 wherein the correlator device is a leaky autocorrelator device which performs an operation represented by the following equation:

$$R_{s(t),T}(t) = L(x_{s(t)}(t), x_{s(t)}(t-T))$$

where: r is the output signal of the correlator device;

X is the excitation signal;

s(t) is segment position as a function of time;

t is the time;

T is the adjustable time shift; and

L is a low-pass filtering function.

13. The apparatus recited in claim 11 wherein the correlator device is a time normalized correlator device which performs an operation represented by the following equation:

$$R_{s(t),T}^+(t) = L(x_{s(t)}(t), x_{s(t)}(t+T))$$

where: R$^+$ is the output signal of the correlator device;

X is the excitation signal;

s(t) is the segment position as a function of time;

t is the time;

T is the adjustable time shift; and

L is a low-pass filtering method.

14. The apparatus recited in claim 11 wherein the correlator device is a time normalized correlator with a group delay corrector.

15. The apparatus recited in claim 14 wherein the time normalized correlator with a group delay corrector performs an operation represented by the following equation:

$$R_{s(t),T}^{gd}(t) = L(x_{s(t)}(t+d_s), x_{s(t)}(t+d_s+T))$$

where: R$^{gd}$ is the output signal of the correlator device;

X is the excitation signal;

s(t) is the segment position as a function of time;

t is the time;

T is the adjustable time shift;

d$_s$ is the group delay as a function of the segment position; and

L is a low-pass filtering function.

16. The apparatus recited in claim 1 further comprising:

a device, connected to the basilar membrane model device, for fundamental period contour estimation (fpce), wherein the fpce device comprises:

an input connected to the basilar membrane model device;

a ridge determination device for determining estimated ridges and instantaneous period contours;

a ridge selector device, connected to the ridge determination device, for selecting most reliable smooth instantaneous period contours;

a cloning device, connected to the ridge selector device, for cloning period contours to all possible fundamental periods, each combination of period contours of possible fundamental periods forming a contour hypothesis;

a cloned contour selector device, connected to the cloning device for selecting most reliable period contours;

a selector device, connected to the cloned contour selector device, for selecting at least one contour hypothesis that corresponds to a substantial part of the selected most reliable smooth instantaneous period contours; and an output, connected to the selector device, for transmitting the selected contour hypothesis further.

17. The apparatus recited in claim 1 wherein said input signal is a sound signal.

18. A signal recognition system having:

an input;

an apparatus as recited in claim 1;

memory means connected to the apparatus, the memory means containing data representing signals to be recognized;

a processor device arranged for comparing a signal from the output of said apparatus with the signals to be recognized and determining, from the signals to be recognized, a signal most similar to the signals to be recognized; and the output.

19. The signal recognition system recited in claim 8 wherein the signals to be recognized represent speech signals.

20. A data compression system having:

an input;

an apparatus as recited in claim 1 and connected to the input; and processor means for reading signal component values determined by said apparatus of a signal received at the input of the apparatus and transmitting the signal component values to an output connected to the processor means.

21. A data expansion system having:
an input for receiving signal component values determined with the system recited in claim 20; processor means for reading the signal component values and reconstructing an original signal; and
an output for outputting the original signal.

22. A signal improvement system having:
an input;
a first apparatus as recited in claim 1;
masking device for selecting parts of a excitation signal, the masking device being connected to an output of the first apparatus;
a second apparatus, being substantially an inverse of the first apparatus, for reconstructing a cochleogram of selected parts of the excitation signal and having an input connected to the output of the masking device; and
an output connected to an output of the second apparatus.

23. The signal improvement system recited in claim 22 wherein said masking device has:
a coherent ridge estimation device for selecting coherent ridges;
a sine response adder device for replacing the selected coherent ridges with a sine response;
an adder device for replacing the sine response with an original signal if intensity of the sine response is lower than intensity of the original signal; and
a smoother device for removing discontinuities in the signal produced by the sine response replacing adder device.

24. A method for estimating frequency characteristics of a input signal, the method comprising the steps of:
receiving the input signal;
generating a basilar membrane signal, through a basilar membrane model device and in response to the input signal applied to the basilar membrane model, the basilar membrane model device having a number of segments and generating, in response to said basilar membrane signal, an excitation signal from one of said segments;
generating first and second segment signals of first and second ones of said segments of said basilar membrane signal, respectively;
generating first and second shifted signals by shifting each of the first and second segment signals, respectively, by an adjustable time shift, the time shift for the first segment signal being related to the time shift for the second segment signal; and
correlating each of the first and second shifted signals with an associated one of the first and second segment signals, respectively, so that a time shift dependent output signal is obtained;
wherein the output signal is responsive to frequencies present in the excitation signal and forms a measure for the frequency characteristics of the input signal.

25. The method recited in claim 24 wherein the adjustable time shift is adjusted to correspond substantially to an inverse of a frequency of one of the segments.

26. The method recited in claim 25 wherein each of the shifted signals is generated from an associated excitation signal and each of the shifted signals is combined with that same excitation signal for each of a multiple of the segments; and said method further comprises the step of cross-correlating a time-shift dependent signal to determine common periods present in the excitation signals.

27. The method recited in claim 24 wherein said correlating step comprises a leaky autocorrelation step including the step of performing an operation represented by the following equation:

$$r_{s,T} = L(x_s(t), x_s(t-T)) \quad s = 1 \ldots s_{max}$$

$$T = [0, T_{max}]$$

where: r is the output signal;
X is the excitation signal;
s is segment position;
t is time;
T is the adjustable time shift; and
L is a low-pass filtering function.

28. The method recited in claim 24 wherein the correlating comprises a time normalized correlation step including the step of performing an operation represented by the following equation:

$$R_{s,T}^+(t) = (x_s(t), x_s(t+T))$$

where: $R^+$ is the output signal;
X is the excitation signal
s is segment position;
t is time;
T is the adjustable time shift; and
L is a low-pass filtering function.

29. The method recited in claim 24 further comprising the step of performing a time normalized correlation step including a group delay correction step.

30. The method recited in claim 29 wherein said time normalized correlation step comprises the step of performing an operation represented by the following equation:

$$R_{s,T}^{gd}(t) = L(x_s(t+d), x_s(t+d_s+T))$$

where: $R^{gd}$ is the output signal;
X is the excitation signal;
s is segment position;
t is time;
T is the adjustable time shift;
$d_s$ is the group delay as a function of the segment position; and
L is a low-pass filtering function.

31. The method recited in claim 24 wherein the adjustable time shift is responsive to at least one common period predominantly present in the excitation signals of the segments.

32. The method recited in claim 31 further comprising the steps, performed after the step of generating at least one excitation signal, of:
determining a time by segment region of said cochleogram; and
adjusting said adjustable time shift in response to the determined region.

33. A method for determining peaks in a signal, the method comprising the steps of:
receiving the input signal;

generating a basilar membrane signal, through a basilar membrane model device and in response to the input signal applied to the basilar membrane model, the basilar membrane model device having a number of segments and generating, in response to said basilar membrane signal, excitation signals from separate ones of said segments;

determining peaks in the excitation signals; and for each one of a plurality said segments located at a selected position of the basilar membrane device:

receiving a segment signal associated with said one segment, said segment signal being present for a predetermined period of time; and receiving the segment signal shifted over an adjustable time shift;

wherein the adjustable time shift, selected position and a value produced by the one segment itself vary in time depending on peaks so determined.

34. The method recited in claim 33 further comprising the step of performing a leaky autocorrelation step including the step of performing an operation represented by the following equation:

$$R_{s(t),T}(t) = L(x_{s(t)}(t), x_{s(t)}(t-T))$$

where: R is the output signal;

X is the excitation signal;

s(t) is segment position as a function of time;

t is the time;

T is the adjustable time shift; and

L is a low-pass filtering function.

35. The method recited in claim 33 further comprising the step of performing a time-normalized correlation step including the step of performing an operation represented by the following equation:

$$R_{s(t),T}^{+}(t) = L(x_{s(t)}(t), x_{s(t)}(t+T))$$

where: $R^{+}$ is the output signal of the correlator device;

X is the excitation signal;

s(t) is segment position as a function of time;

t is the time;

T is the adjustable time shift; and

L is a low-pass filtering function.

36. The method recited in claim 33 further comprising the step of performing a time-normalized correlation step with a group delay correction.

37. The method recited in claim 36 wherein the time-normalized correlation with a group delay correction step includes the step of performing an operation represented by the following equation:

$$R_{s(t),T}^{gd}(t) = L(x_{s(t)}(t+d_s), x_{s(t)}(t+d_s+T))$$

where: $R^{gd}$ is the output signal of the correlator device;

X is the excitation signal;

s(t) is segment position as a function of time;

t is the time;

T is the adjustable time shift;

$d_s$ is the group delay as a function of the segment position; and

L is a low-pass filtering function.

38. The method recited in claim 24 further comprising the steps of estimating a fundamental period contour estimation having the steps of:

determining estimated ridges and instantaneous period contours;

selecting most reliable smooth instantaneous period contours;

cloning of period contours to all possible fundamental periods, each combination of period contours of possible fundamental periods forming a contour hypothesis;

selecting most reliable period contours; and selecting at least one contour hypothesis that corresponds to a substantial part of the selected most reliable smooth instantaneous period contours transmitting the selected contour hypothesis further.

39. The method recited in claim 24 wherein said input signal is a sound signal.

40. A method for recognizing signals comprising the steps of:

the method recited in claim 24; and comparing an output signal with signals to be recognized and determining from the signals to be recognized a signal that is most similar to any of the signals to be recognized.

41. The method recited in claim 40 wherein said signals to be recognized represent speech signals.

42. A method for compressing data comprising the steps of:

the method as claimed in claim 24; and reading values of the frequency characteristics determined with said method of an input signal received and transmitting the values further.

43. A method for expanding data comprising the steps of:

receiving the frequency characteristics values determined through the method recited in claim 42;

reading the frequency characteristic values and, in response thereto, reconstructing an original signal; and outputting the original signal.

44. A method for improving a signal comprising the steps of:

a first method as recited in claim 24;

selecting parts of an excitation signal; and a second method, substantially an inverse of the first method, for reconstructing a cochleogram of the selected parts of the excitation signal, using as an input the selected parts.

45. The method recited in claim 44 wherein said parts selecting step comprises the steps of:

selecting coherent ridges;

replacing the selected coherent ridges with a sine response;

replacing a sine response with an original signal if intensity of the sine response is lower than intensity of the original signal; and removing discontinuities in a signal produced by the replacing step.

46. The method recited in claim 39 wherein the sound signal contains speech from at least one speaker.

47. The method recited in claim 24 wherein the input signal is a unknown mixture of signals.

48. A computer readable medium having computer executable program instructions stored thereon wherein the instructions contain code portions, which, when executed by a computer, perform the method recited in claim 24.

* * * * *